US009184248B2

(12) United States Patent
Zeng et al.

(10) Patent No.: US 9,184,248 B2
(45) Date of Patent: Nov. 10, 2015

(54) VERTICAL POWER MOSFET HAVING PLANAR CHANNEL AND ITS METHOD OF FABRICATION

(71) Applicant: MaxPower Semiconductor, Inc., San Jose, CA (US)

(72) Inventors: Jun Zeng, Torrance, CA (US); Mohamed N. Darwish, Campbell, CA (US); Kui Pu, Chengdu (CN); Shih-Tzung Su, Shulin (TW)

(73) Assignee: MaxPower Semiconductor Inc., San Jose, CA (US)

( * ) Notice: Subject to any disclaimer, the term of this patent is extended or adjusted under 35 U.S.C. 154(b) by 0 days.

(21) Appl. No.: 14/616,395

(22) Filed: Feb. 6, 2015

(65) Prior Publication Data

US 2015/0221731 A1 Aug. 6, 2015

Related U.S. Application Data

(63) Continuation-in-part of application No. 14/338,303, filed on Jul. 22, 2014, now Pat. No. 9,093,522.

(60) Provisional application No. 62/079,796, filed on Nov. 14, 2014, provisional application No. 61/935,707, filed on Feb. 4, 2014.

(51) Int. Cl.
| | |
|---|---|
| *H01L 29/423* | (2006.01) |
| *H01L 29/78* | (2006.01) |
| *H01L 29/732* | (2006.01) |
| *H01L 29/40* | (2006.01) |
| *H01L 29/06* | (2006.01) |

(Continued)

(52) U.S. Cl.
CPC .......... *H01L 29/407* (2013.01); *H01L 29/0692* (2013.01); *H01L 29/1095* (2013.01); *H01L 29/7395* (2013.01); *H01L 29/7811* (2013.01)

(58) Field of Classification Search
None
See application file for complete search history.

(56) References Cited

U.S. PATENT DOCUMENTS

| | | |
|---|---|---|
| 5,314,834 A | 5/1994 | Mazure et al. |
| 5,831,292 A | 11/1998 | Harris et al. |
| 7,393,749 B2 | 7/2008 | Yilmaz et al. |

(Continued)

OTHER PUBLICATIONS

Raghavendra S. Saxena and M. Jagadesh Kumar, "Trench Gate Power MOSFET: Recent Advances and Innovations", Advances in Microelectronics and Photonics, (Ed., S. Jit), Chapter 1, Nova Science Publishers, Inc. 400 Oser Avenue, Suite 1600, Hauppauge, NY 11788, USA, pp. 1-23, 2012.*

(Continued)

*Primary Examiner* — Joseph Schoenholtz
(74) *Attorney, Agent, or Firm* — Patent Law Group LLP; Brian D. Ogonowsky

(57) ABSTRACT

A power MOSFET cell includes an N+ silicon substrate having a drain electrode. A low dopant concentration N-type drift layer is grown over the substrate. An N-type layer, having a higher dopant concentration than the drift region, is then formed and etched to have sidewalls. A P-well is formed in the N-type layer, and an N+ source region is formed in the P-well. A gate is formed over the P-well's lateral channel and has a vertical extension next to the top portion of the sidewalls. A positive gate voltage inverts the lateral channel and increases the conduction along the sidewalls to reduce on-resistance. A vertical shield field plate is also located next to the sidewalls and extends virtually the entire length of the sidewalls. The field plate laterally depletes the N-type layer when the device is off to increase the breakdown voltage.

21 Claims, 55 Drawing Sheets

(51) Int. Cl.
*H01L 29/10* (2006.01)
*H01L 29/739* (2006.01)

(56) References Cited

U.S. PATENT DOCUMENTS

| | | | |
|---|---|---|---|
| 8,575,685 B2 | 11/2013 | Bobde et al. | |
| 2005/0082542 A1* | 4/2005 | Sumakeris et al. | 257/77 |
| 2007/0034923 A1 | 2/2007 | Liaw | |
| 2009/0212359 A1* | 8/2009 | Hsieh | 257/331 |
| 2010/0308400 A1* | 12/2010 | Darwish et al. | 257/330 |
| 2011/0006361 A1* | 1/2011 | Darwish et al. | 257/329 |
| 2011/0254088 A1* | 10/2011 | Darwish et al. | 257/340 |
| 2012/0261746 A1* | 10/2012 | Darwish et al. | 257/330 |
| 2014/0077289 A1 | 3/2014 | Miyajima | |

OTHER PUBLICATIONS

USPTO as ISA for PCT/US14/68857, "International Search Report and Written Opinion", Mar. 4, 2015, 8 pages.

* cited by examiner

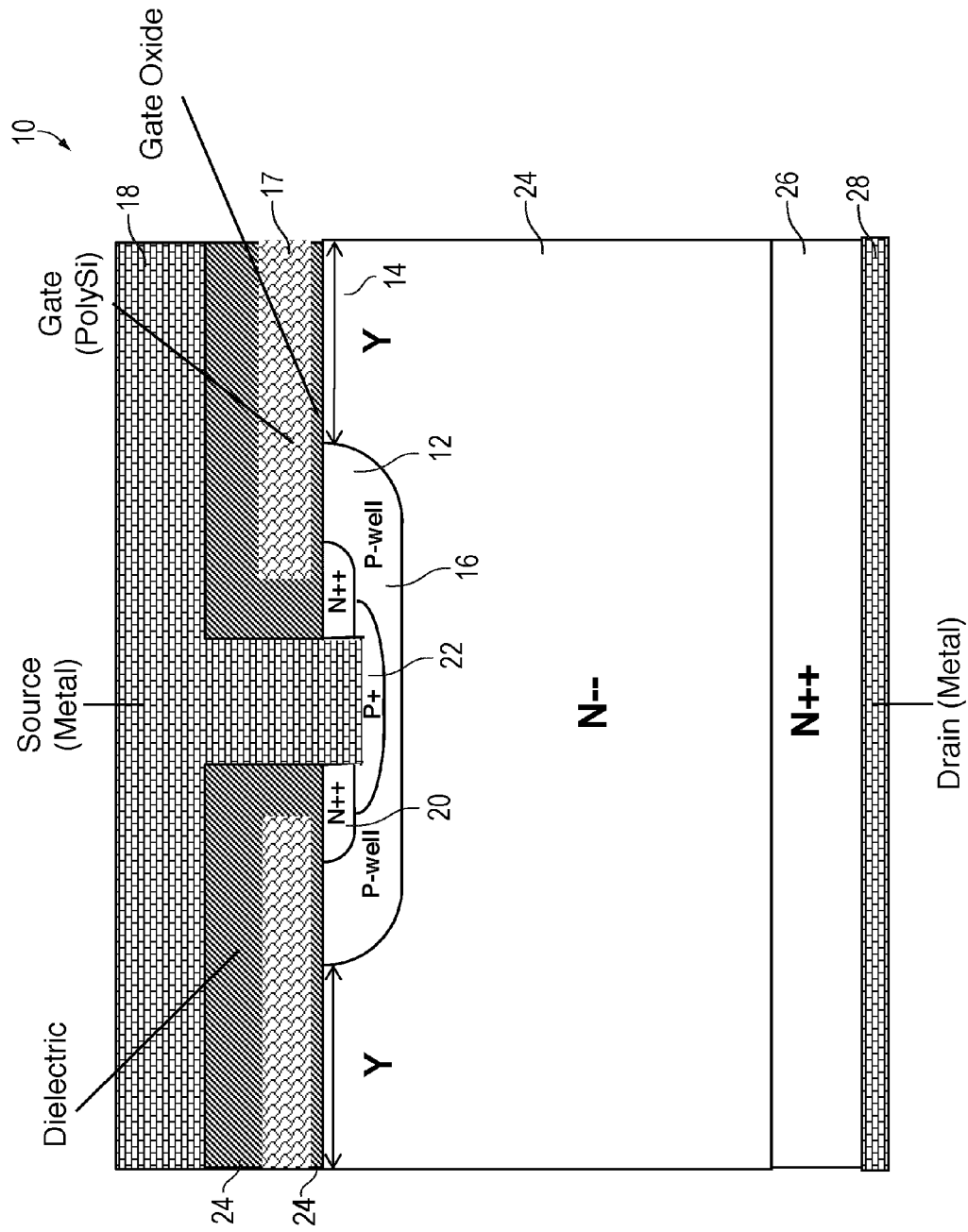

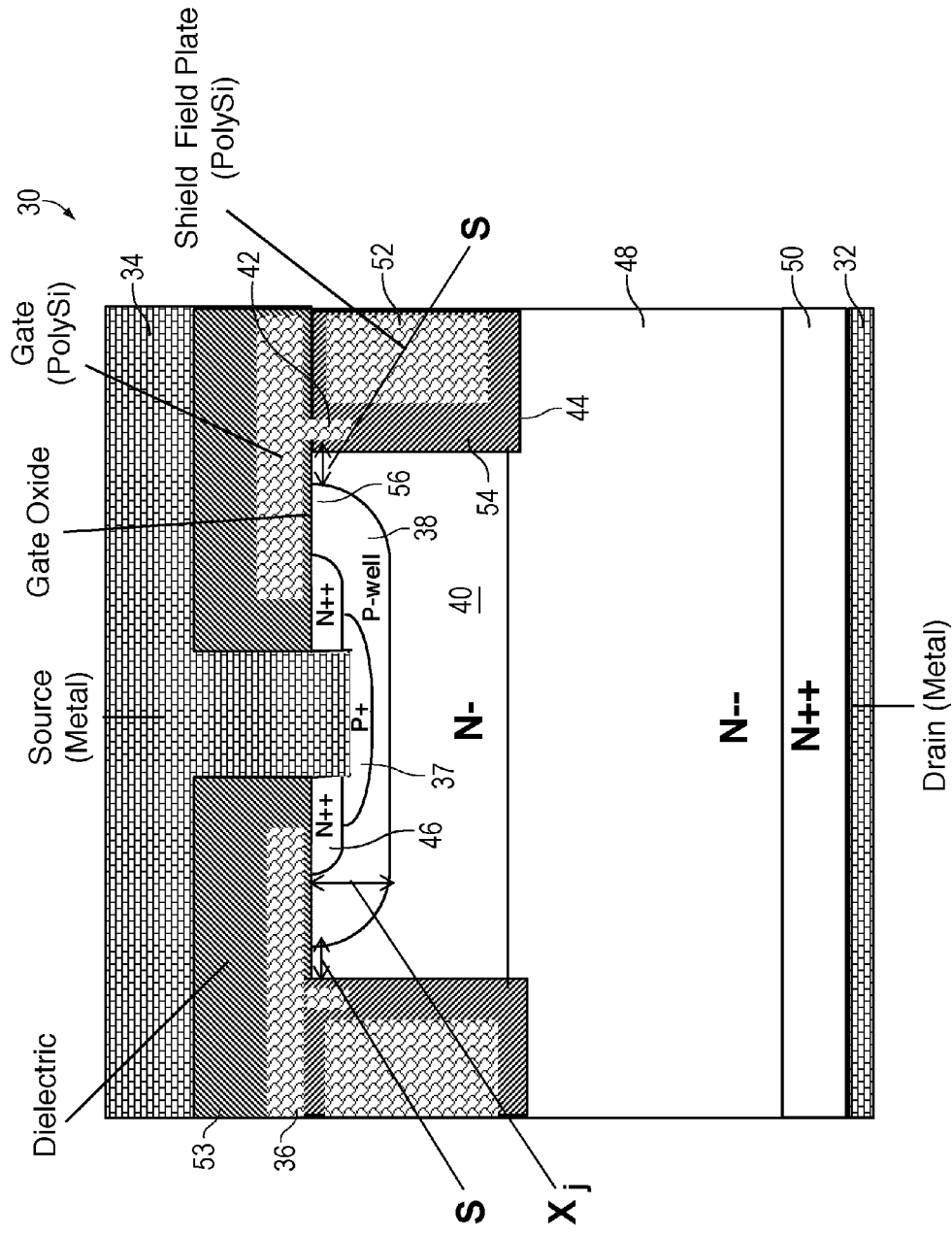
Fig. 2A DMOS Transistor with Wrapped Around Gate Structure

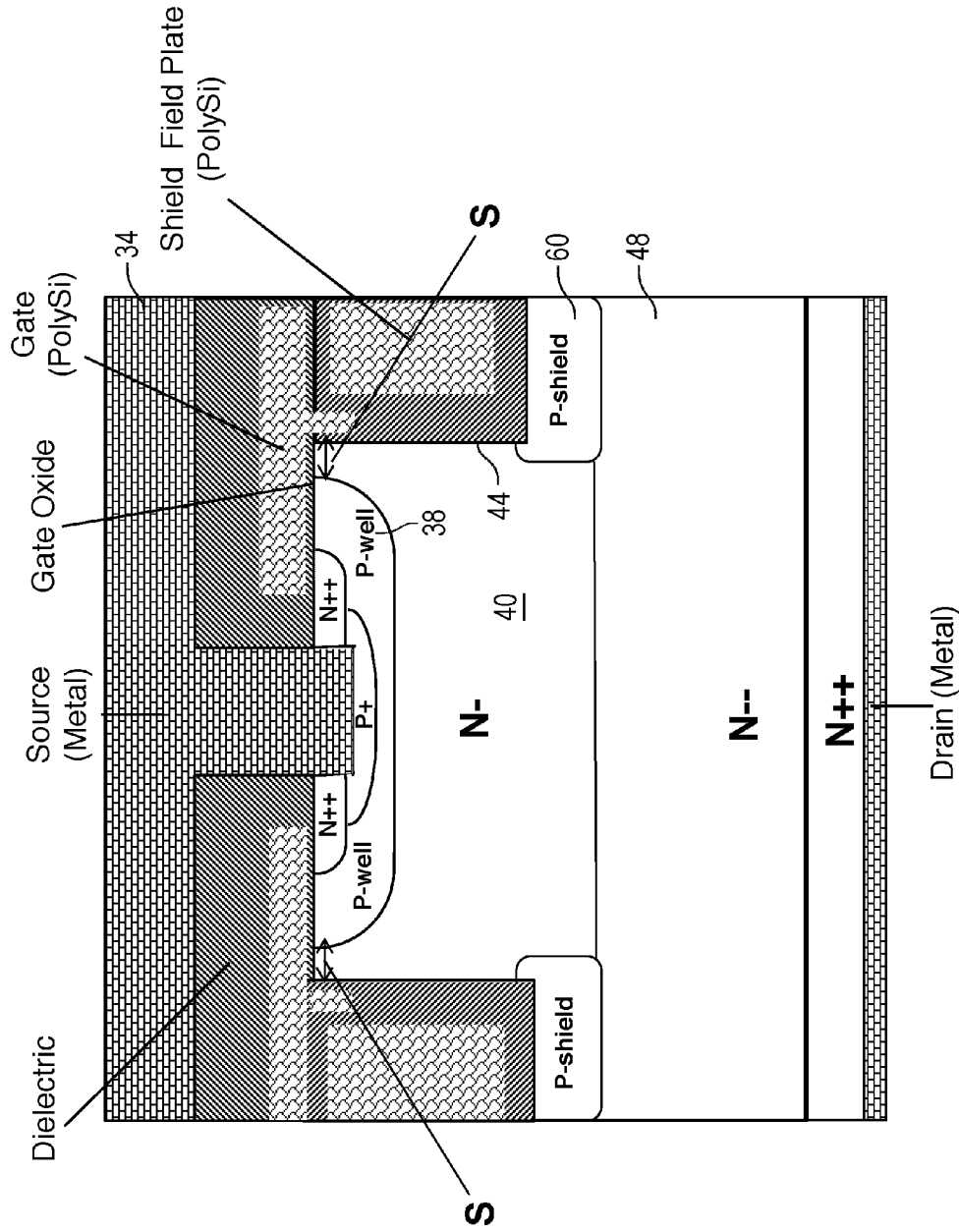
Fig. 2B Device Structure with P-Shield Region

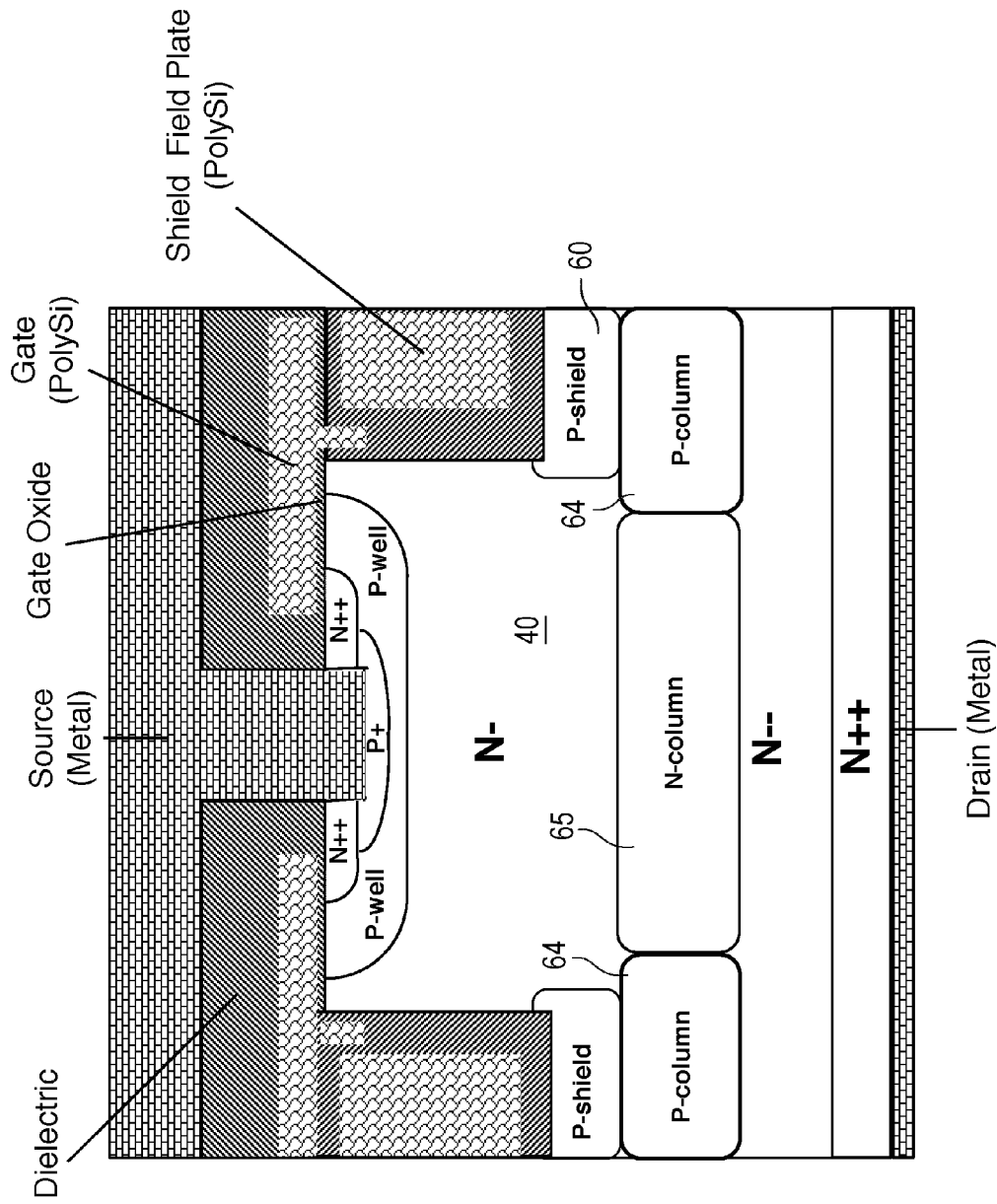
Fig. 2C Device Structure with N and P Charge Balance Columns

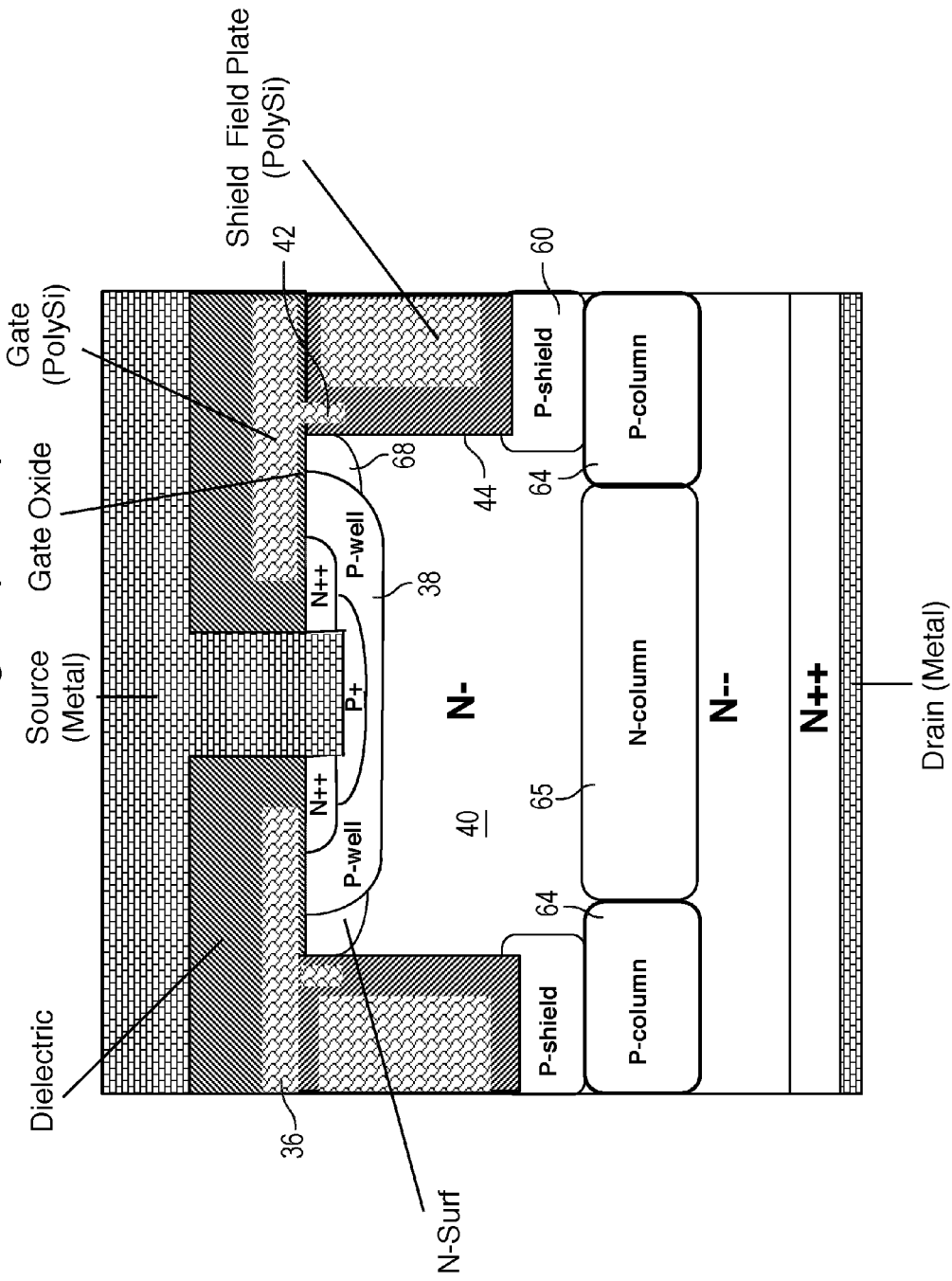
Fig. 2D Device Structure with Self-Aligned Enhanced N-Surface Region (N-Surf)

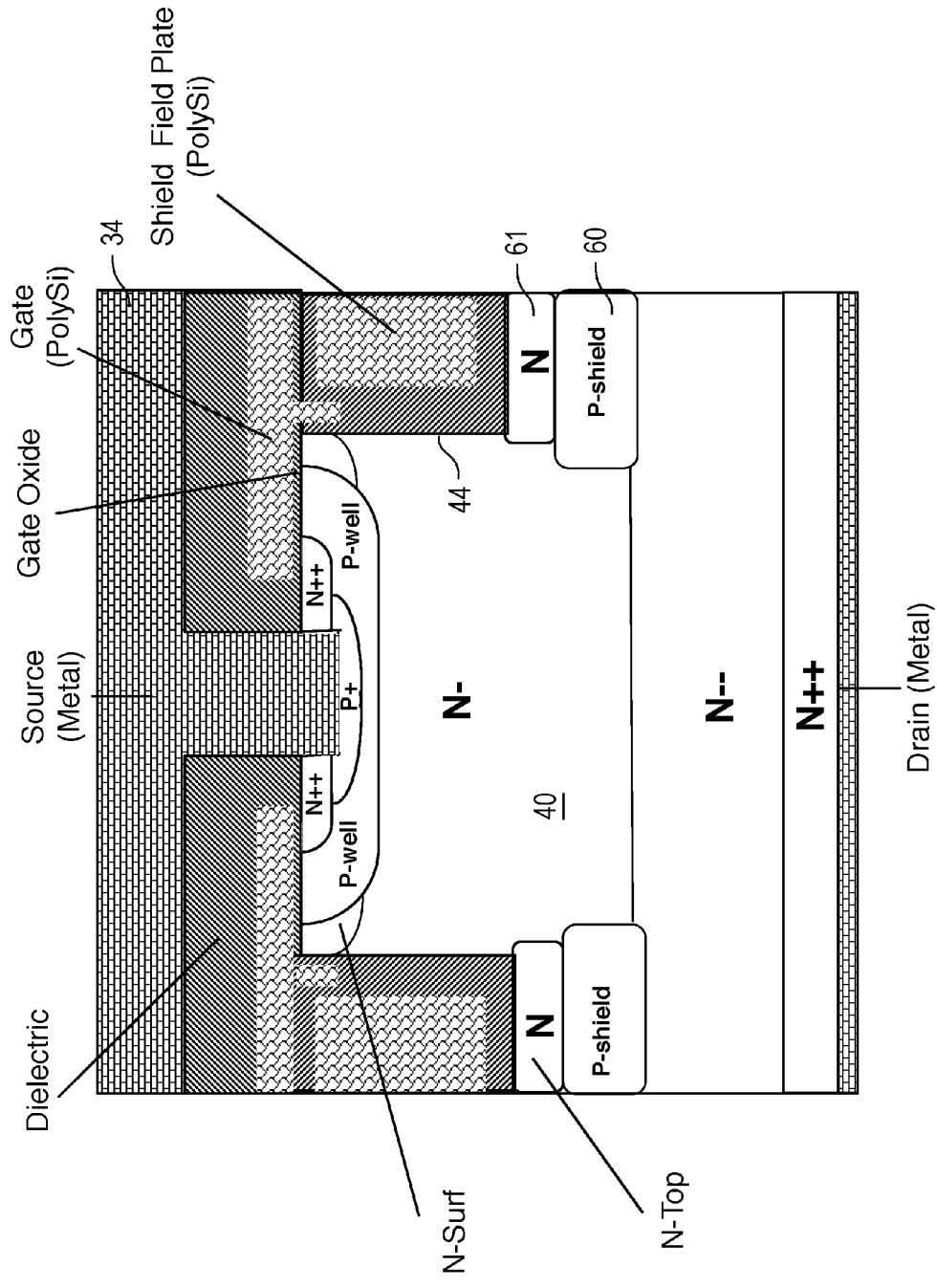
Fig. 2E Device Structure with Self-Aligned Enhanced N Region (N-Top)

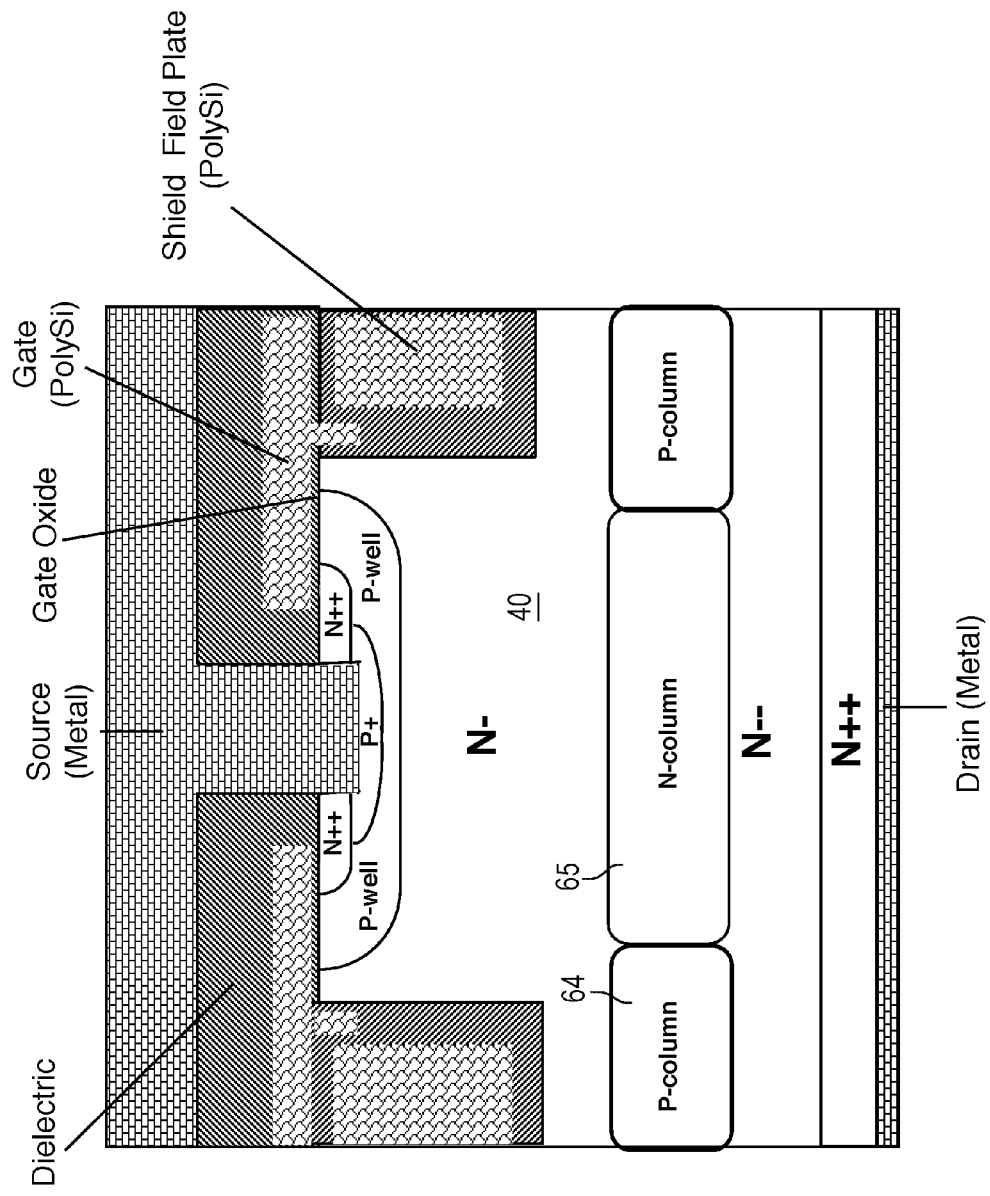
Fig. 2F Device Structure with N and P Charge Balance Columns

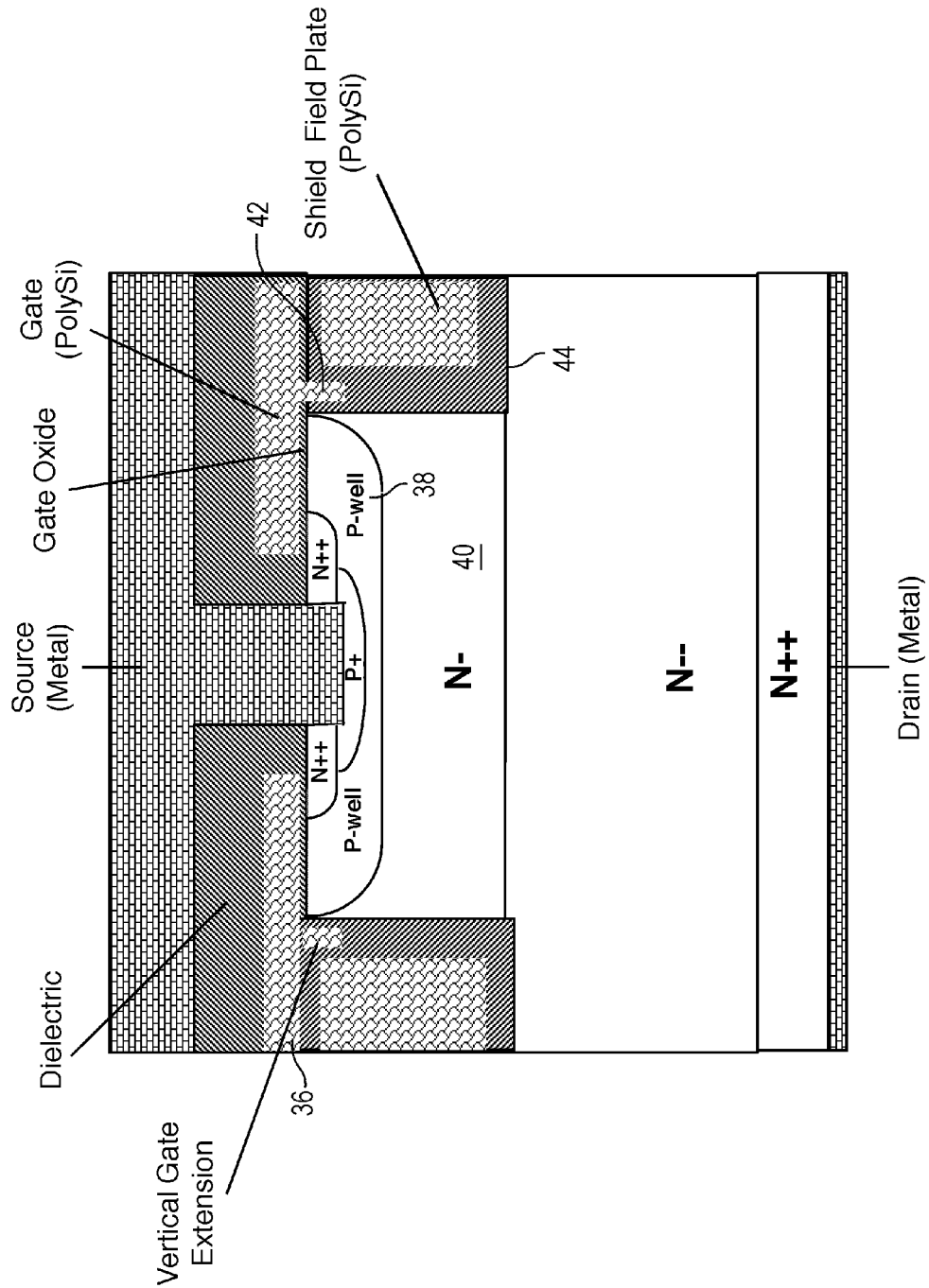
Fig. 3A Device Structure with Wrapped Around Gate and P-well Region Adjoining the Trench Top Corner

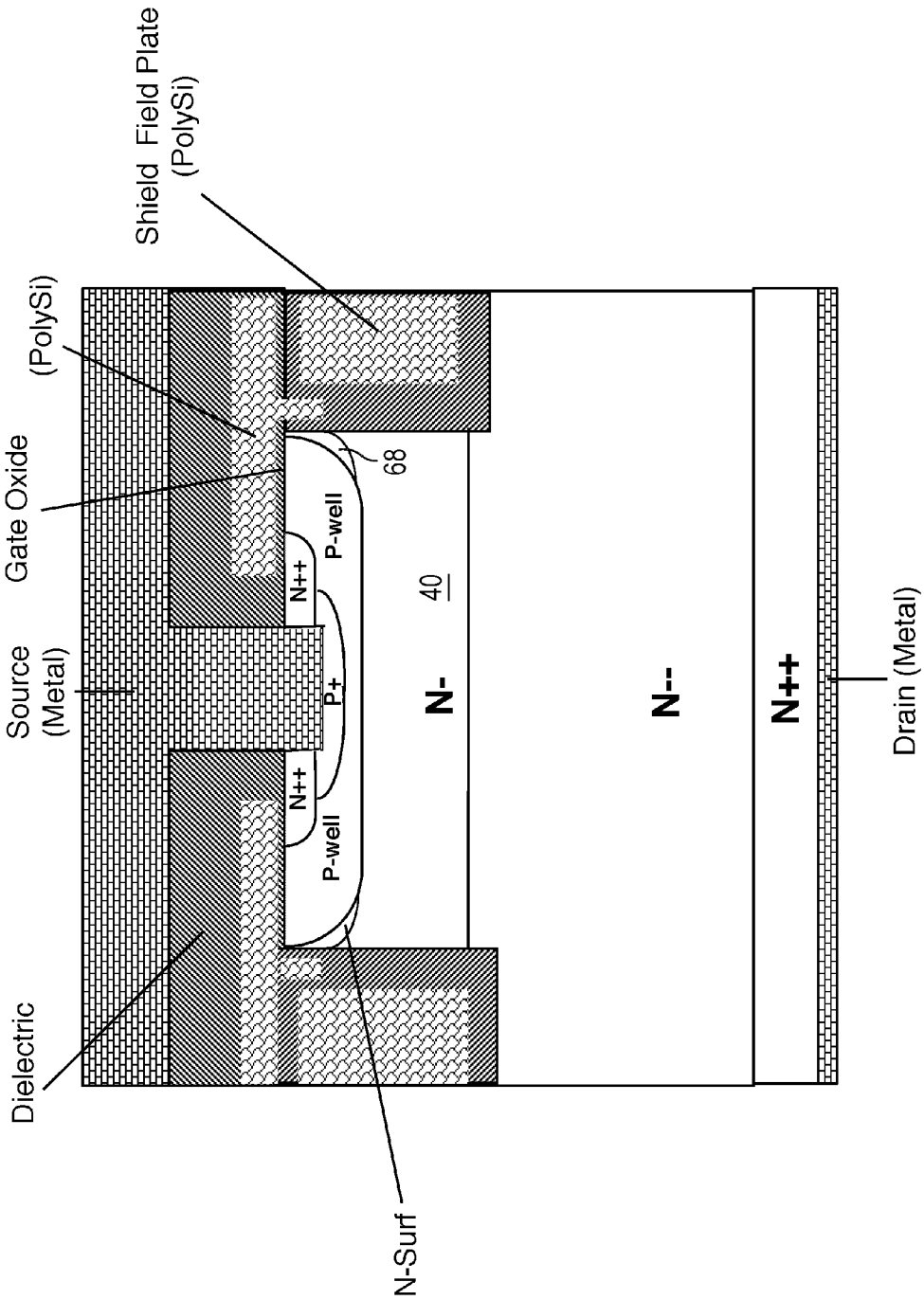
Fig. 3B Device Structure with Self-Aligned Enhanced N-Surface Region (N-Surf)

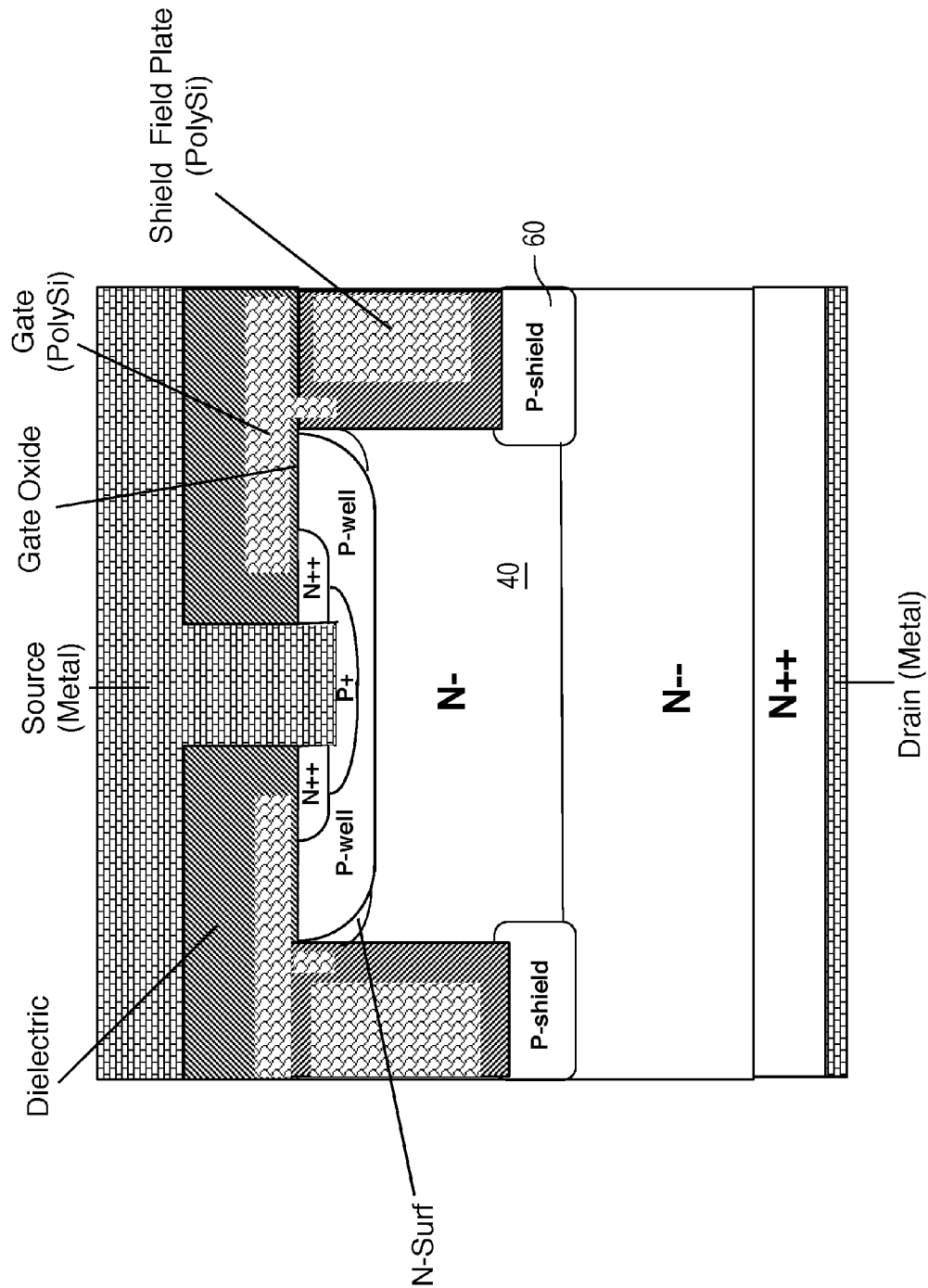
Fig. 3C Device Structure with P-Shield Region

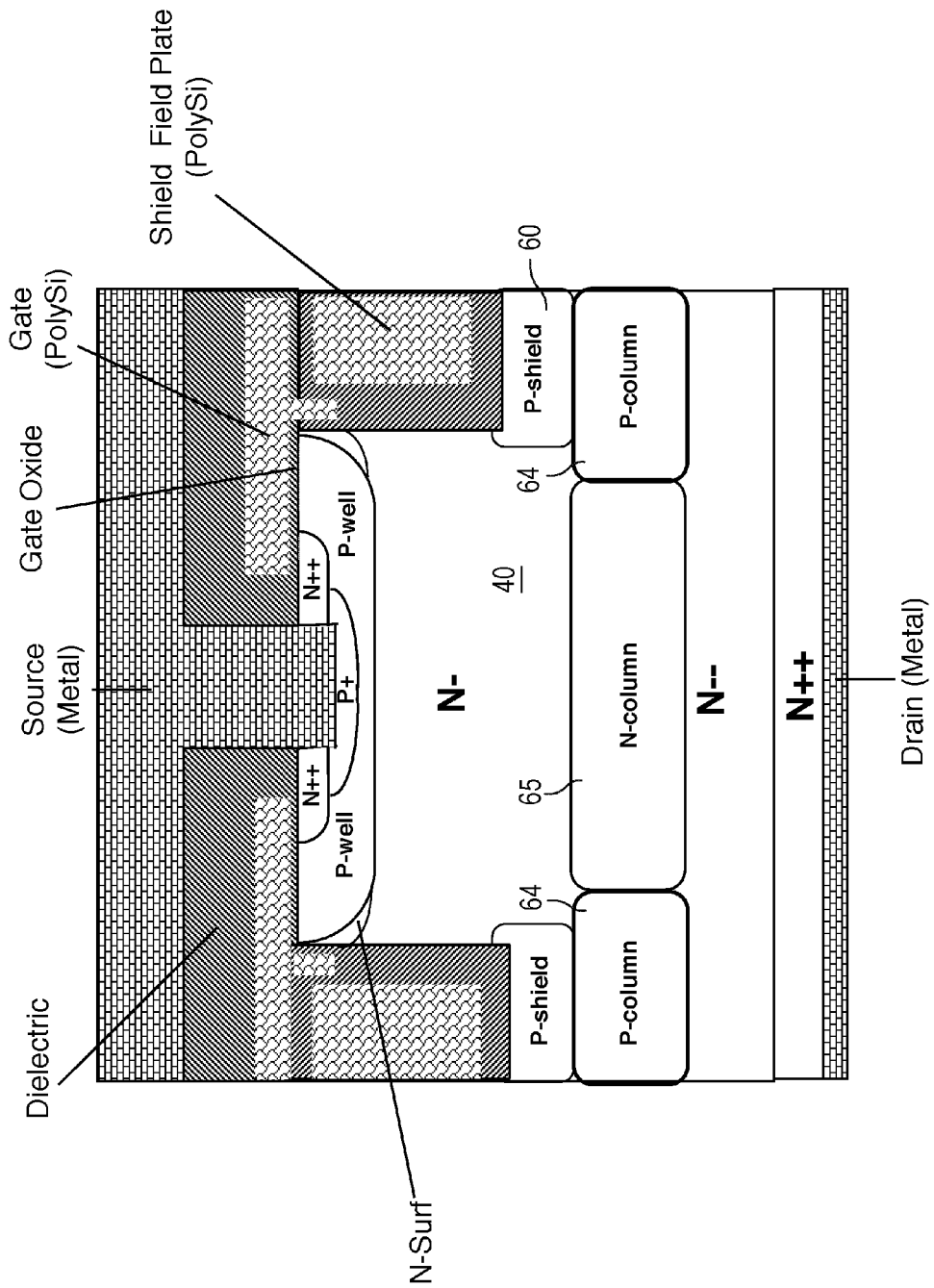
Fig. 3D Device Structure with N and P Charge Between Columns

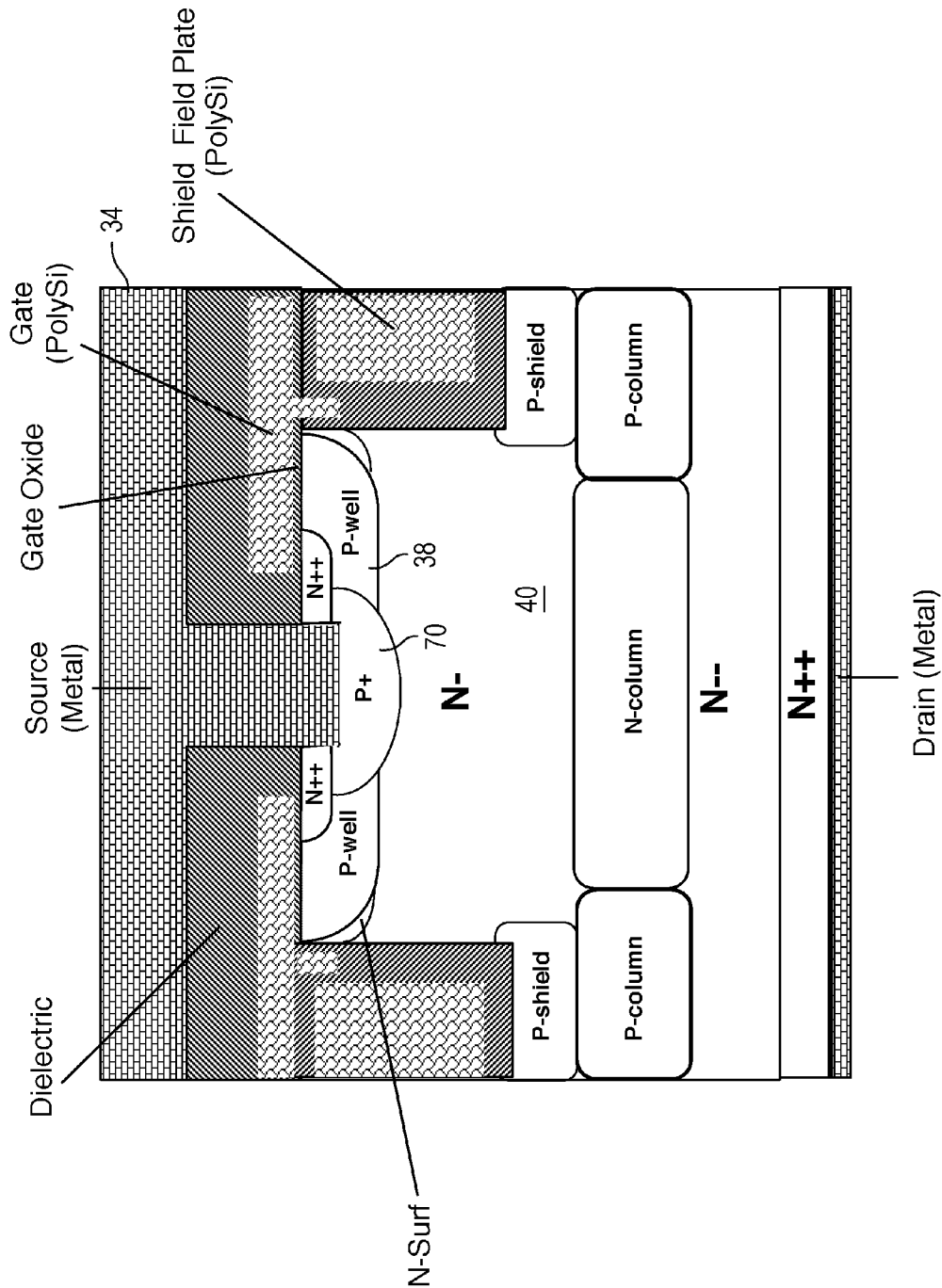
Fig. 3E Device Structure with Deep P+

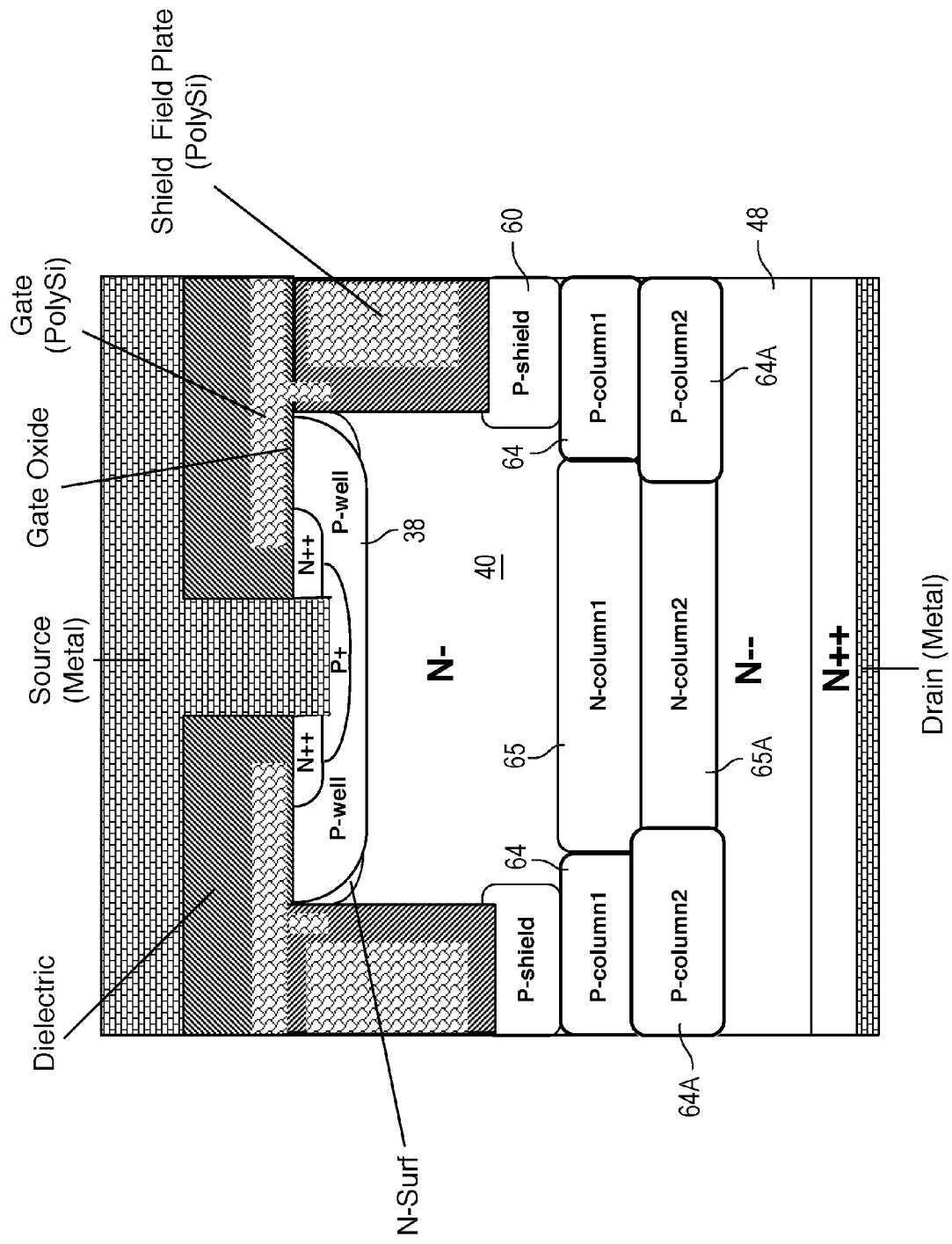
Fig. 3F Device Structure with Multiple N and P Charge Between Columns

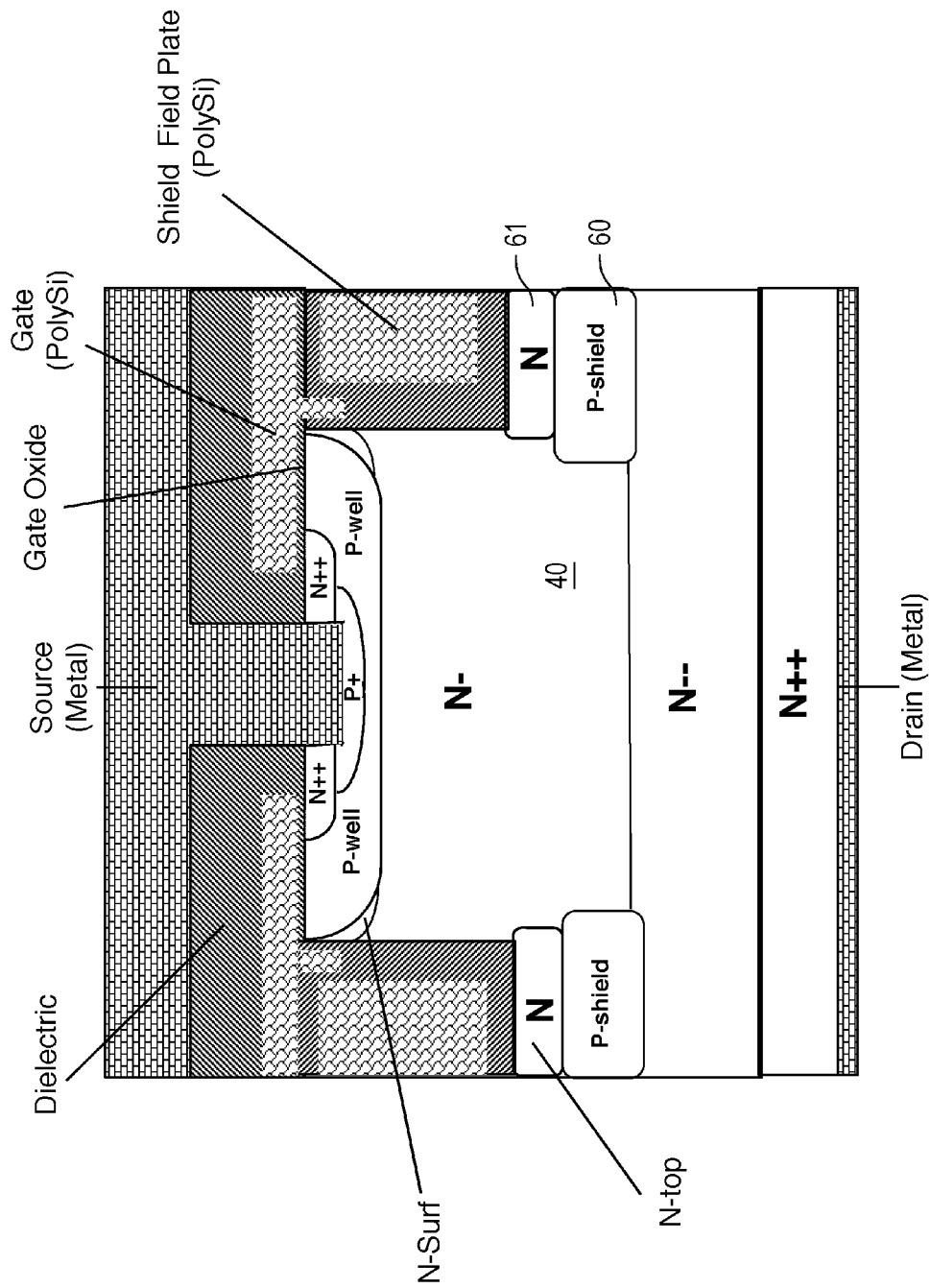
Fig. 3G Device Structure with Floating P-Shield Region and Self-Aligned N-Region (N-Top)

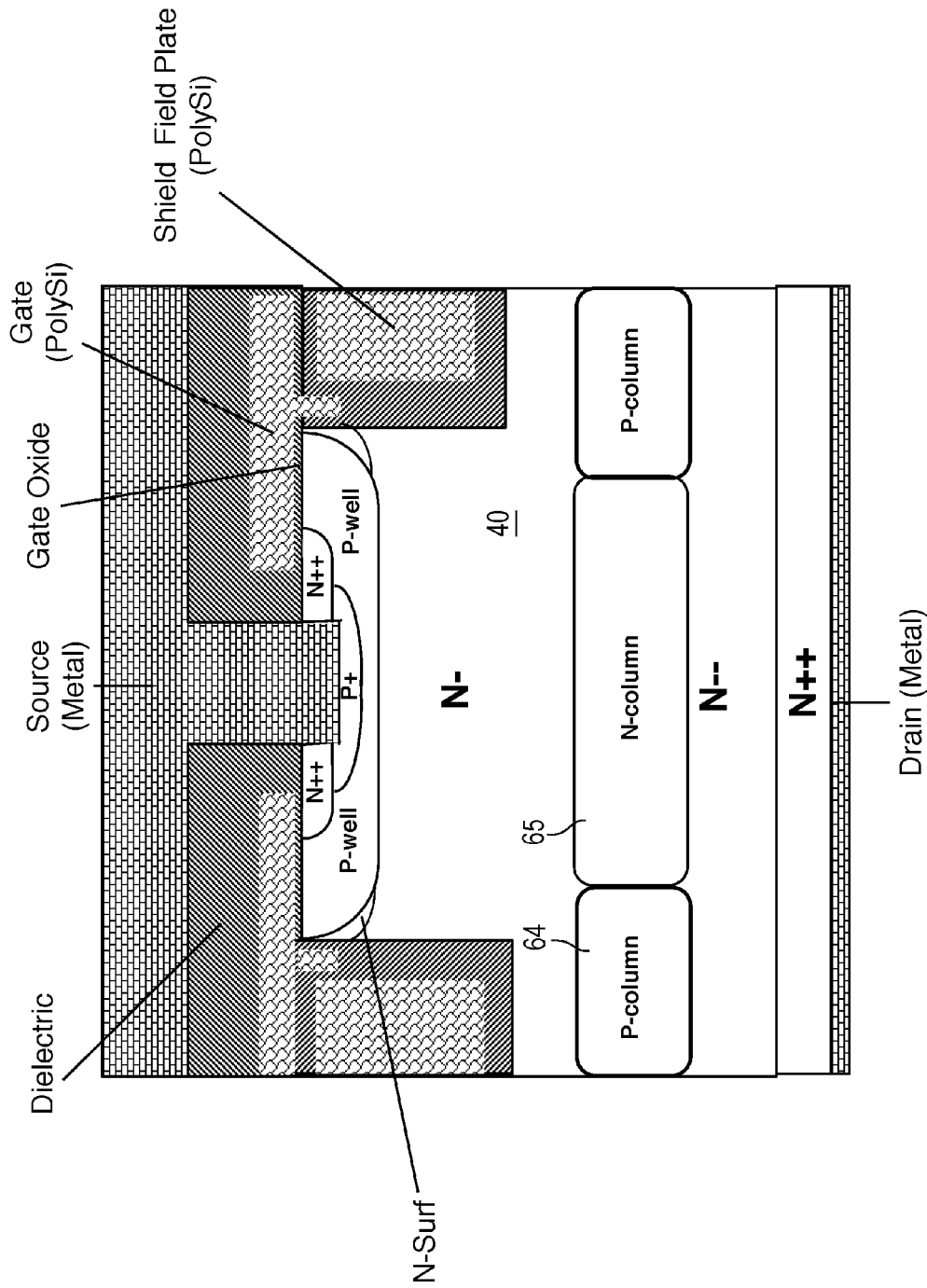
Fig. 3H Device Structure with N and P Charge Balance Columns (without P-Shield)

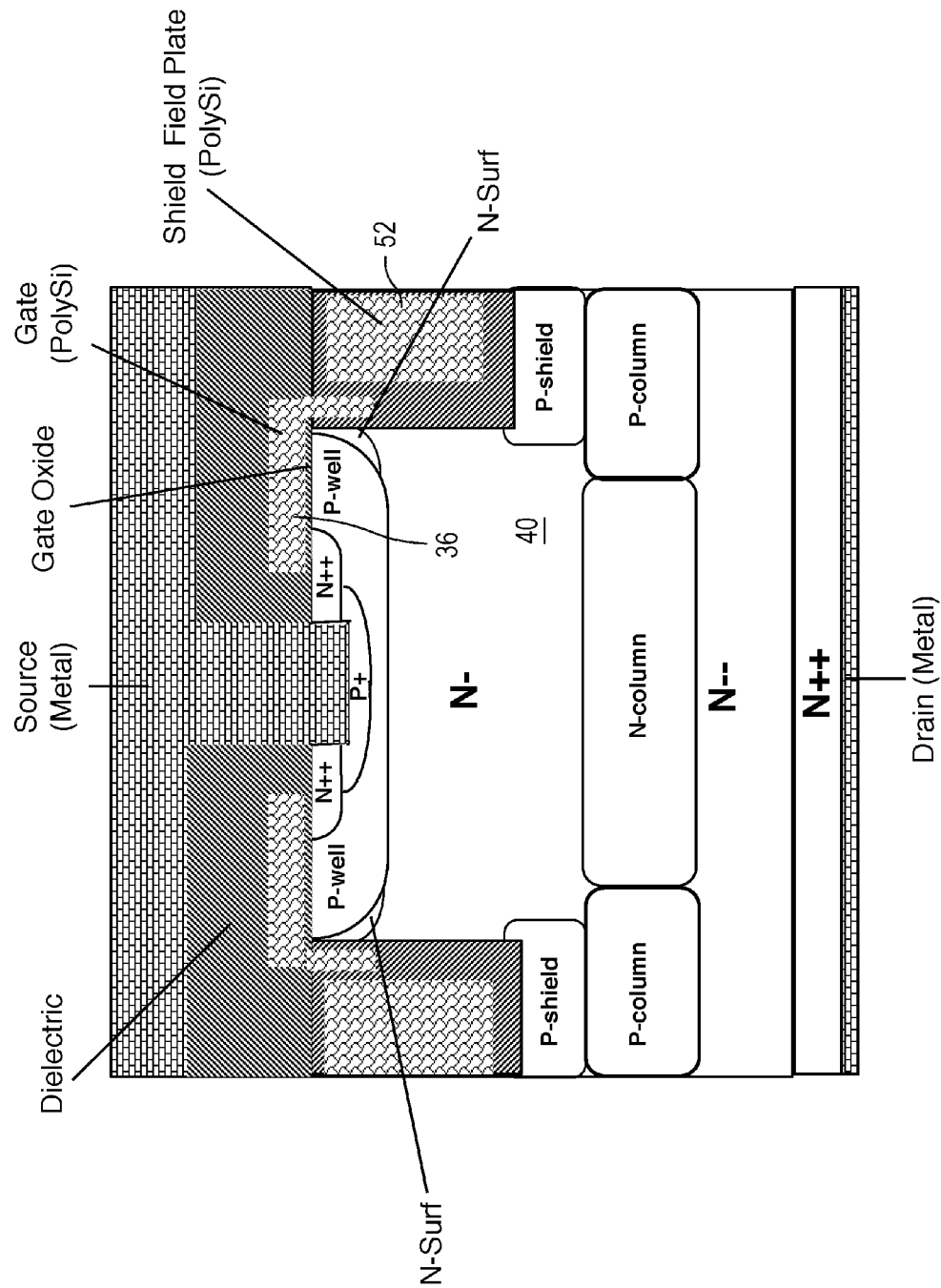
Fig. 4A Device Structure with Minimum Overlapping Gate-Shield Field Plate

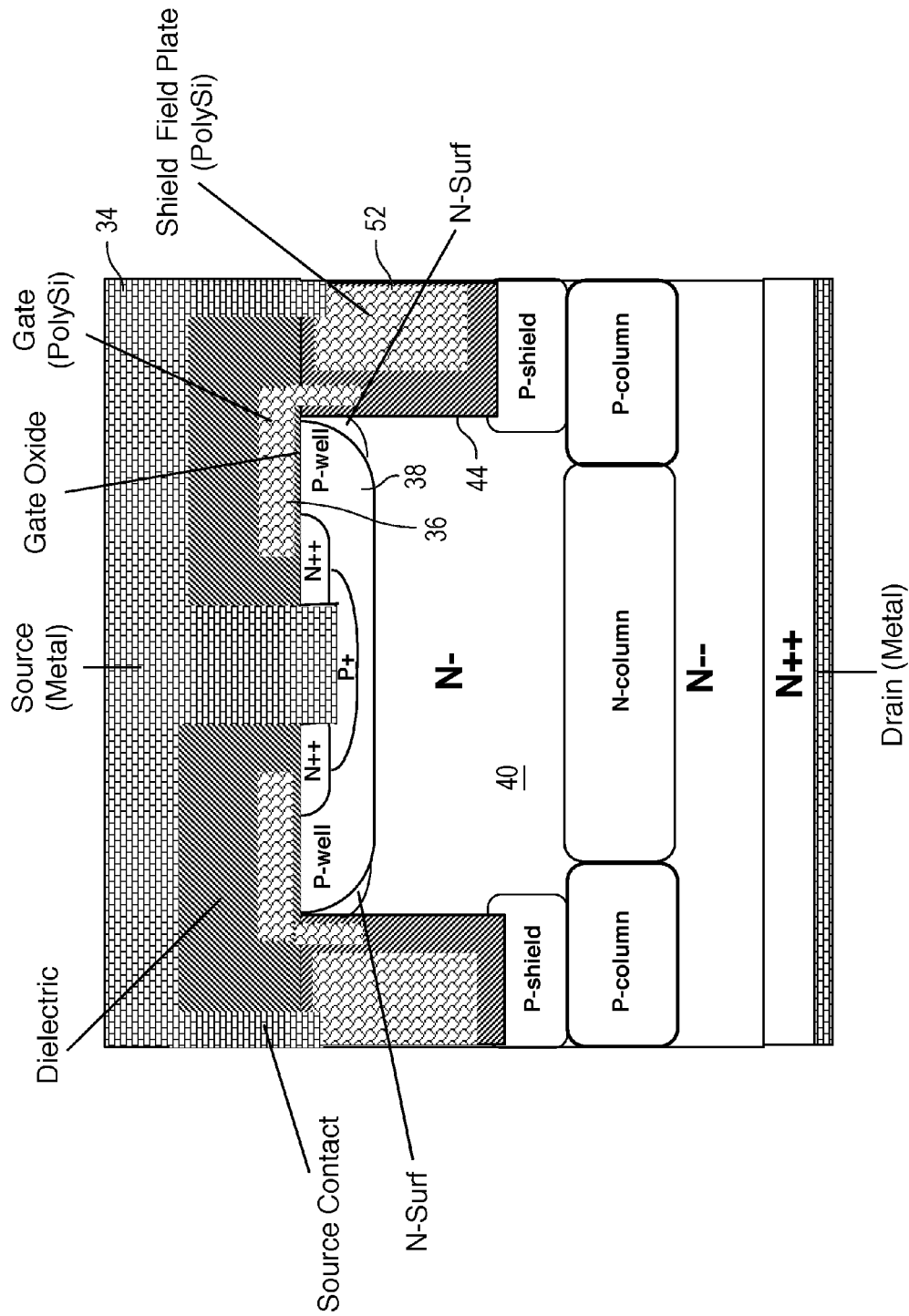
Fig. 4B Device Structure with the Shield Field Plate Contacted to the Source Metal

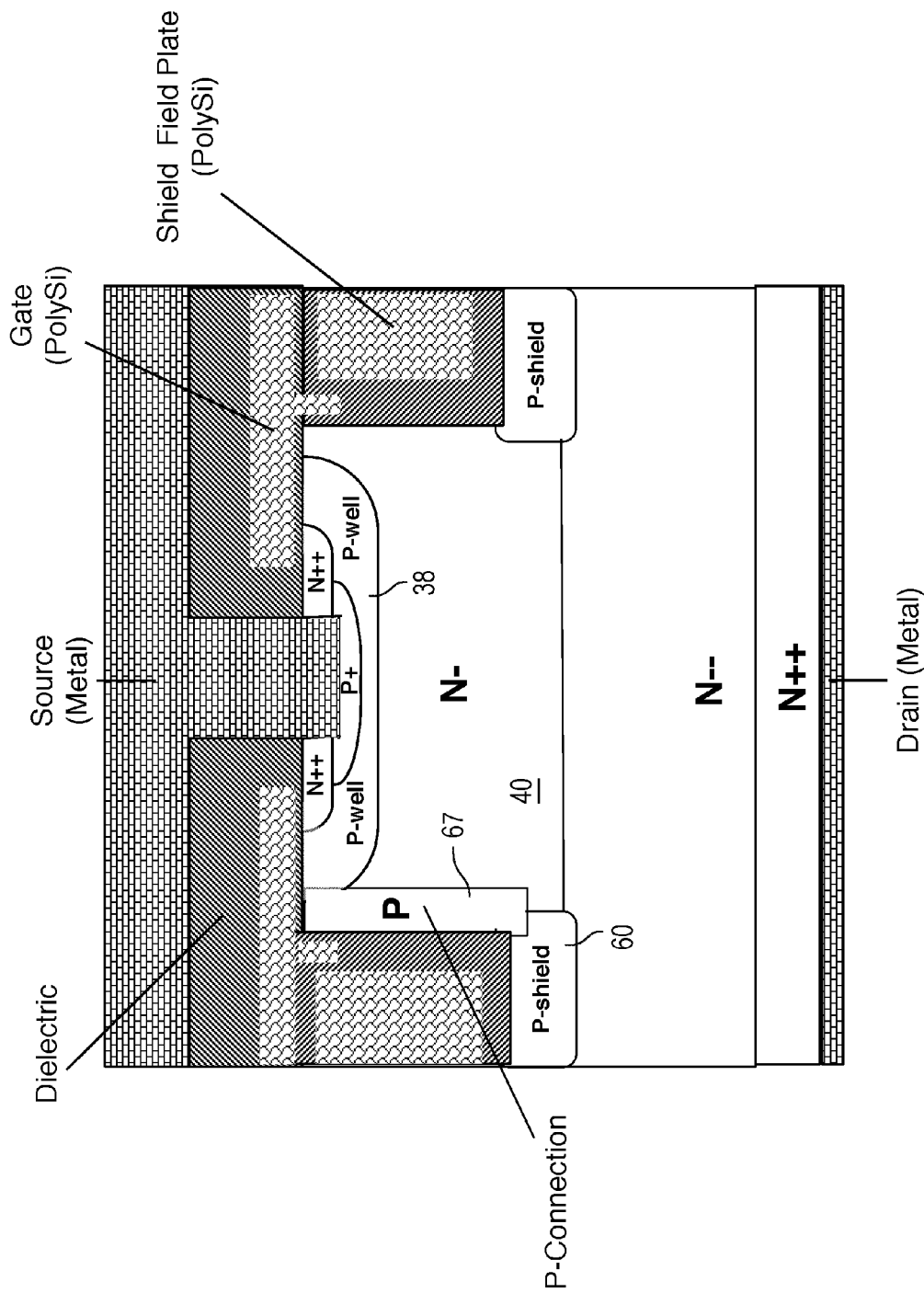
Fig. 4C Device Structure with P-Shield Connection Region

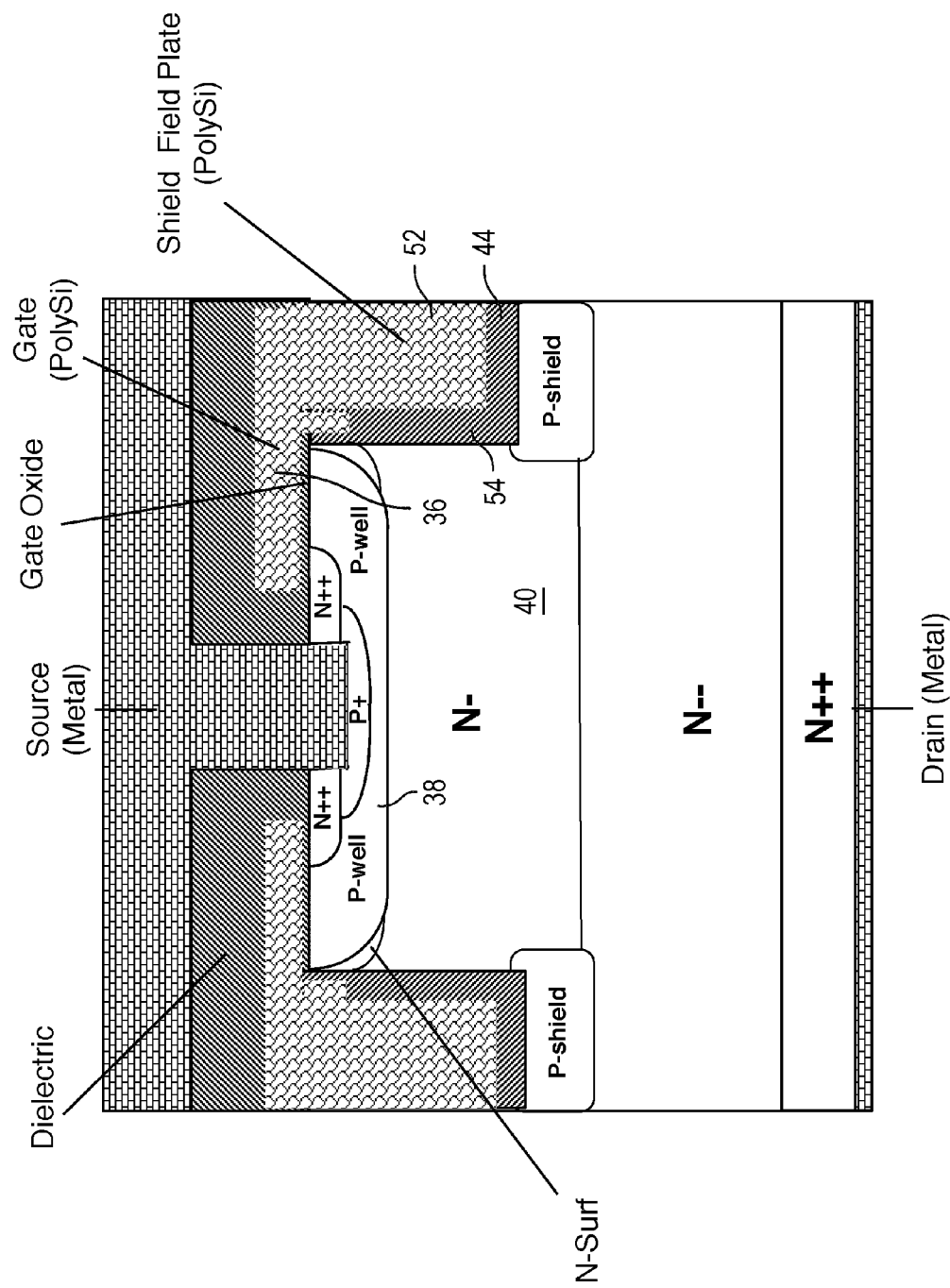
Fig. 5A Device Structure with Stepped Gate Oxide Thickness

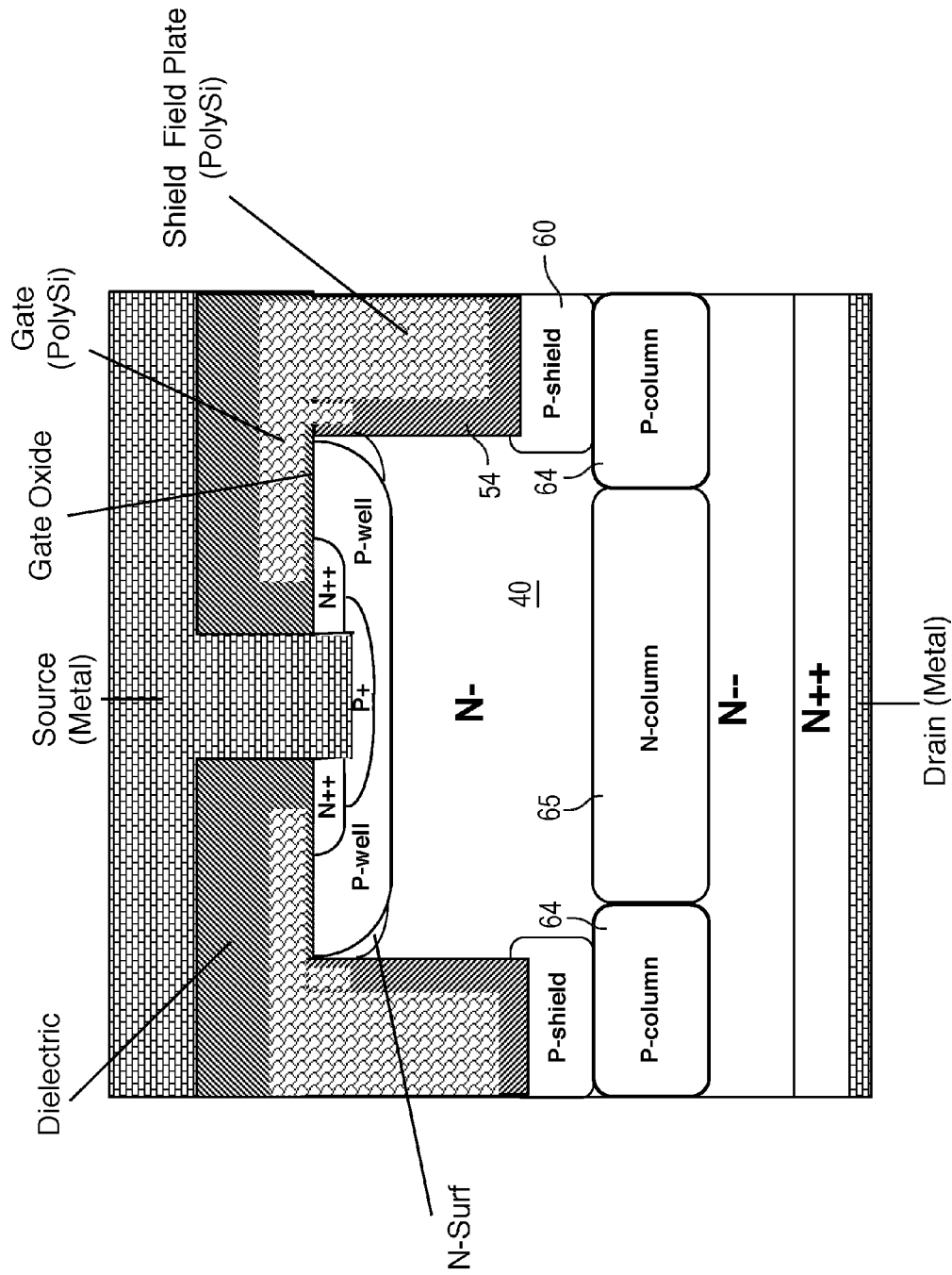
Fig. 5B Device Structure with Stepped Gate Oxide Thickness

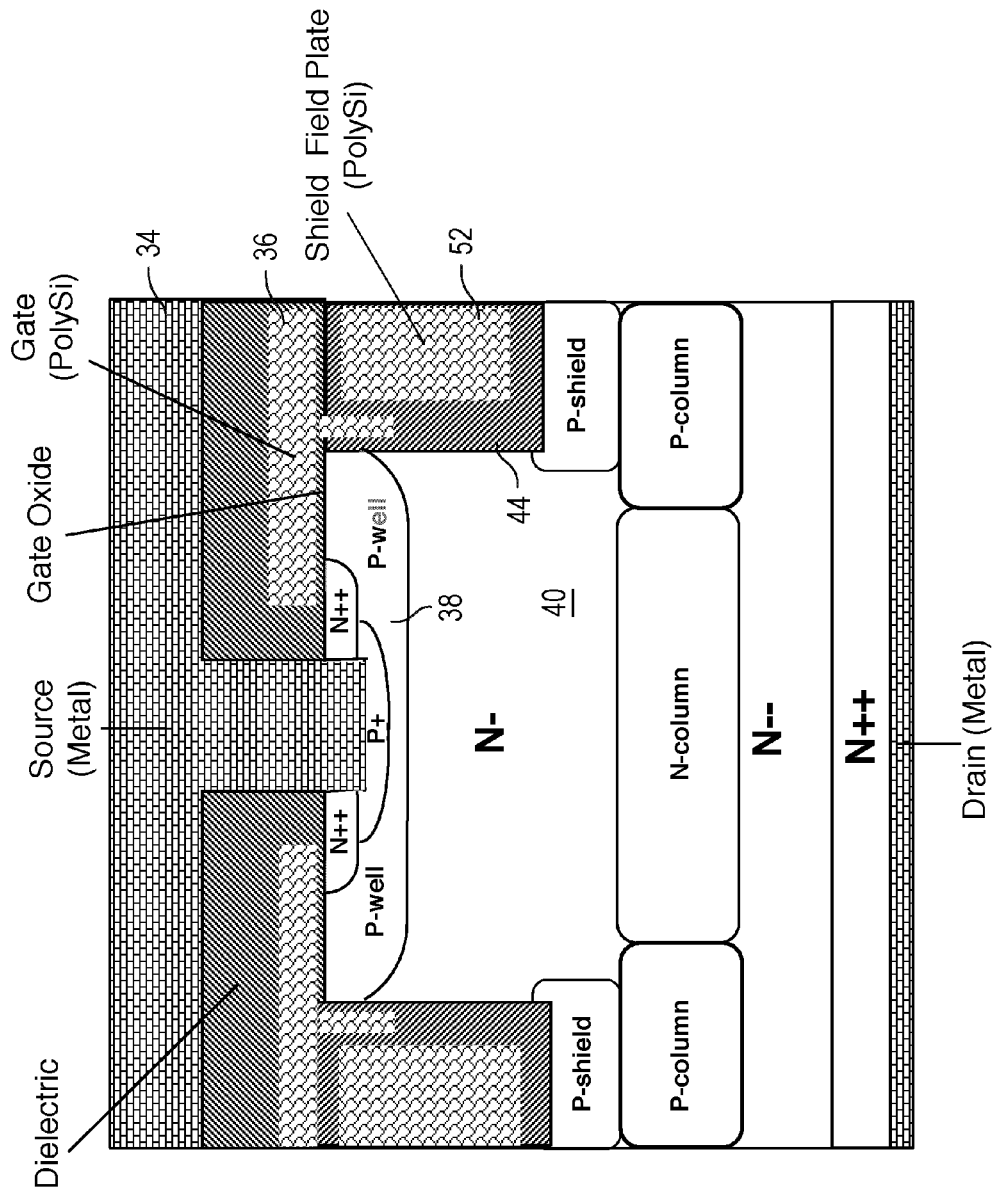
Fig. 6A Device Structure with Wrapped Around Gate and P-well Region Adjoining the Trench Sidewall

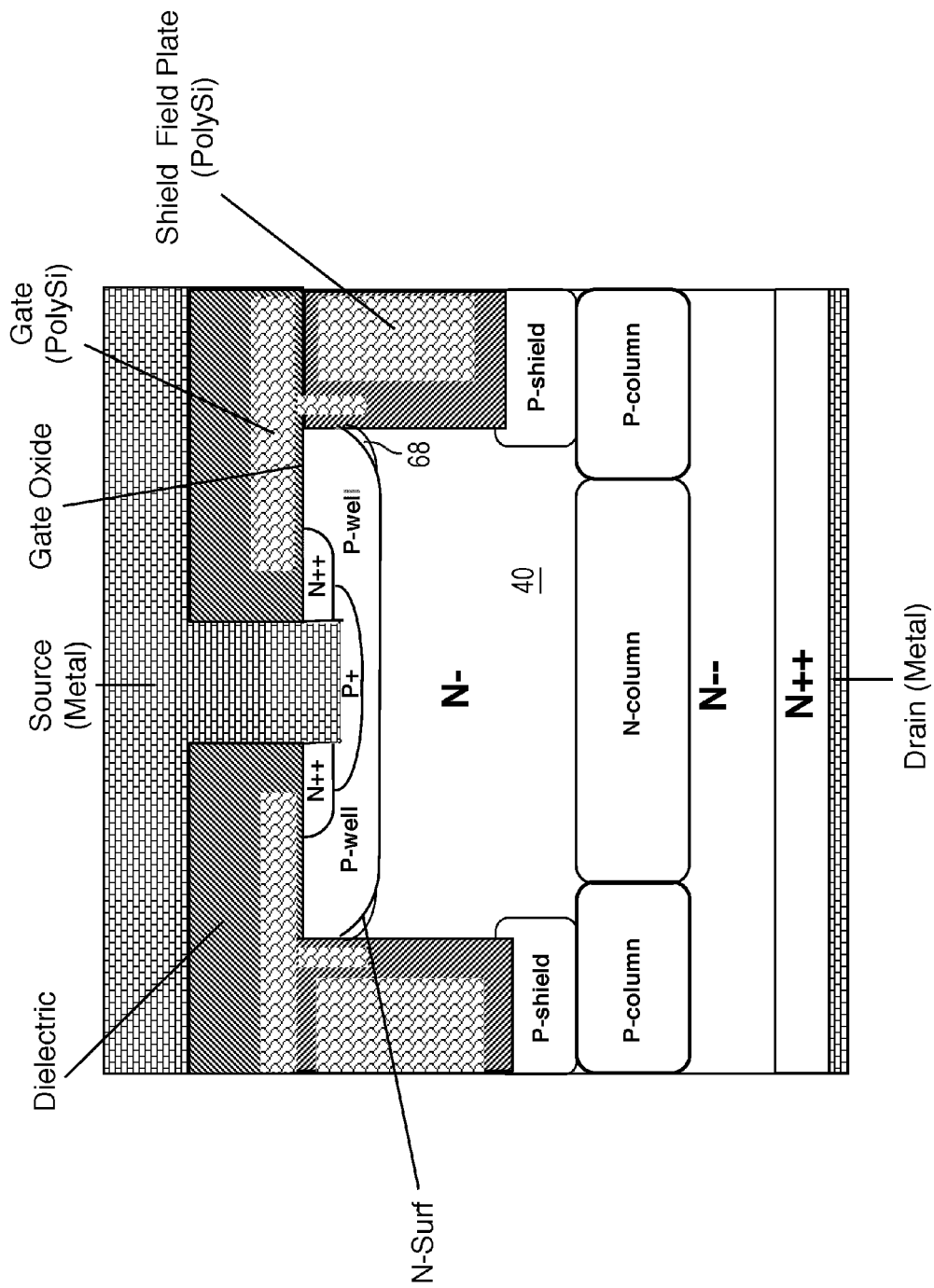
Fig. 6B Device Structure with Self-Aligned Enhanced N-Surface Region (N-Surf)

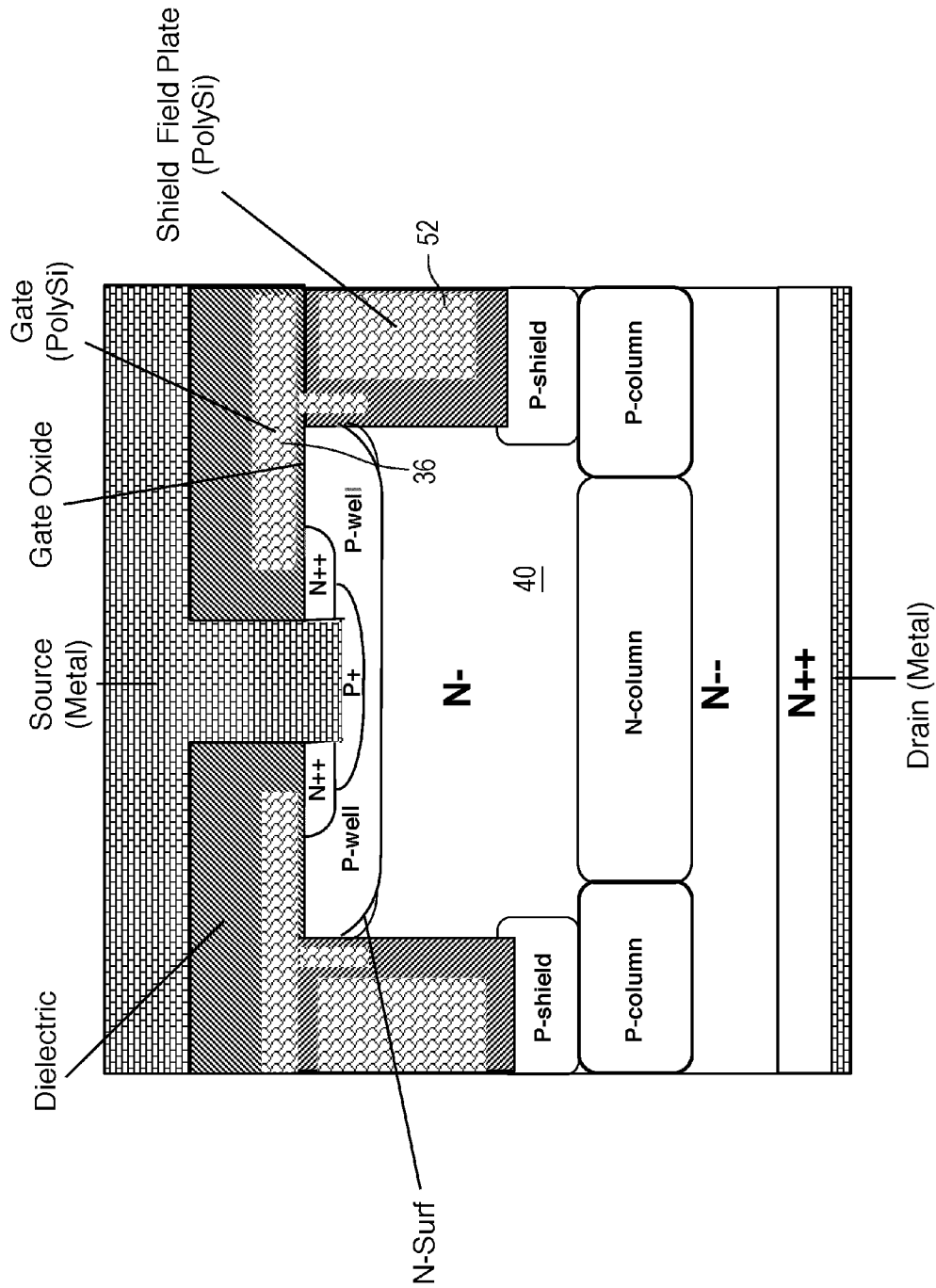
Fig. 6C Device Structure with Minimum Overlapping Gate-Shield Field Plate

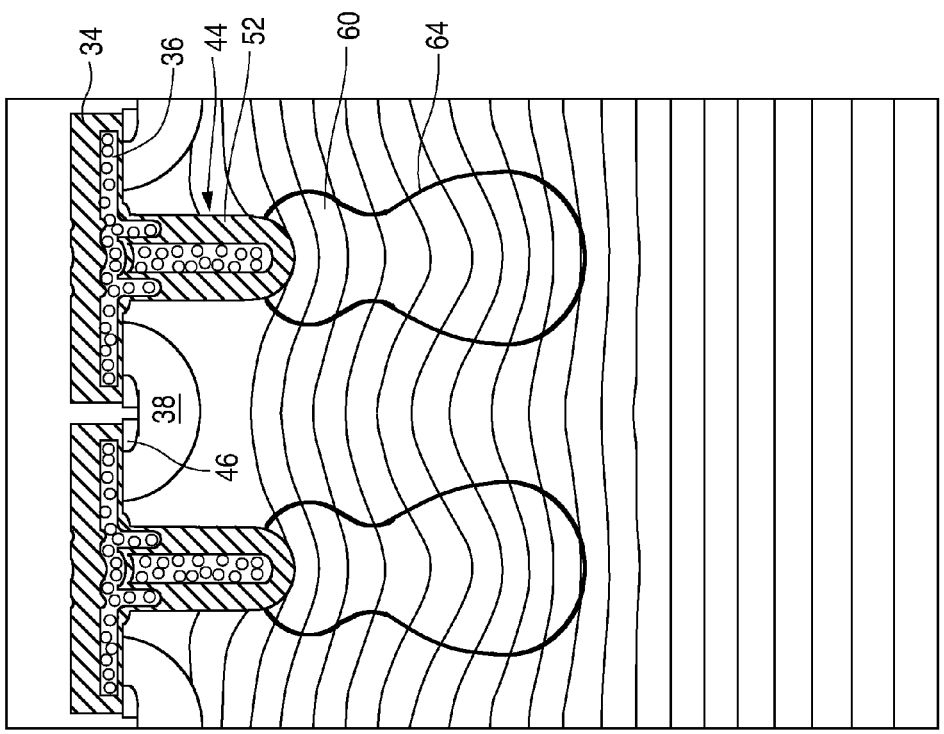
FIG. 7A Potential Contours from 2-D Device Simulation at the Onset of Breakdown

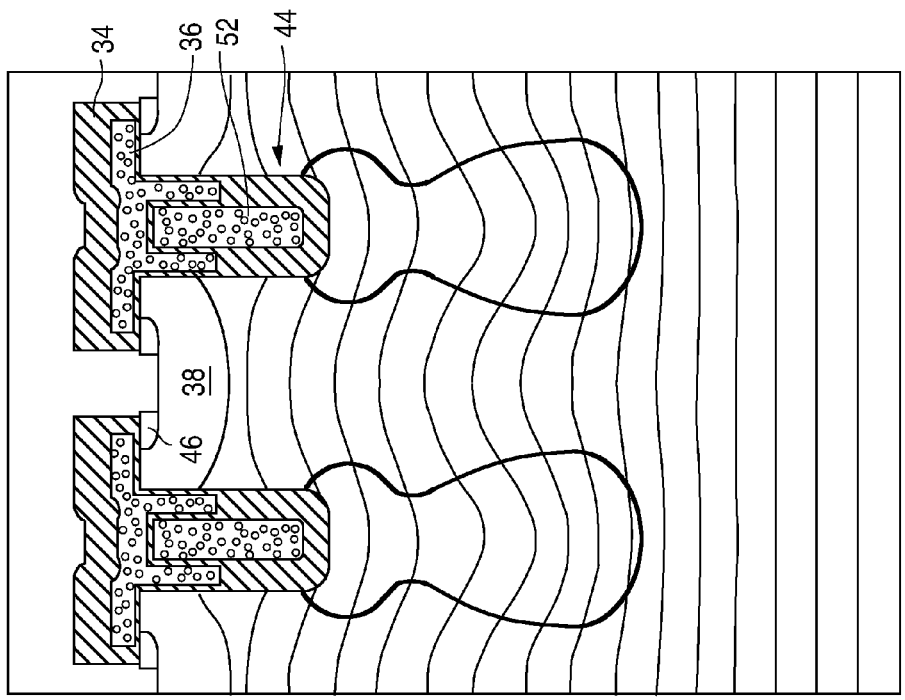
FIG. 7B Potential Contours from 2-D Device Simulation at the Onset of Breakdown

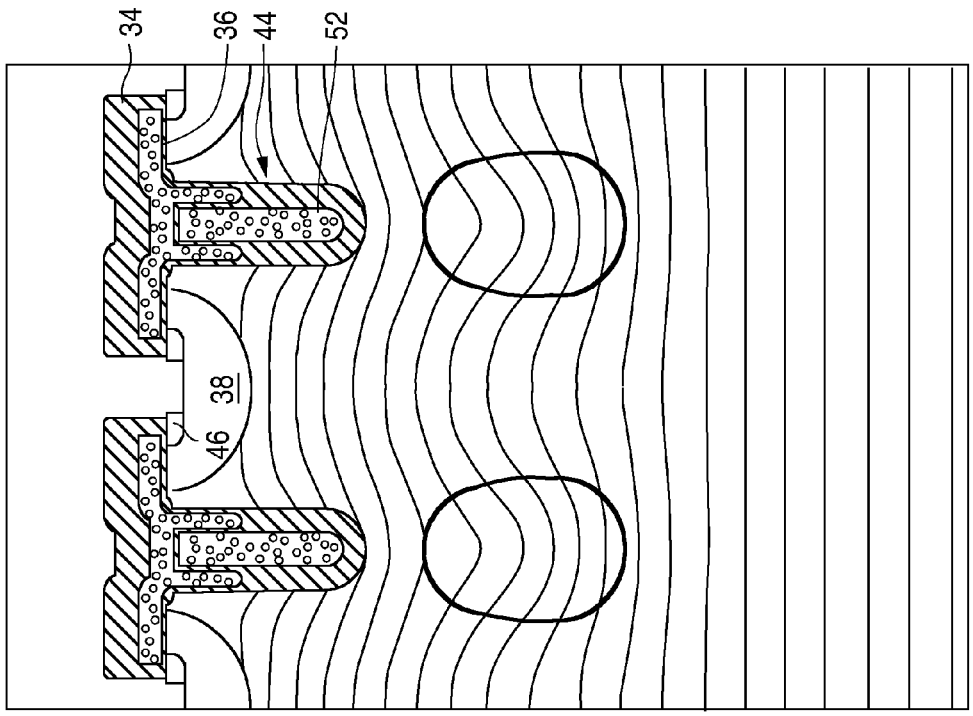
FIG. 7C Potential Contours from 2-D Device Simulation at the Onset of Breakdown with N-top
BVDSS ~ 623V

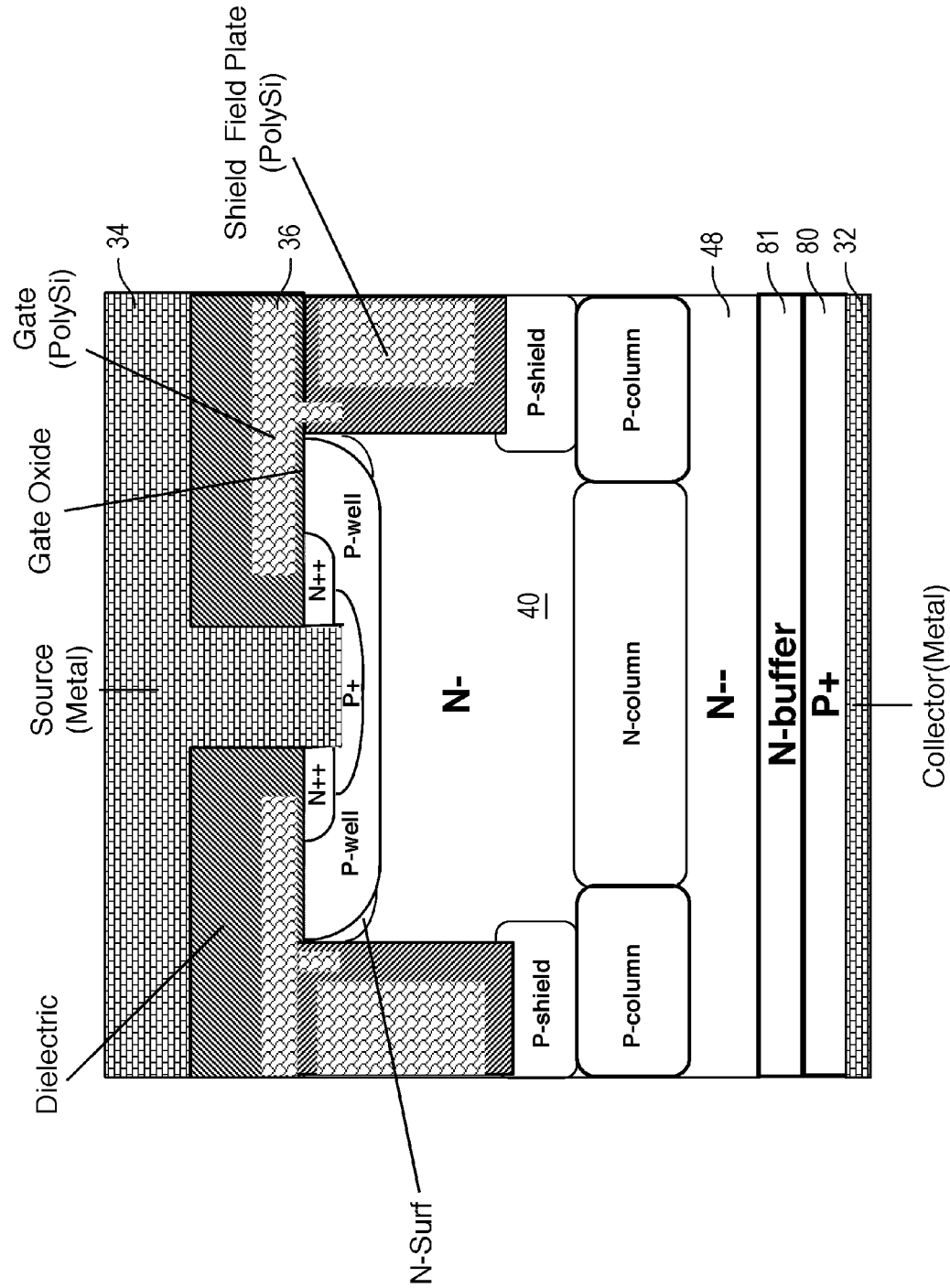
Fig. 9A Device Structure - IGBT

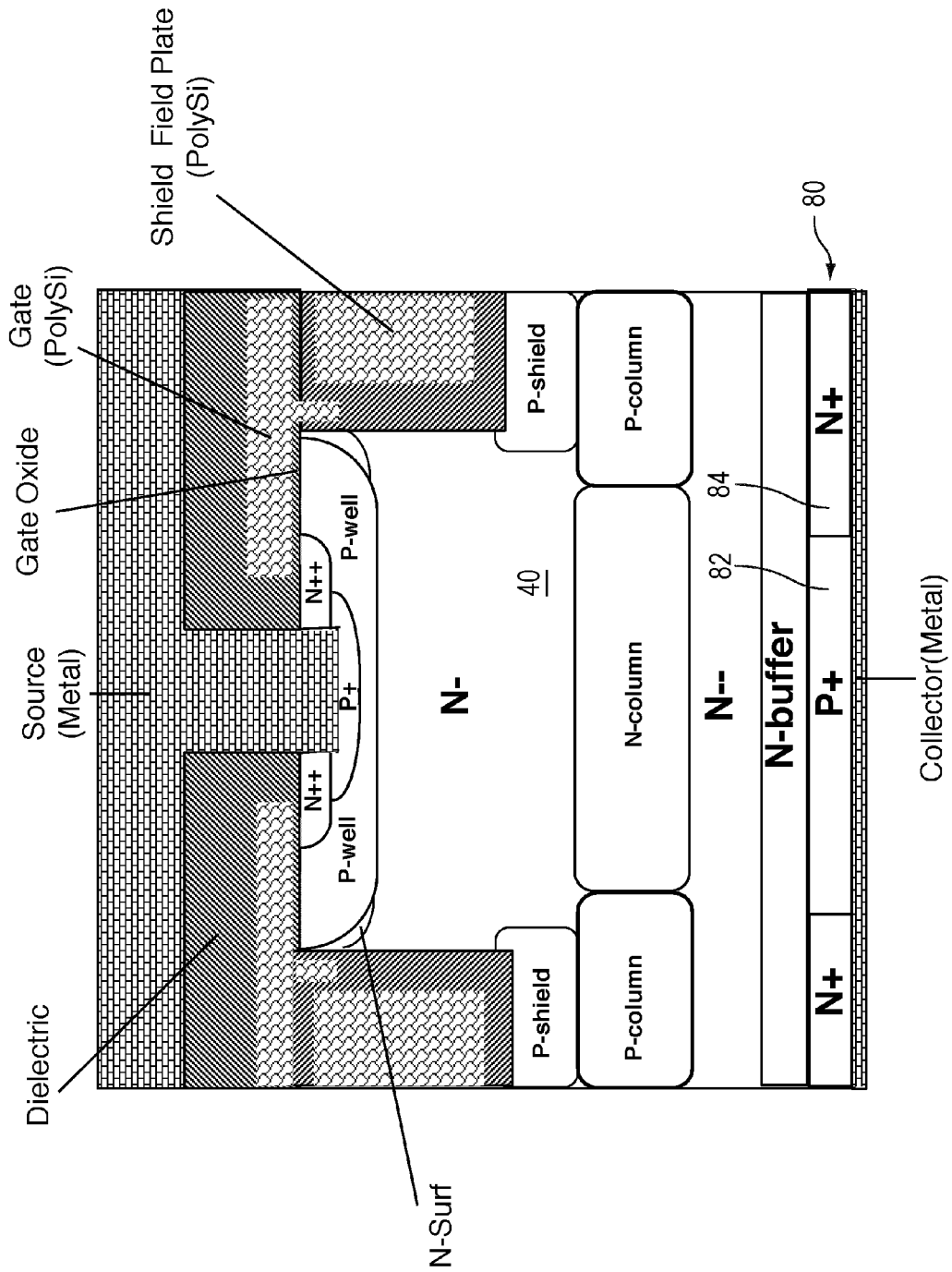
Fig. 9B Device Structure - IGBT

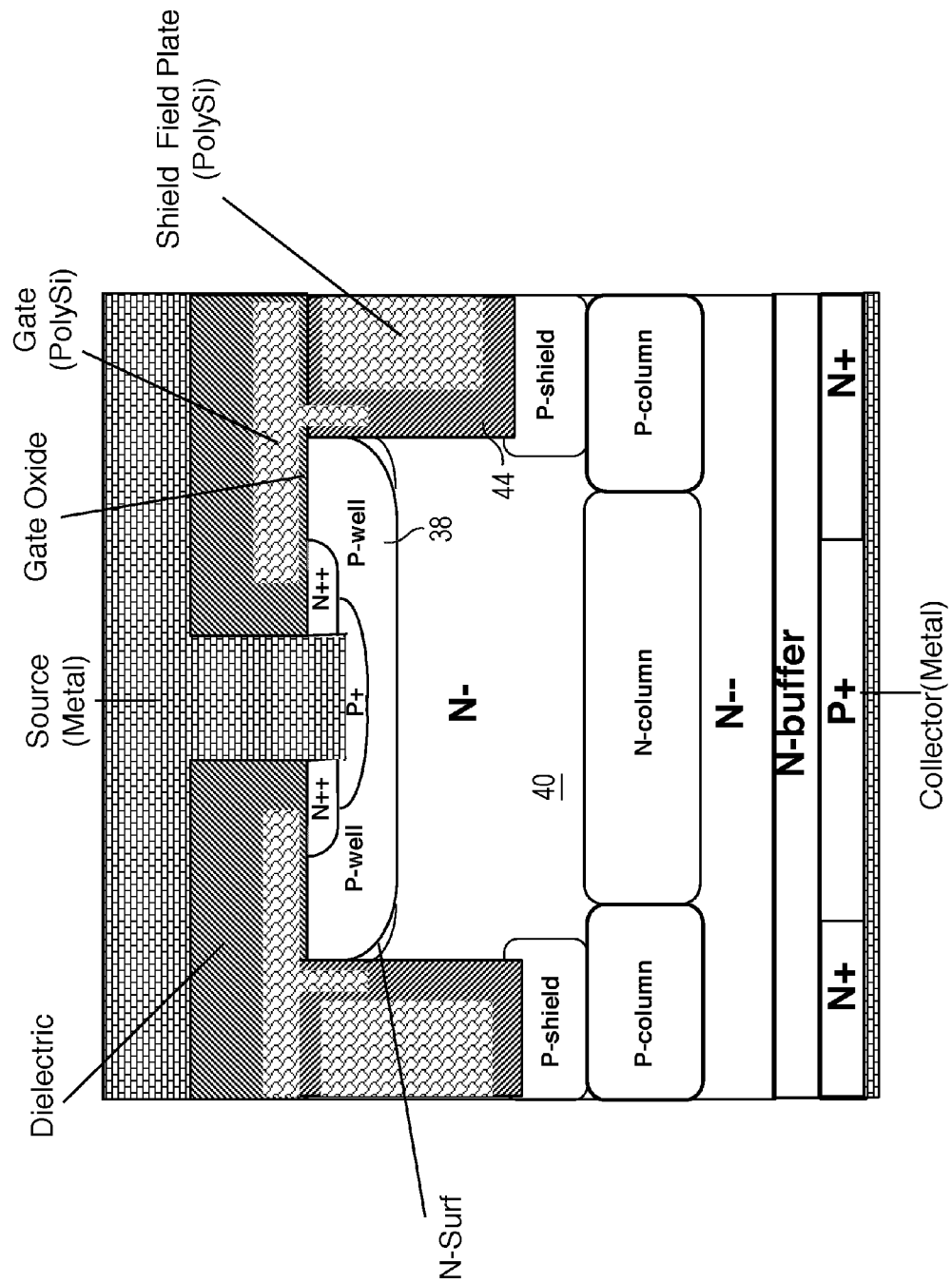
Fig. 9C Device Structure - IGBT

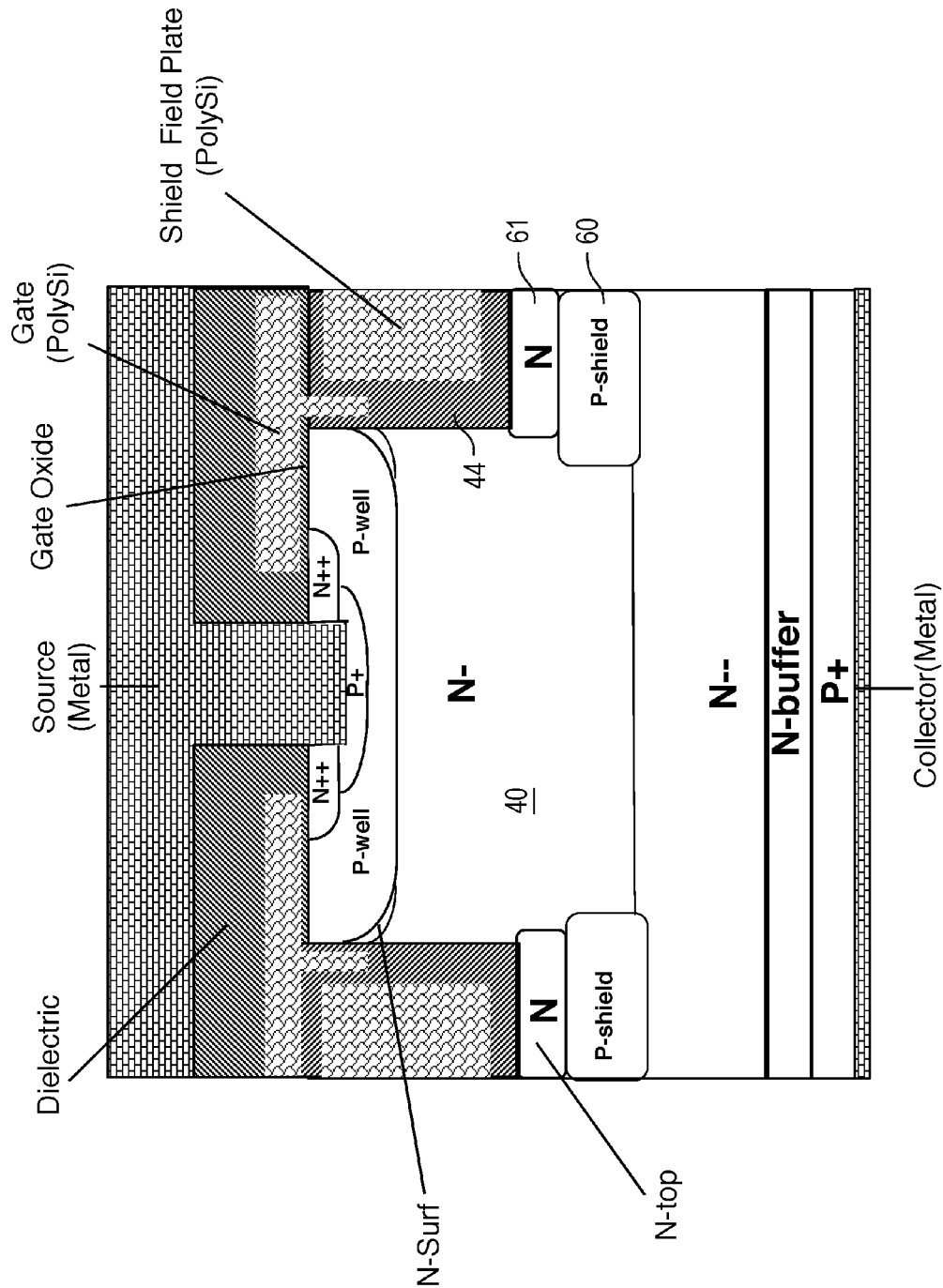
Fig. 9D Device Structure - IGBT

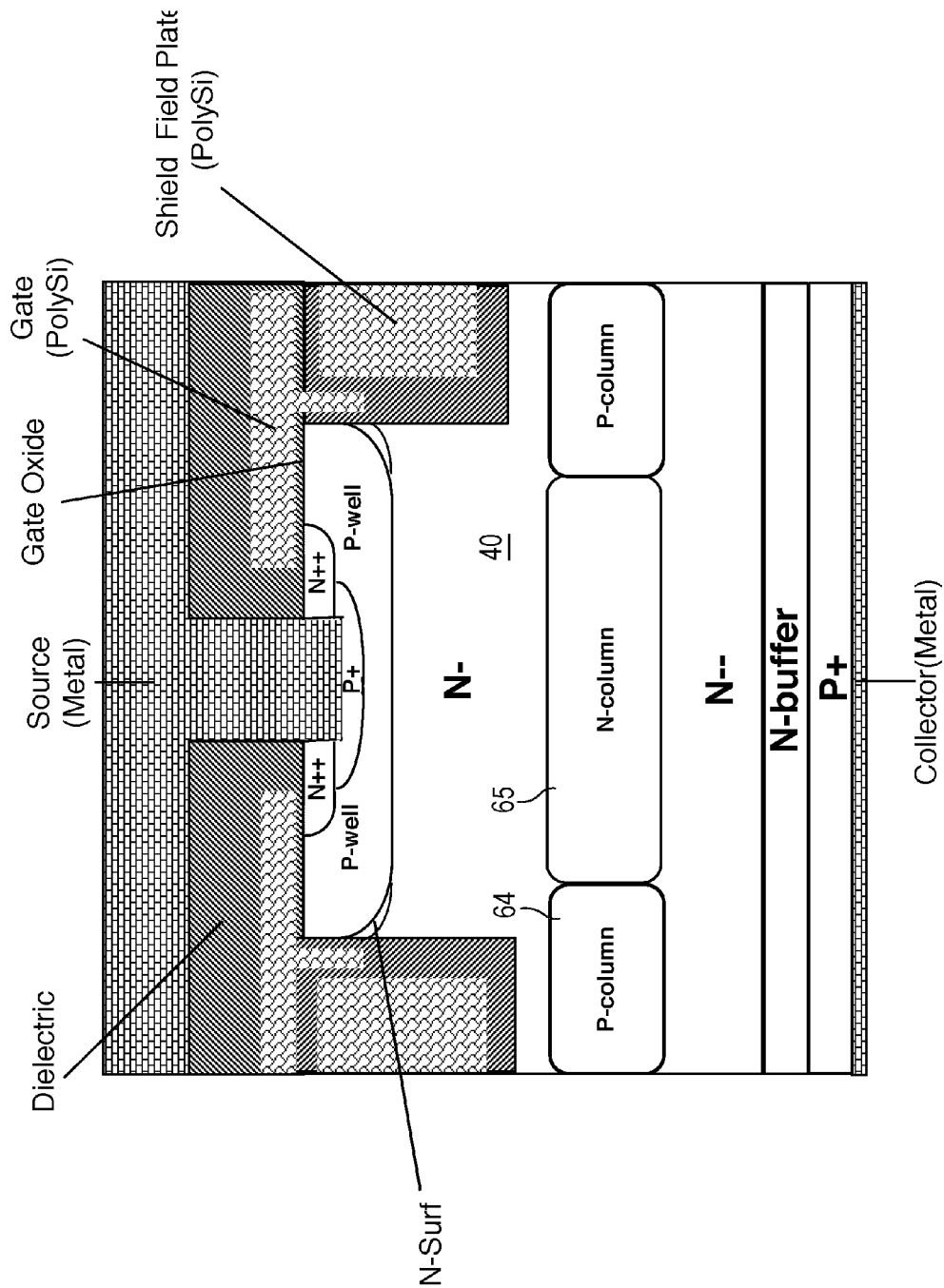
Fig. 9E Device Structure - IGBT

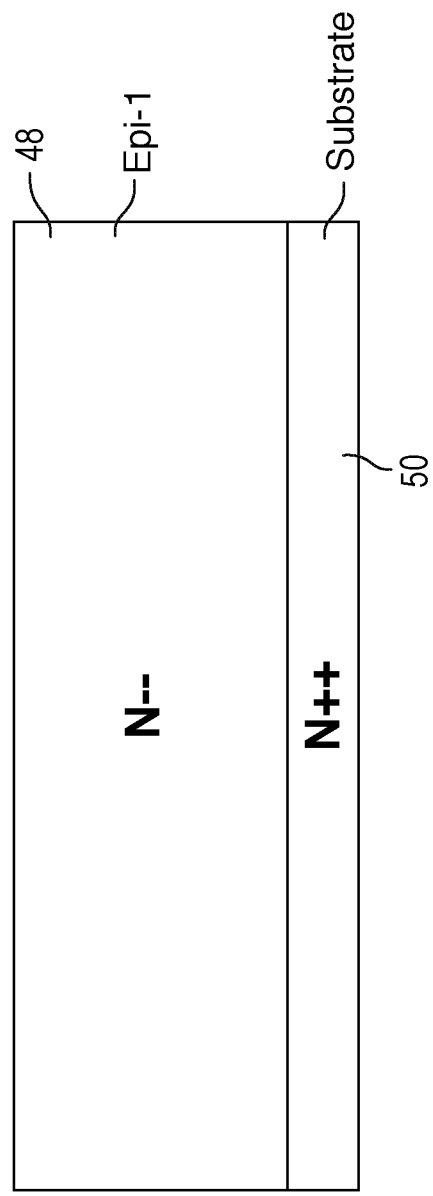
Fig. 10A Substrate Wafer & Epi-1 Growth

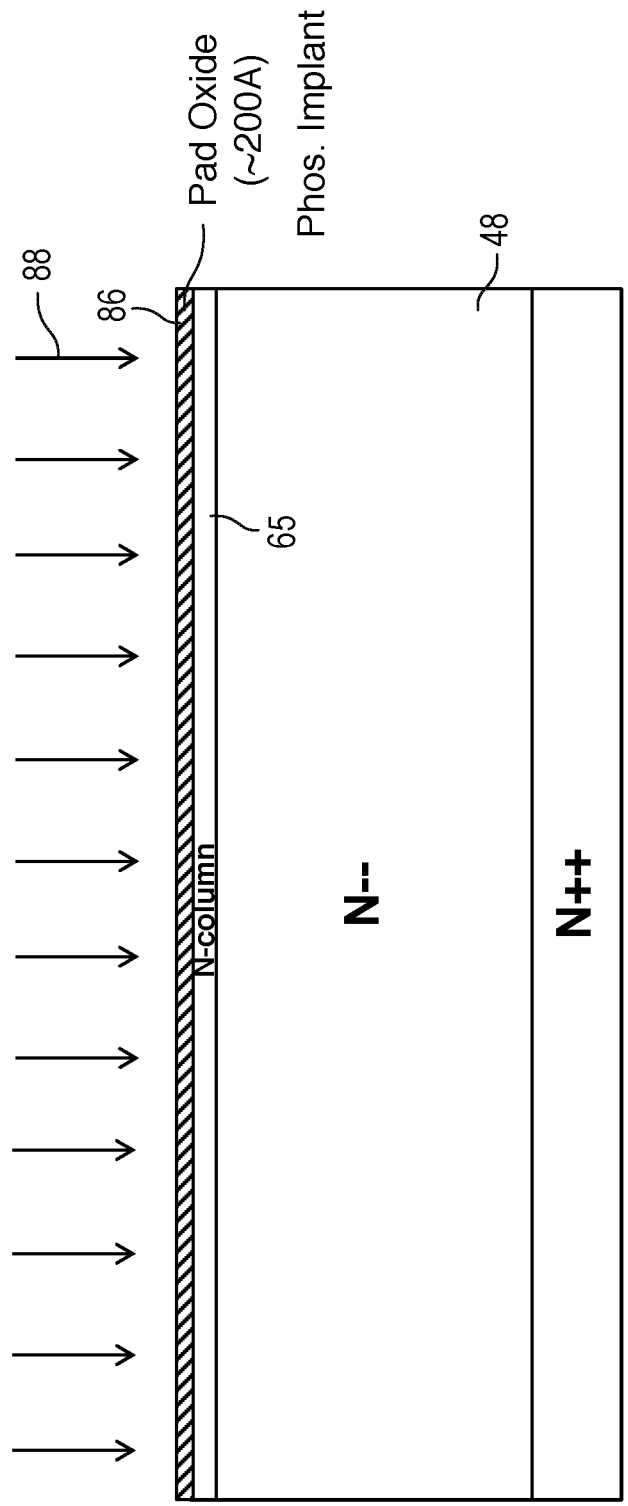
Fig. 10B Thermal Pad Oxidation & N-column Phos. Blanket Implant

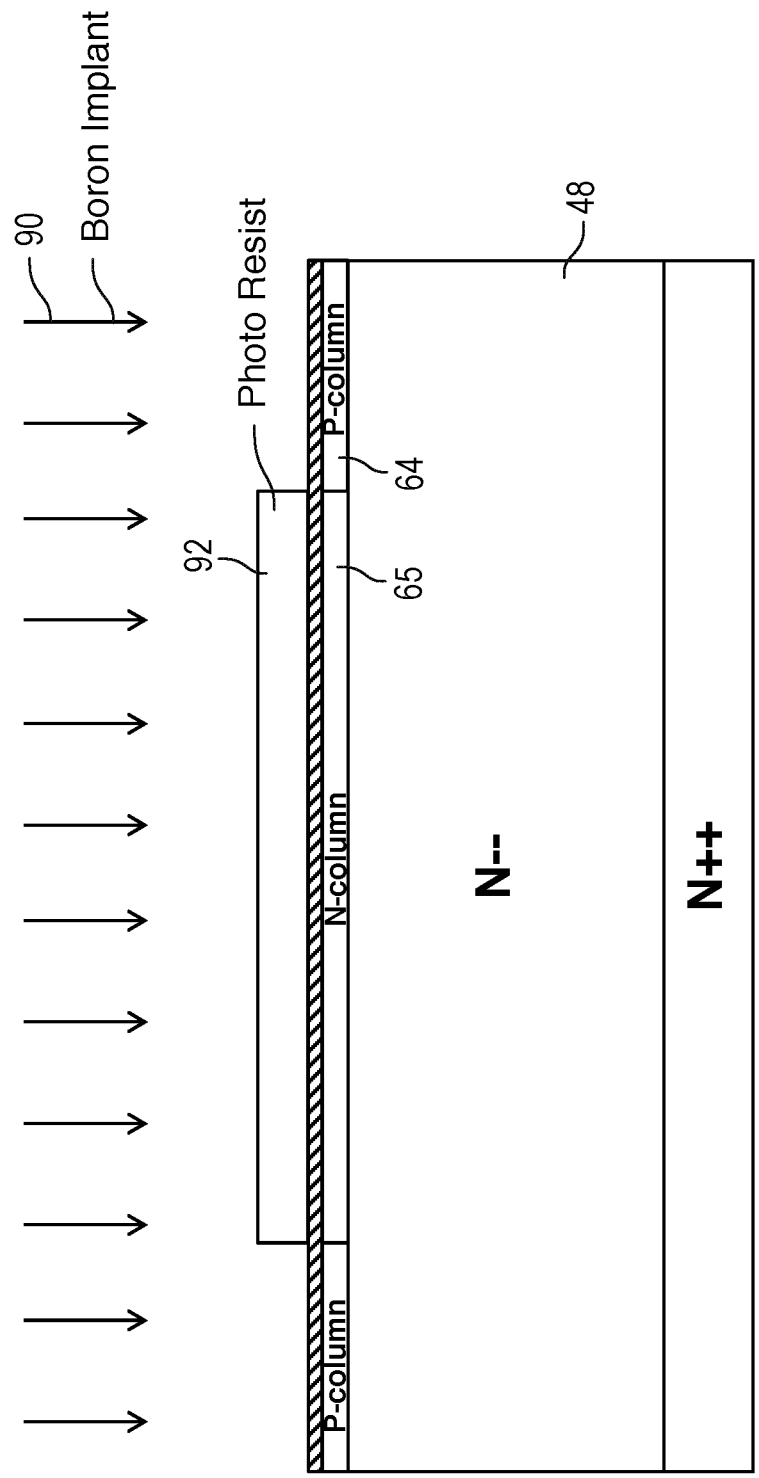
Fig. 10C P-Column Photo & Boron Implant

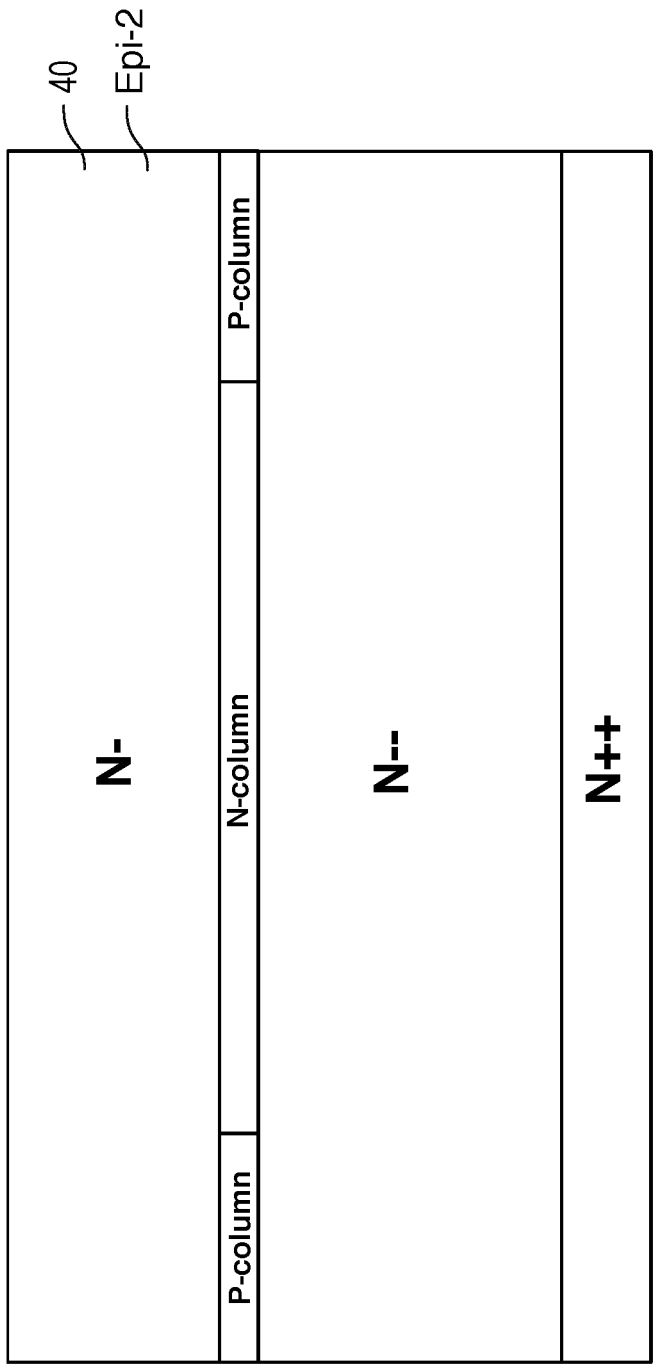
Fig. 10D PR Strip, Pad Oxide Strip & Epi-2 Growth

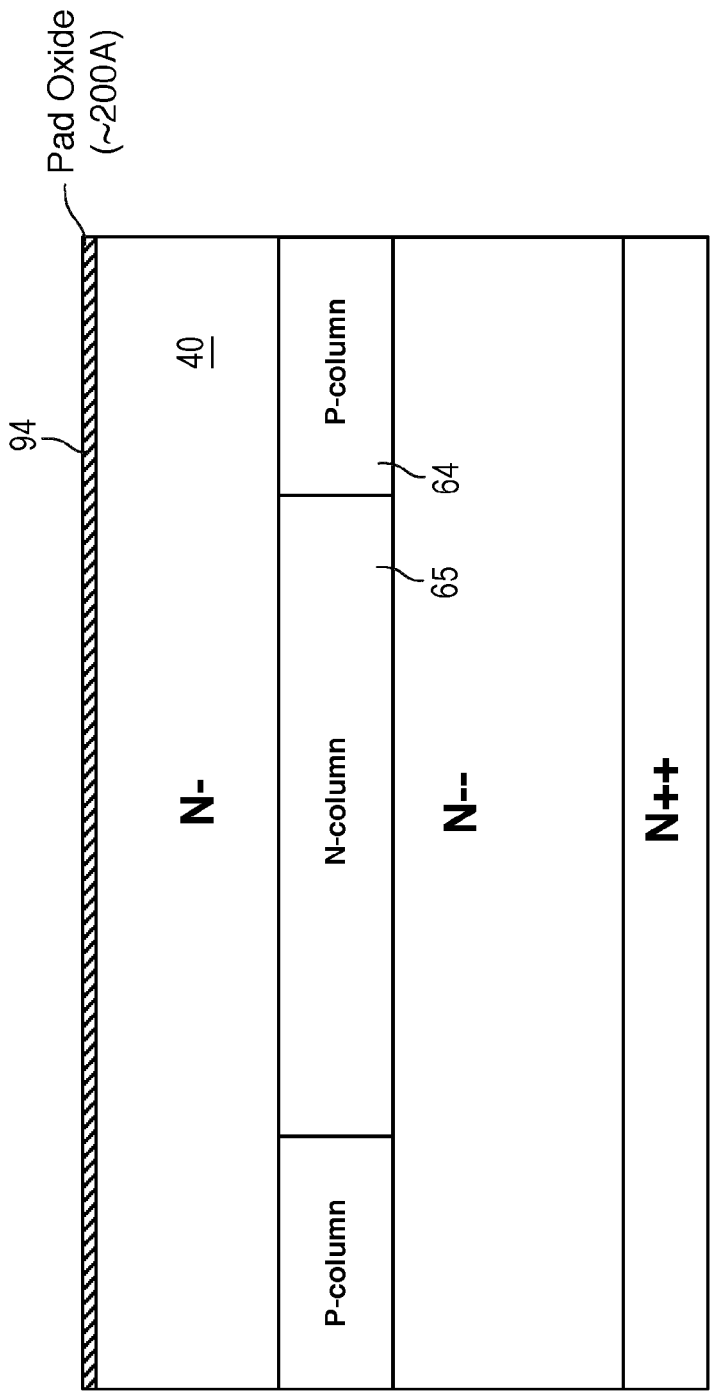
Fig. 10E Thermal Pad Oxidation & Columns Drive Up and Down

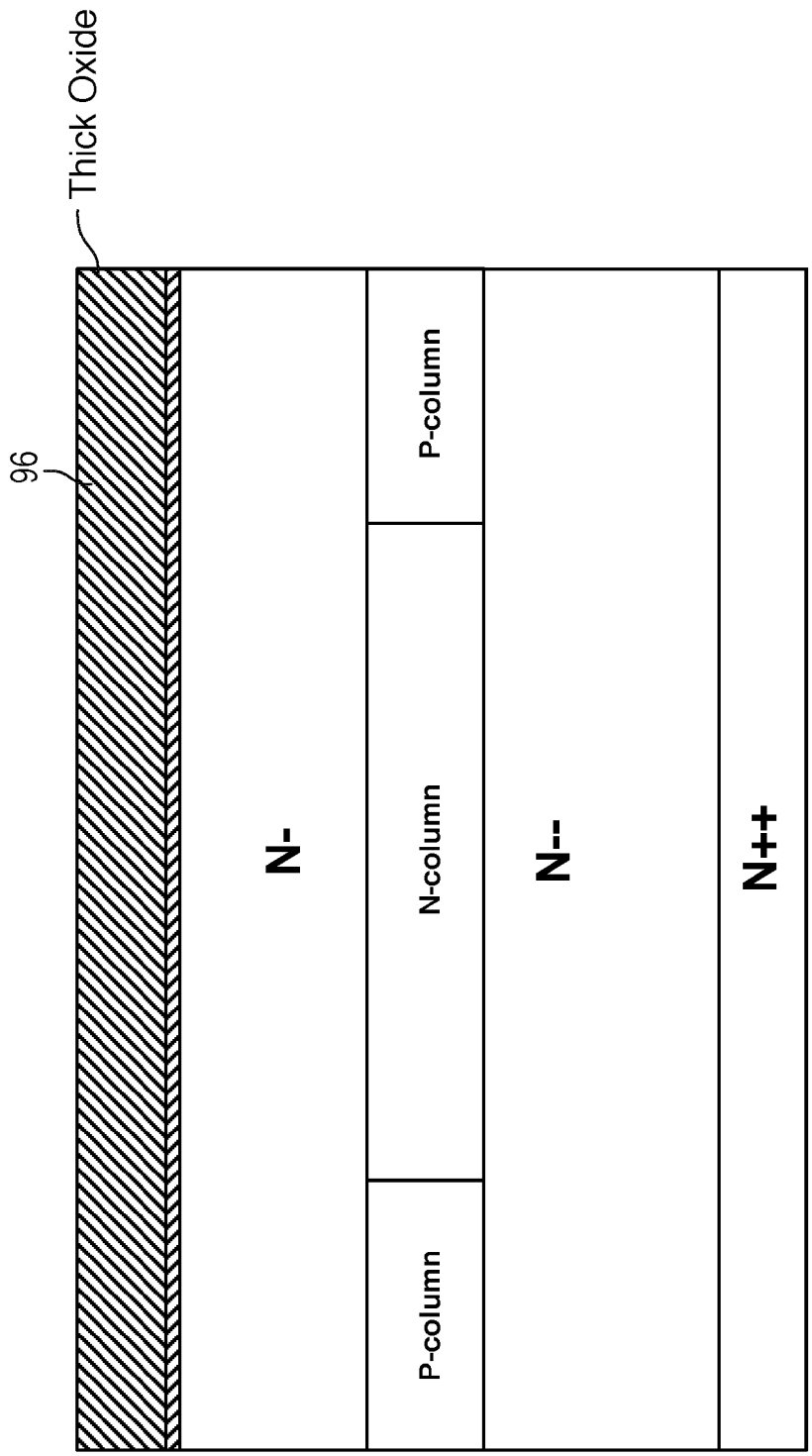
Fig. 10F Thick Oxide Deposition for the Hard Mask

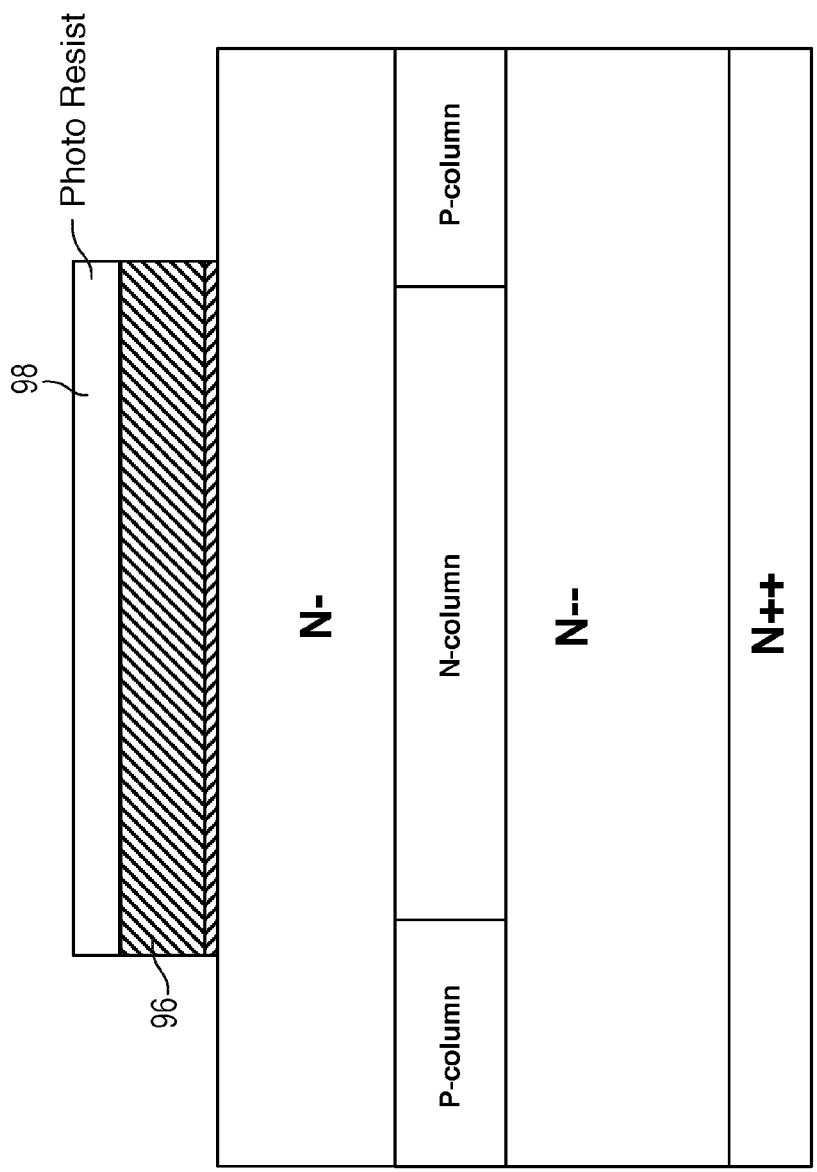
Fig. 10G Thrench Photo & Oxide Dry Etching Forming the Hard Mask

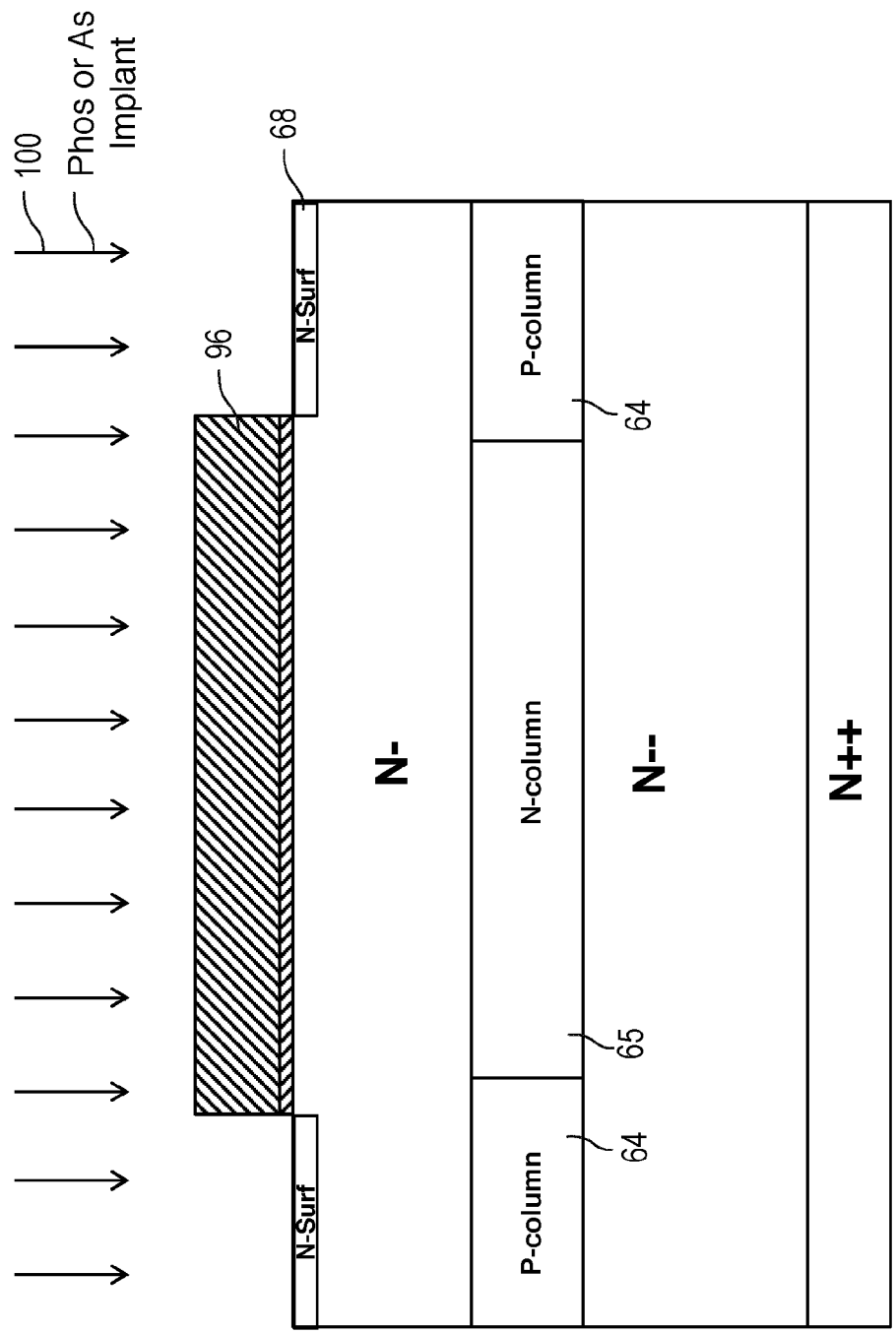
Fig. 10H Optional Phosphorus or Arsenic Implant

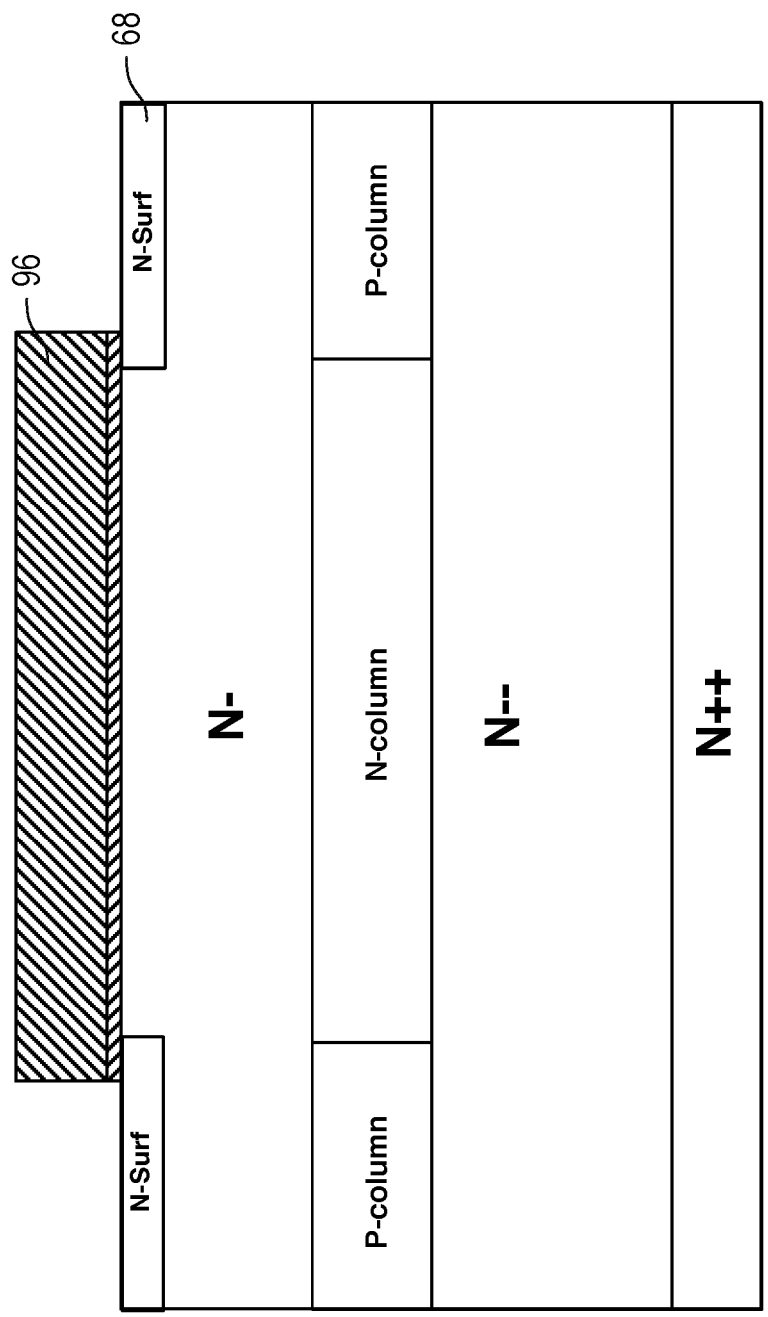
Fig. 10I Optional N-Surface

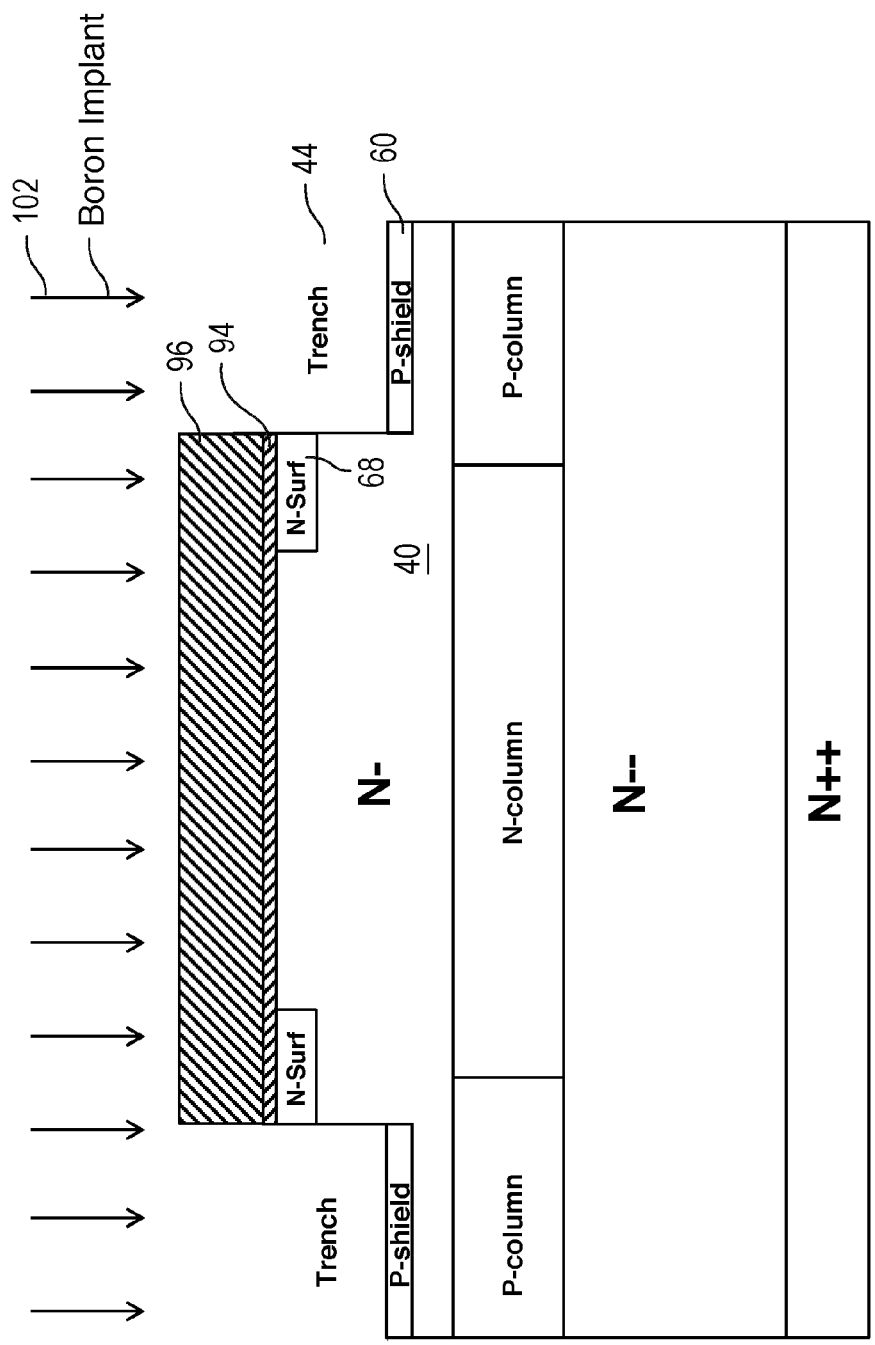
Fig. 10J PR Strip, Trench Silicon Dry Etching & P-Shield Boron Implant

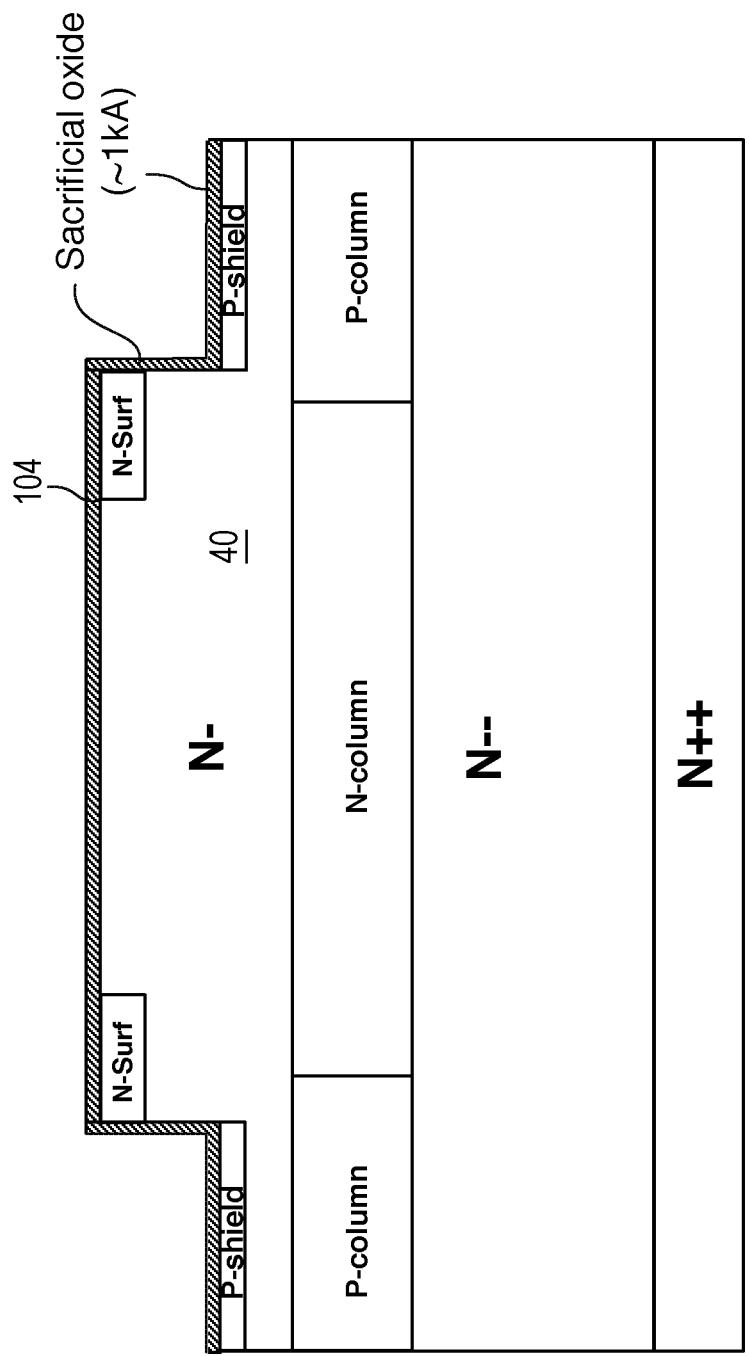
Fig. 10K Hard Mask Strip & Thermal Sacrificial Oxidation

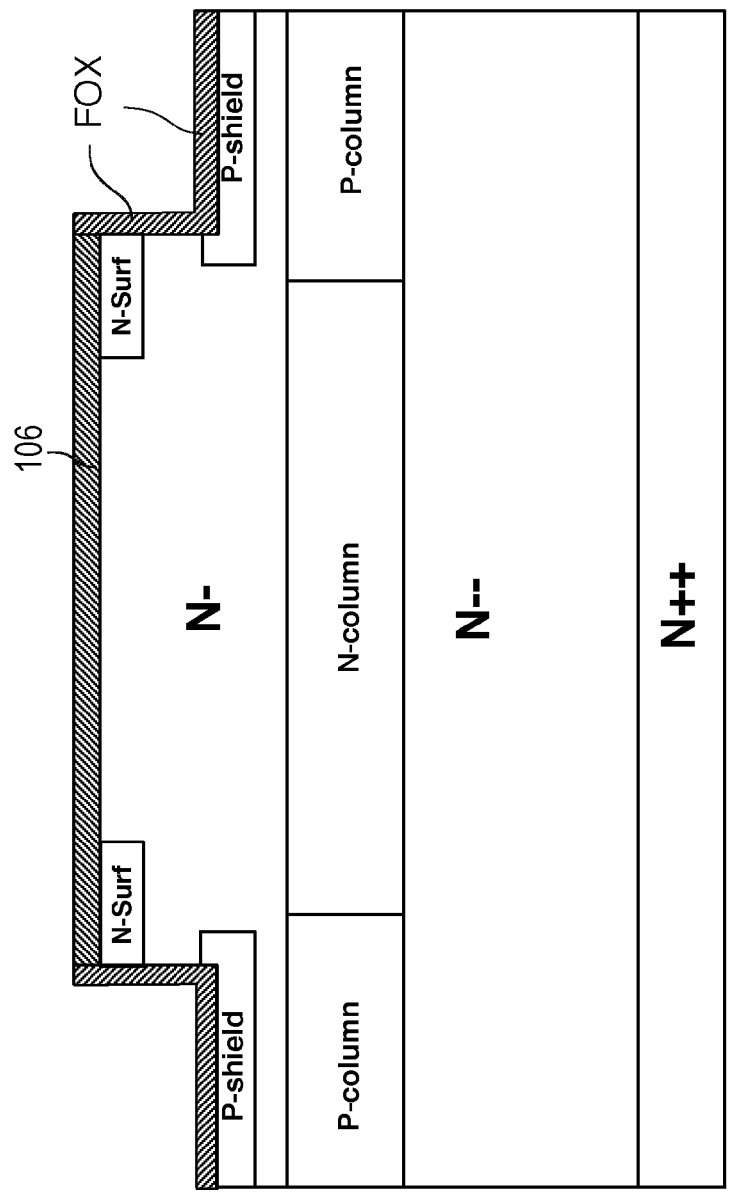
Fig. 10L Sacrificial Oxide Strip & Field Oxidation (FOX)

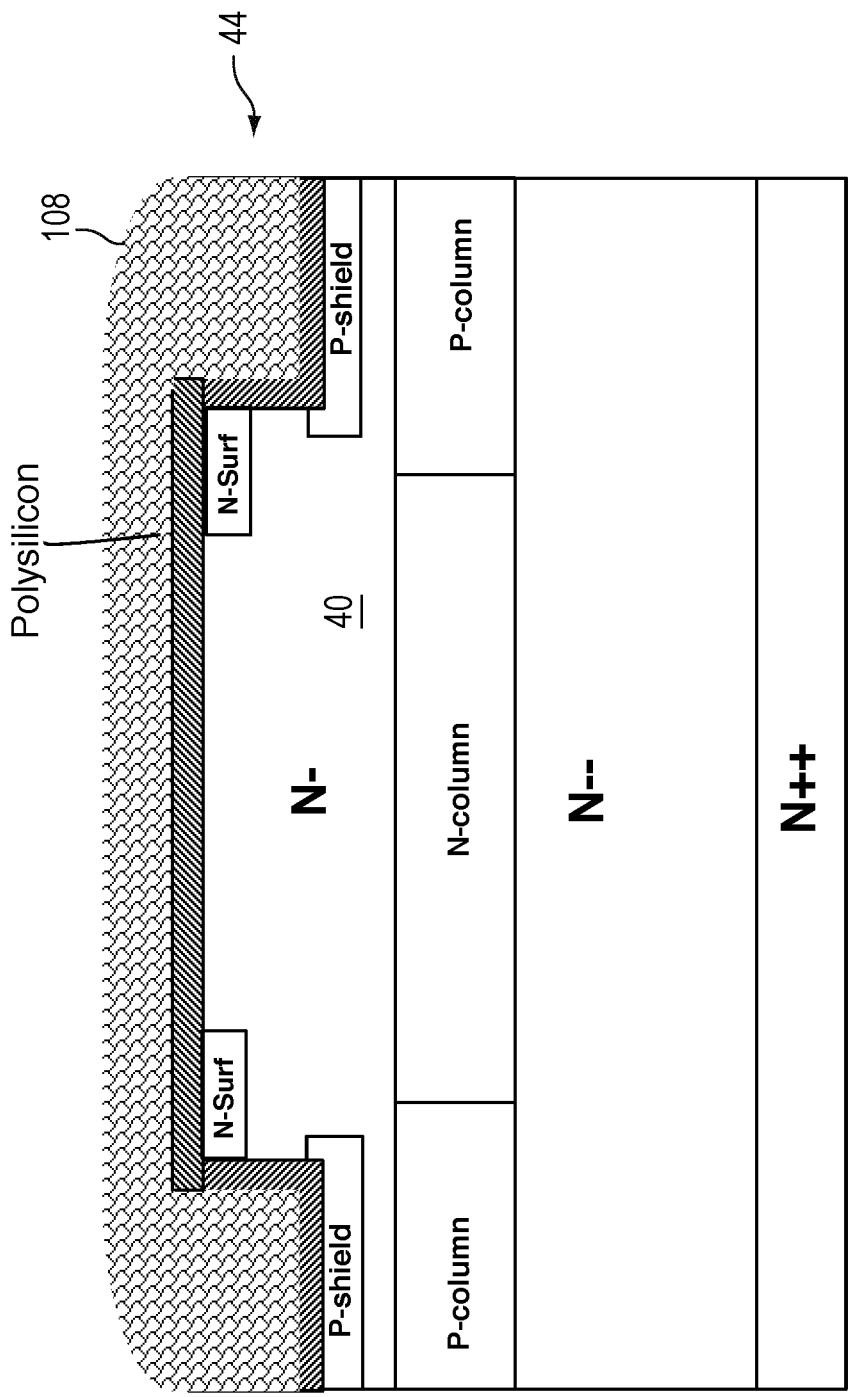
Fig. 10M Polysilicon Deposition

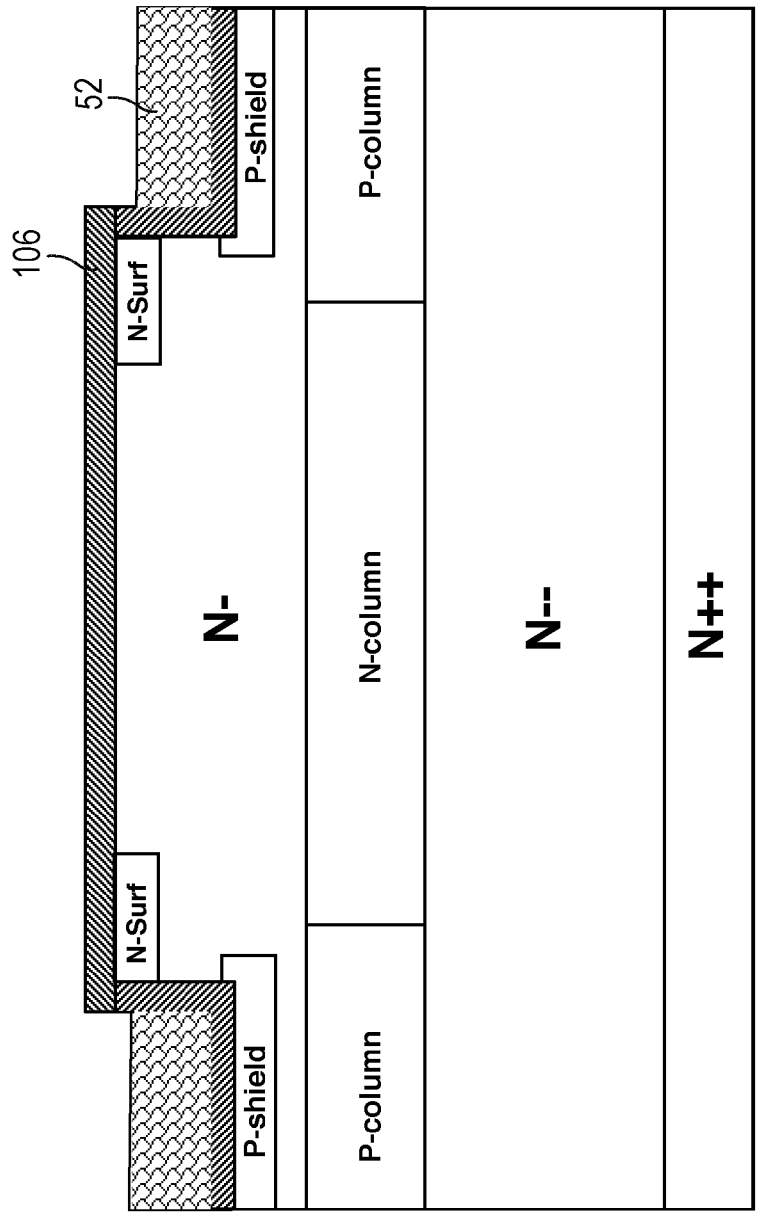
Fig. 10N Polysilicon Etch Back By Dry Process

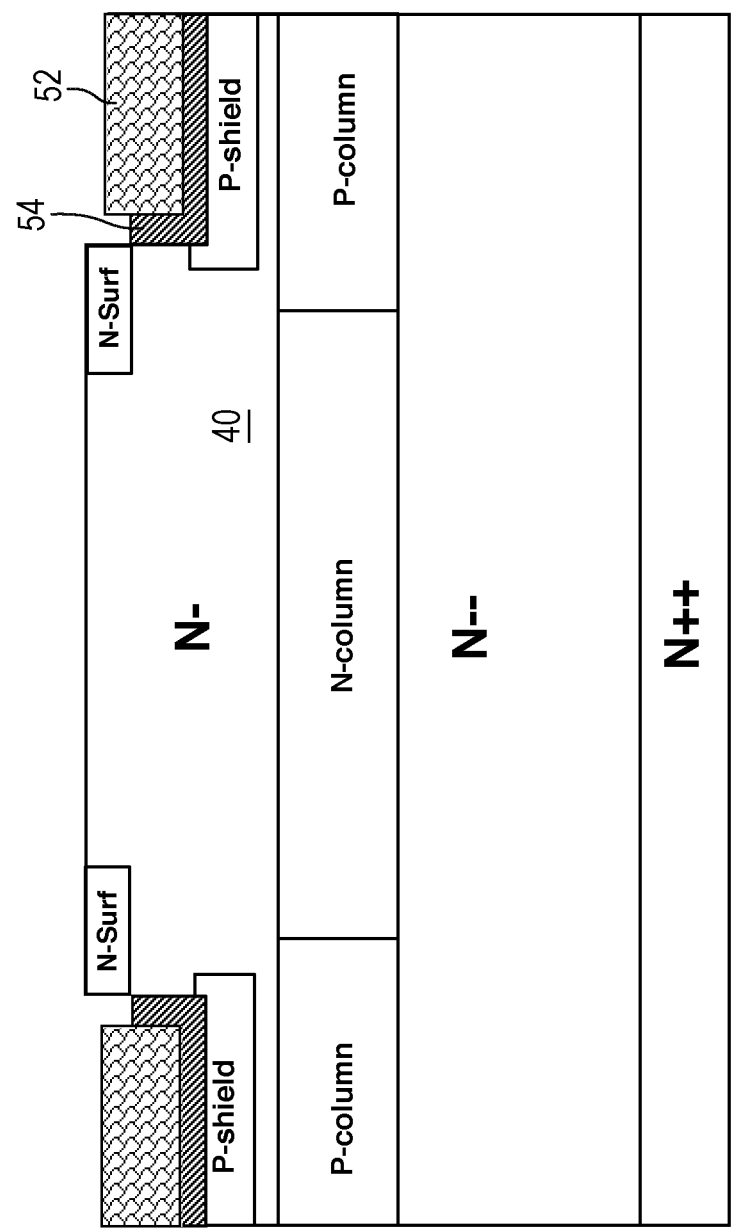
Fig. 10O Field Oxide (FOX) Etch

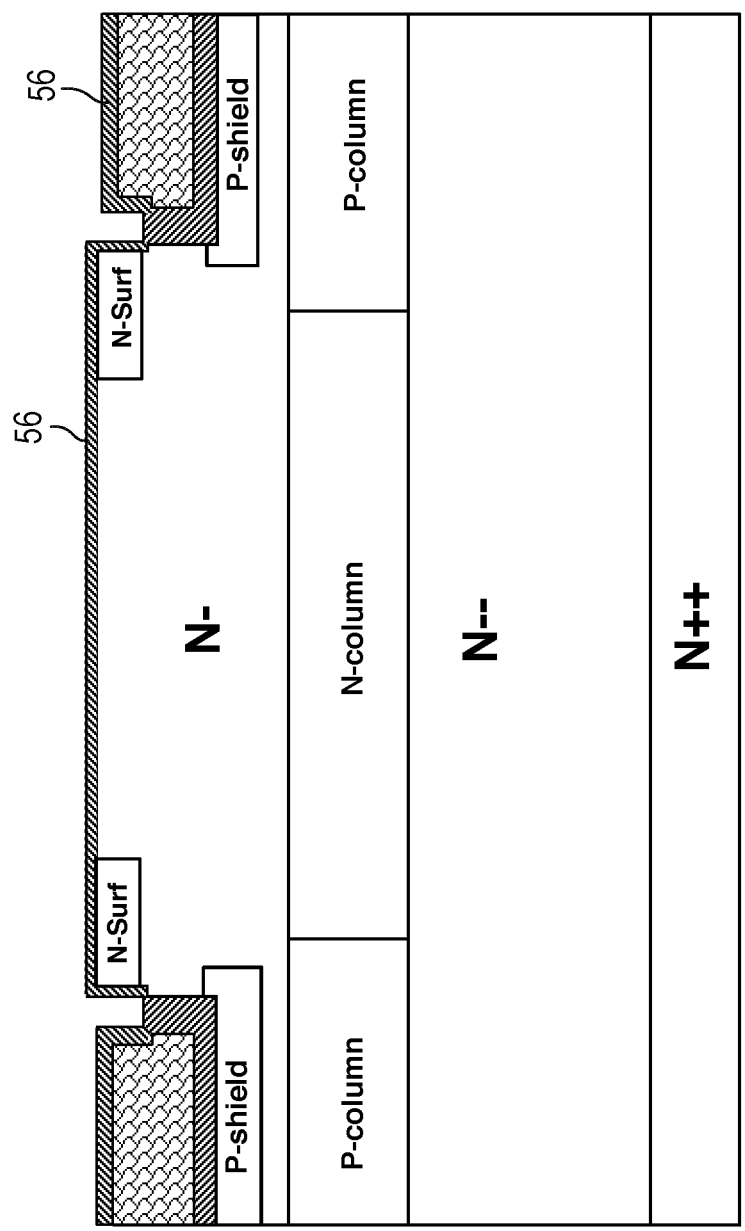
Fig. 10P Gate Oxide (GOX) Grown

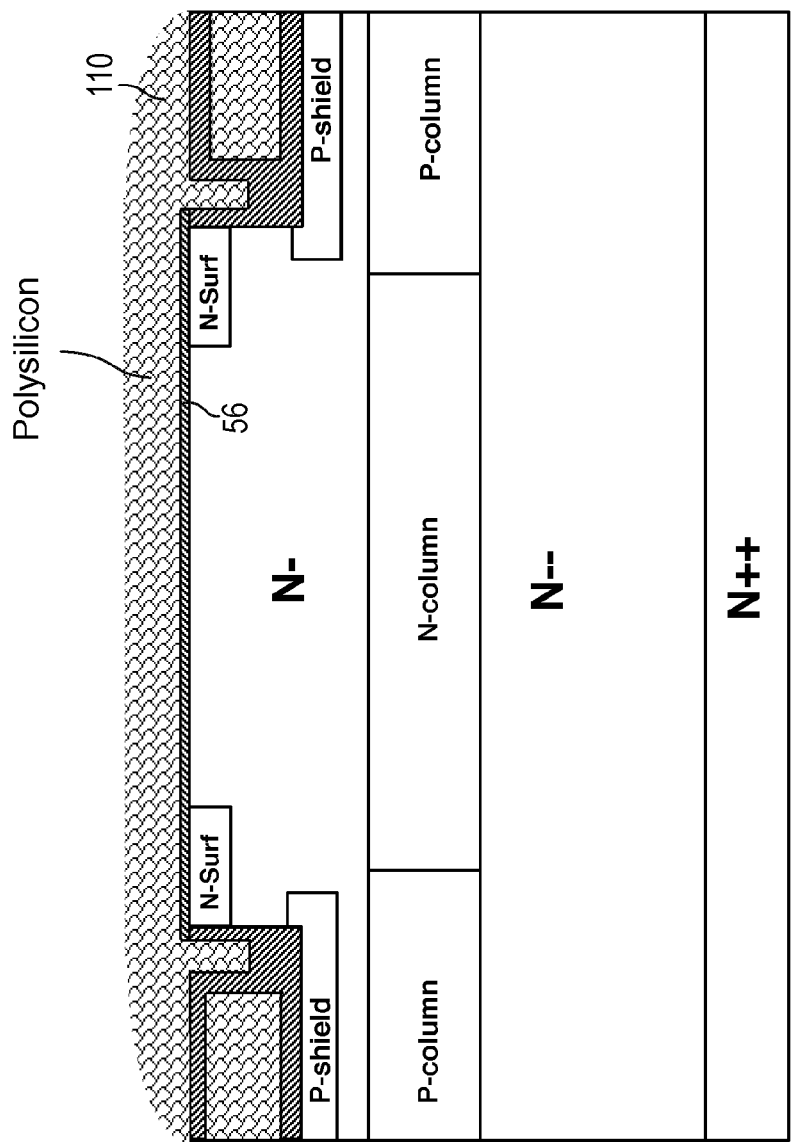
Fig. 10Q Polysilicon Deposition

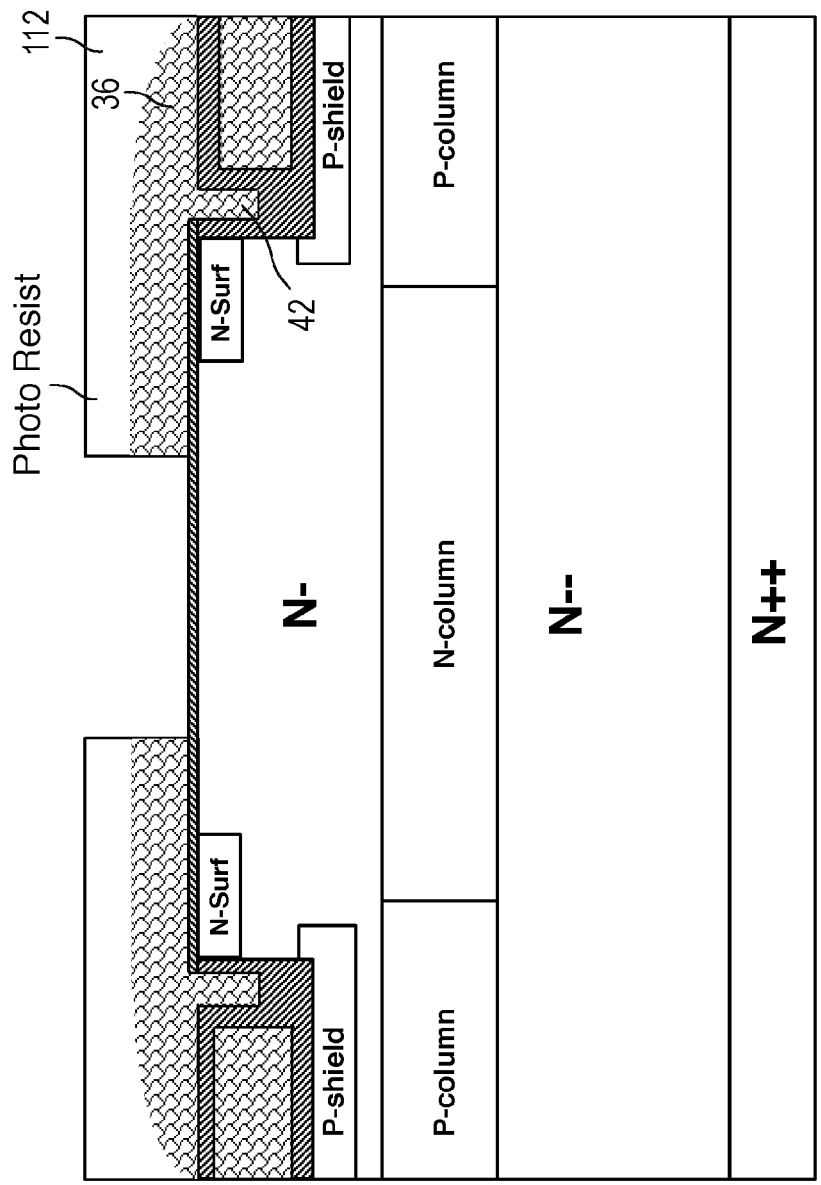
Fig. 10R Polysilicon Photo & Polysilicon Dry Etching

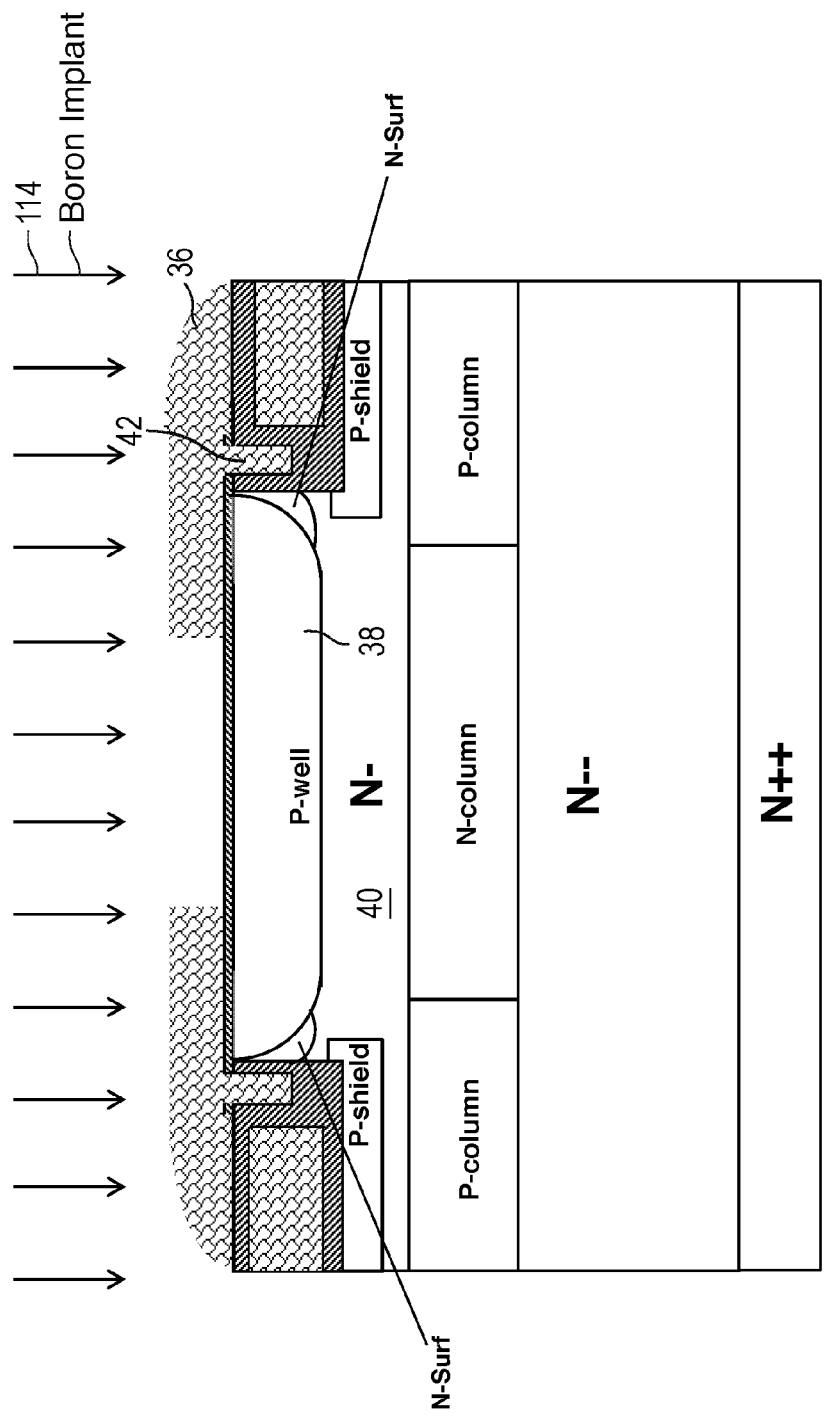
Fig. 10S PR Strip, Well Implant & Well Drive-in

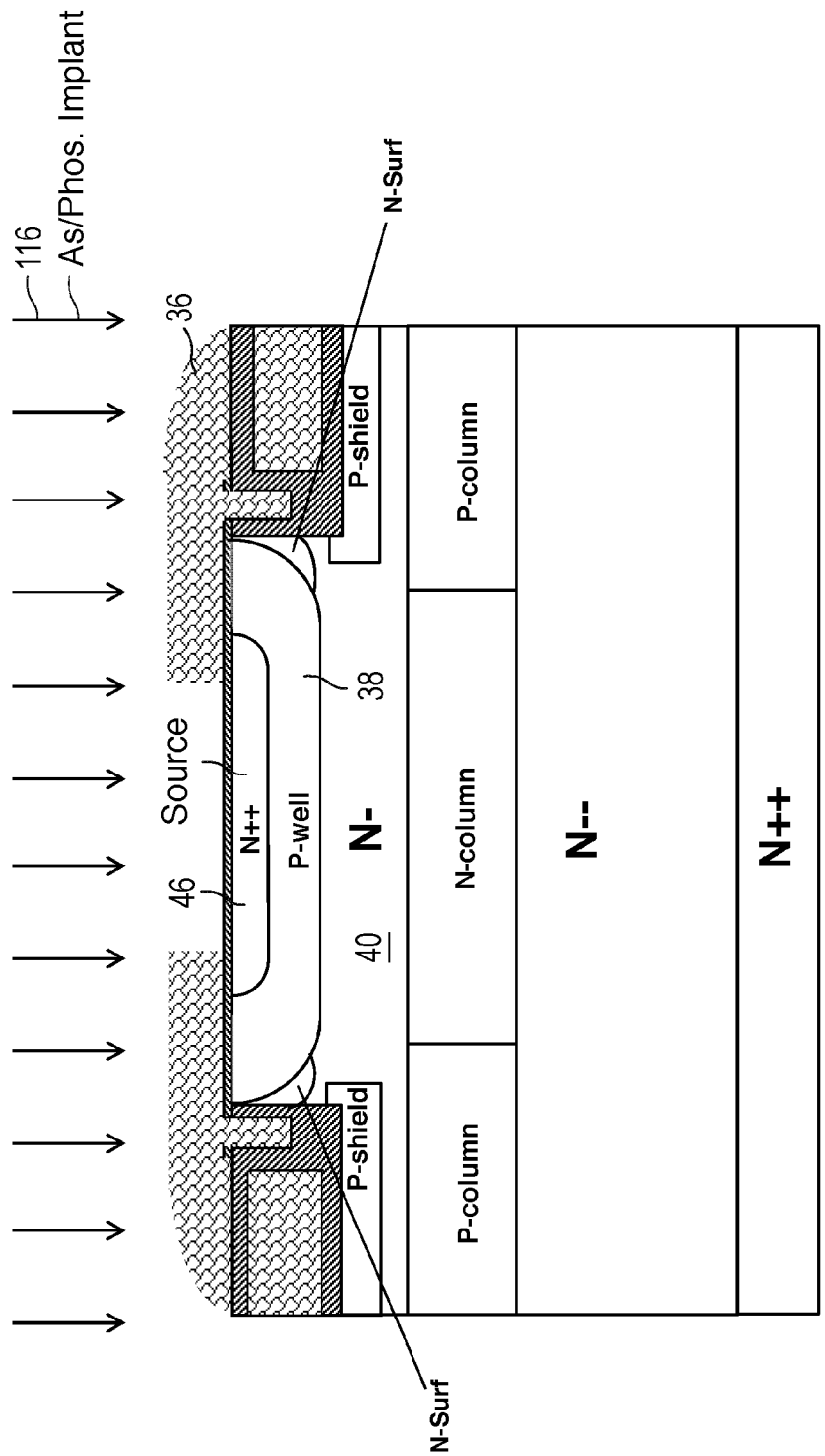
Fig. 10T Source As/p31 Implant & Source Drive-in

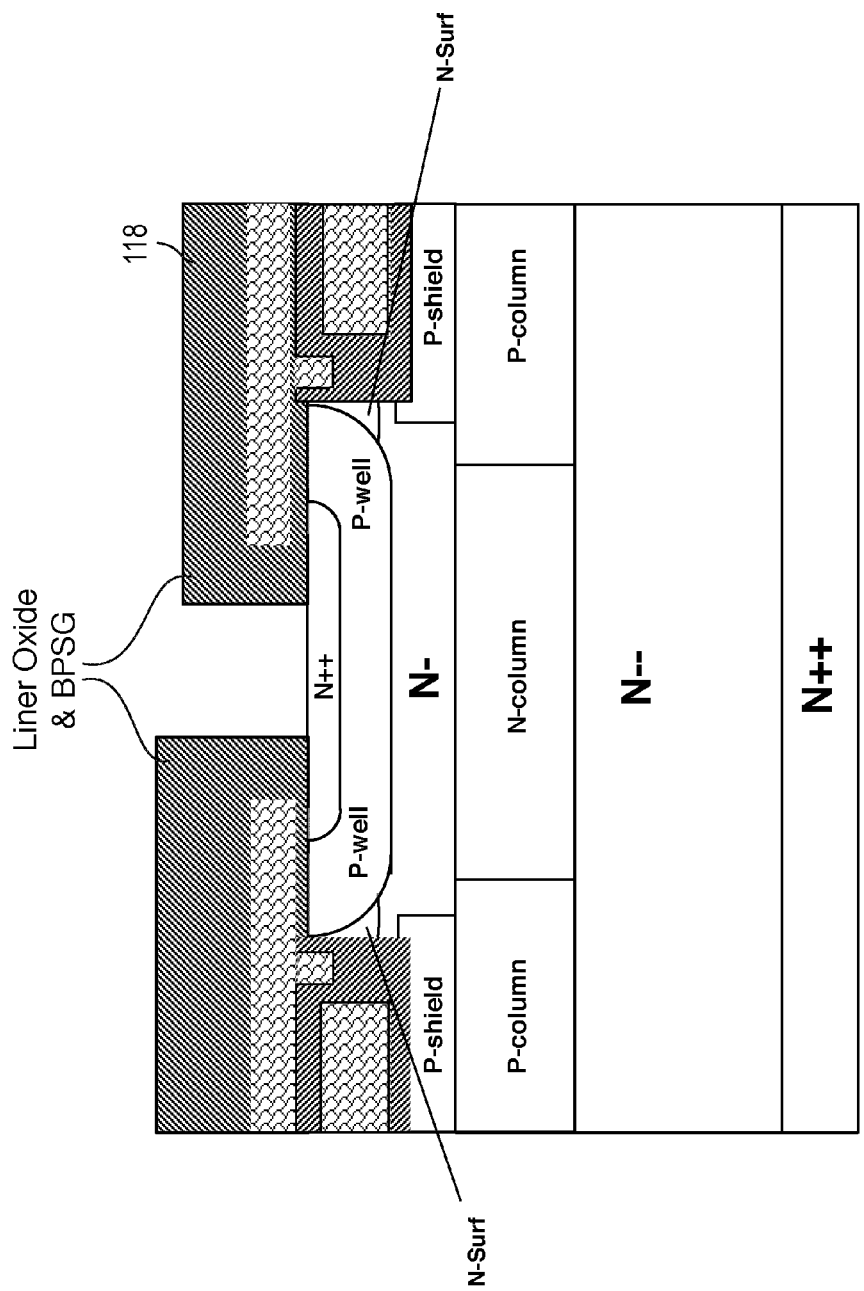
Fig. 10U Liner Oxide Deposition, BPSG Deposition & Densification, Contact Photo, Contact Etch, PR Strip

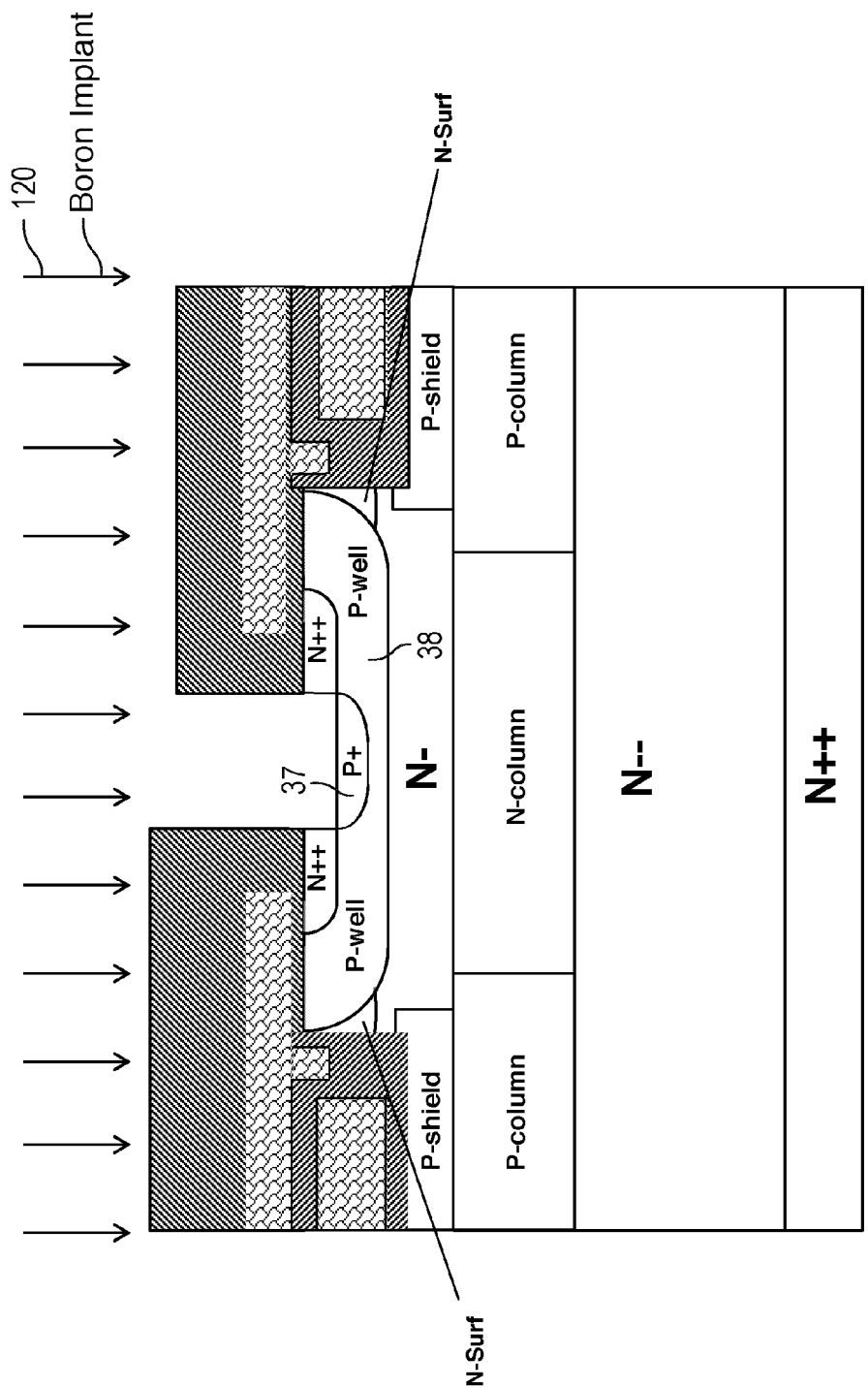
Fig. 10V Silicon Recess Etch, Contact Boron Implant & Anneal

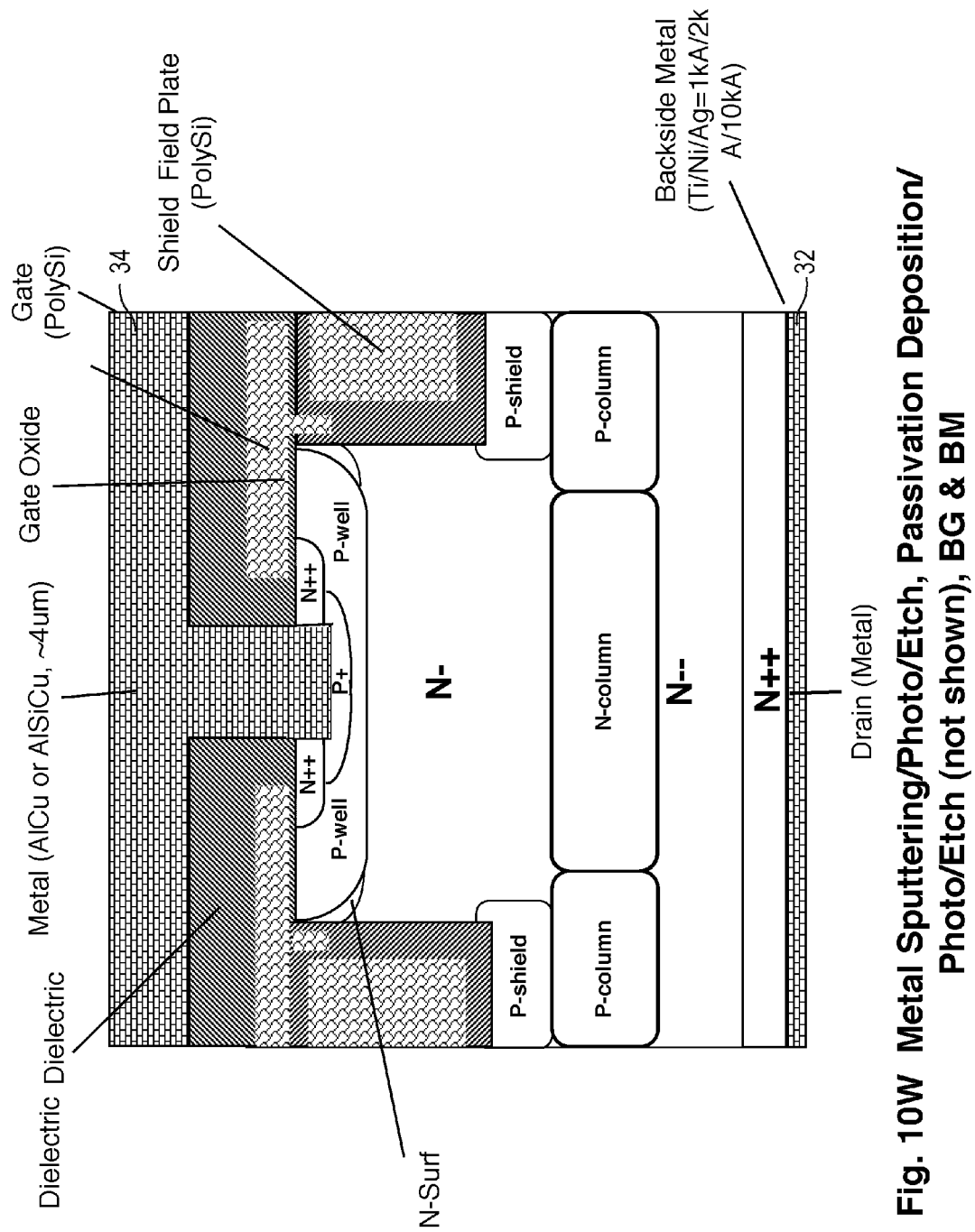
Fig. 10W Metal Sputtering/Photo/Etch, Passivation Deposition/Photo/Etch (not shown), BG & BM

VERTICAL POWER MOSFET HAVING PLANAR CHANNEL AND ITS METHOD OF FABRICATION

CROSS REFERENCE TO RELATED APPLICATIONS

This application is a continuation-in-part of U.S. application Ser. No. 14/338,303, filed Jul. 22, 2014, and claims priority from U.S. provisional application Ser. No. 61/935,707, filed Feb. 4, 2014, by Jun Zeng et al., and also U.S. provisional application Ser. No. 62/079,796, filed Nov. 14, 2014, by Jun Zeng et al., incorporated herein by reference.

FIELD OF INVENTION

The present invention relates to power MOSFETs and, in particular, to a vertical transistor having a planar DMOS portion and a vertical conduction portion.

BACKGROUND

Vertical MOSFETs are popular as high voltage, high power transistors due to the ability to provide a thick, low dopant concentration drift layer to achieve a high breakdown voltage in the off state. Typically, the MOSFET includes a highly doped N-type substrate, a thick low dopant concentration N-type drift layer, a P-type body layer formed in the drift layer, an N-type source at the top of the body layer, and a gate separated from the channel region by a thin gate oxide. A source electrode is formed on the top surface, and a drain electrode is formed on the bottom surface. When the gate is sufficiently positive with respect to the source, the channel region of the P-type body between the N-type source and the N-type drift layer inverts to create a conductive path between the source and drain.

In the device's off-state, when the gate is shorted to the source or negative, the drift layer depletes, and high breakdown voltages, such as exceeding 600 volts, can be sustained between the source and drain. However, due to the required low doping of the thick drift layer, the on-resistance suffers. Increasing the doping of the drift layer reduces the on-resistance but lowers the breakdown voltage.

FIG. 1 is a cross-sectional view of a conventional planar vertical DMOS transistor cell 10 in an array of cells. Planar DMOS transistors are widely used in numerous power switching applications due to their ruggedness compared to trench MOSFETs. However, the conventional planar DMOS transistors have a higher specific on-resistance (Rsp), which is the product of on-resistance and active area. It is desirable to have DMOS transistors with reduced Rsp and lower input, output, and transfer capacitances (Ciss, Coss, and Crss) or gate charge (Qg) to reduce the transistor's conduction and switching losses.

The important resistance components in the conventional DMOS structure shown in FIG. 1 arise from the voltage drop along the inversion channel 12 and the JFET region 14 next to the P-well 16 region. When a sufficiently positive voltage is applied to the gate 17, the gate 17 inverts the channel 12. The source electrode 18 contacts the N++ source regions 20 and the P-well 16, via the P+ contact region 22. A dielectric 24 insulates the gate 17 and source electrode 18. When the gate 17 inverts the channel 12, a horizontal current path is formed between the source regions 20 and the low-dopant density N-- drift region 24, and then the current flows vertically through the N-- drift region 24, the N++ substrate 26, and the drain electrode 28. The N-- drift region 24 needs to be relatively thick to have a high breakdown voltage, but the low dopant density and thickness of the N-- drift region 24 increases on-resistance.

The JFET region 14 restricts the current flow, and it is important to minimize the JFET resistance component by using a sufficiently wide P-well spacing (2Y). However, increasing the spacing Y results in an increase in cell pitch and the active area. Therefore, this tradeoff results in a limited improvement in Rsp.

What is needed is a planar, vertical DMOS transistor with a good Rsp and with a smaller surface area, compared to FIG. 1, for increasing cell density. Further, the transistor should have a high breakdown voltage and high switching speed.

SUMMARY

New DMOS transistor structures with reduced Rsp and gate charge Qg, while having a high breakdown voltage and high switching speed, are disclosed.

A MOSFET is formed having a planar channel region, for a lateral current flow, and a vertical conduction path for a vertical current flow. In one embodiment, a P-well (a body region) is formed in an N-type layer, where there is a trench formed in the N-type layer, deeper than the P-well, resulting in vertical sidewalls of the N-type layer. The N-type layer is more highly doped than an N-type drift layer below the N-type layer. The N-type drift layer can be made thinner than the drift layer in conventional vertical MOSFETs while achieving the same breakdown voltage.

A first portion of the gate overlies the top planar channel region, and a second portion of the gate extends vertically into the trench next to the vertical sidewall of the N-type layer.

The MOSFET includes a vertical shield field plate formed by a conductive material, such as doped polysilicon, filling the trench and insulated from the sidewalls by a dielectric material, such as oxide. The field plate is deeper than the P-well to provide an effective electric field reduction in the N-type layer by laterally depleting the N-type layer in the off state. The field plate may be connected to the source, or to the gate, or floating.

Both the vertical portion of the gate and the field plate help to deplete the N-layer laterally when the MOSFET is off to increase the breakdown voltage. The vertical portion of the gate also accumulates electrons along the N-type layer sidewalls across from the P-well when the MOSFET is on to lower the on-resistance. Therefore, since the JFET region (between the P-well and trench) can be made narrower without unduly constraining the current path, the cells may be smaller. Also, since the N-type layer can be relatively highly doped without reducing the breakdown voltage, the on-resistance is further lowered. The combined effect of the vertical portion of the gate, the field plate, the relatively heavy doped N-type layer, and a reduced thickness N-type drift layer provides an increased breakdown voltage, lower on-resistance, and a lower cost per die (since the lower on-resistance per unit area allows each die to be made smaller). The structure allows a higher density of cells (including strips) due to the lower on-resistance per unit area, enabling a greater current handling capability per unit area.

Since the low-dopant-concentration drift region between the N-type layer and the drain electrode can be made thinner without reducing the breakdown voltage, the on-resistance per unit area (specific on-resistance Ron*Area) is lower than that of the conventional vertical power MOSFET.

To reduce the gate-drain capacitance for faster switching, the vertical field plate can be connected to the source electrode (rather than to the gate), and the horizontal gate portion does not extend over the field plate.

In one embodiment, the gate, the vertical field plate, and the N-type layer doping and thickness are chosen such that the N-type layer is fully depleted at the onset of breakdown.

In one application, a load is coupled between the bottom drain electrode and a positive voltage supply, and the source electrode on the top surface of the transistor is connected to ground. When the gate is sufficiently biased positive with respect to the source electrode, current is supplied to the load.

If the MOSFET is used with an alternating voltage, the MOSFET's PN diode will conduct when the drain is more negative than the source. When the polarity reverses and the diode is reverse biased, there is a stored charge that must be removed prior to the MOSFET being fully turned off after the gate is biased to an off state. Since there is a higher dopant level in the N-type layer, this stored charge is removed faster, enabling a faster switching time. In other words, the MOSFET structure lowers the recovery time after the PN diode is biased on.

IGBT structures are also formed by using P+ substrate.

Other embodiments are described.

BRIEF DESCRIPTION OF DRAWINGS

FIG. 1 is a cross-sectional view of a conventional planar vertical DMOS transistor cell in an array of identical contiguous cells.

FIG. 2A is a cross-sectional view of a single vertical DMOS transistor cell (which may be a portion of a strip) in an array of identical contiguous cells connected in parallel, where the gate conductor includes a vertical portion surrounding a portion of a vertical side wall of a trench for improved on-resistance, and wherein a vertical shield field plate is also in the trench for increasing breakdown voltage, in accordance with one embodiment of the invention.

FIGS. 2B-7C and 9A-10W are also cross-sectional views of a single DMOS transistor cell in an array of identical contiguous cells connected in parallel, in accordance with other embodiments of the invention.

FIG. 2B illustrates the use of a P-shield region below the trench for increasing breakdown voltage.

FIG. 2C illustrates the use of relatively highly doped P and N columns for lowering on-resistance.

FIG. 2D illustrates the use of enhanced N-type surface regions (N-surf) adjacent the P-well for lowering on-resistance.

FIG. 2E illustrates the use of enhanced N-type regions (N-Top) between the trench bottom and P-Shield region for improving turn-off switching time.

FIG. 2F illustrates the use of relatively highly doped P and N columns without P-Shield region for lowering on-resistance and turn-off switching time.

FIG. 3A illustrates the P-well extending to the trench for improved ruggedness and to reduce the size of each cell, where the vertical portion of the gate inverts the P-well adjacent to the trench.

FIG. 3B illustrates the use of enhanced N-type surface regions (N-surf) for lowering on-resistance.

FIG. 3C illustrates the use of a P-shield region below the trench for increasing breakdown voltage.

FIG. 3D illustrates the use of relatively highly doped P and N columns for lowering on-resistance.

FIG. 3E illustrates the use of a deep P+ region for improving ruggedness by reducing the effects of a parasitic NPN bipolar transistor.

FIG. 3F illustrates the use of multiple layers of P and N columns to reduce on-resistance.

FIG. 3G illustrates the use of enhanced N-type regions (N-Top) between the trench bottom and P-Shield region for improving turn-off switching time.

FIG. 3H illustrates the use of relatively highly doped P and N columns without P-Shield region for lowering on-resistance and turn-off switching time.

FIG. 4A illustrates the gate not overlapping the vertical shield field plate to reduce gate-drain capacitance and increase switching speed.

FIG. 4B illustrates the vertical shield field plate connected to the source metal along a different cross-section.

FIG. 4C illustrates the use of P-type regions (P-Connection) between P-Well and P-Shield regions for improving turn-off switching time.

FIG. 5A illustrates the vertical shield field plate being an extension of the gate for lowering on-resistance, where the gate oxide thickness is stepped for optimal on-resistance and breakdown performance.

FIG. 5B illustrates the use of P and N columns for lowering on-resistance.

FIG. 6A illustrates the P-well adjoining the trench sidewall for improved ruggedness.

FIG. 6B illustrates the use of enhanced N-type surface regions for lowering on-resistance.

FIG. 6C illustrates the gate not overlapping the vertical shield field plate to reduce gate-drain capacitance and increase switching speed.

FIG. 7A illustrates equi-potential contours in a simulation of the transistor of FIG. 2C at the onset of breakdown. A central cell is shown along with portions of adjacent cells. The P-shield and P-column doping transitions are outlined.

FIG. 7B illustrates equi-potential contours in a simulation of the transistor of FIG. 6A at the onset of breakdown, where the P-well extends to the trench to improve ruggedness.

FIG. 7C illustrates equi-potential contours in a simulation of the transistor of FIG. 2E at the onset of breakdown, with N-Top region to improve switching performance.

FIG. 9A illustrates the use of a P+ substrate to form an insulated gate bipolar transistor (IGBT) to lower on-resistance at the expense of switching speed.

FIG. 9B illustrates segmented P+ and N+ regions in a substrate to form a combination of an IGBT and a DMOS transistor to lower on-resistance but with faster switching speed compared to the IGBT of FIG. 9A.

FIG. 9C is similar to FIG. 9B but with a P-well adjacent to the trench to improve ruggedness.

FIG. 9D illustrates the use of enhanced N-type regions (N-Top layer) between the trench bottom and P-Shield region for improving turn-off switching time of the IGBT.

FIG. 9E illustrates the use of relatively highly doped P and N columns without P-Shield region for lowering on-resistance and turn-off switching time of IGBT.

FIGS. 10A through 10W illustrate various novel fabrication steps for forming the planar vertical DMOS transistor of FIG. 3D, where an array of identical cells are formed connected in parallel.

Elements that are the same or equivalent in the various figures are labeled with the same numeral.

DETAILED DESCRIPTION

Figure 8A:
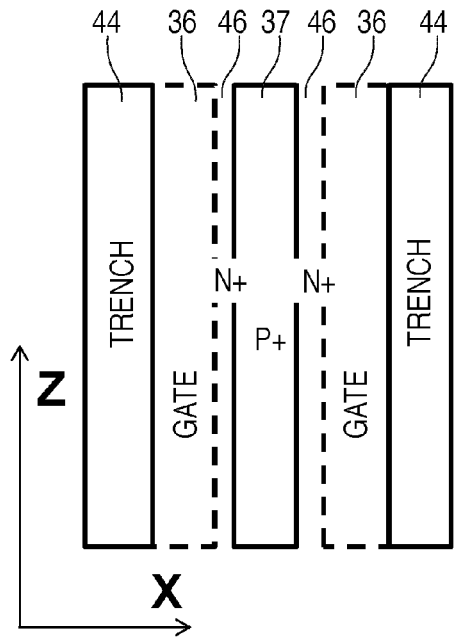
FIG. 8A is a top down view of a portion of a cell formed as a strip, where the gates are parallel to the trenches, and where identical cells are adjacent the cell shown.
Figure 8B:
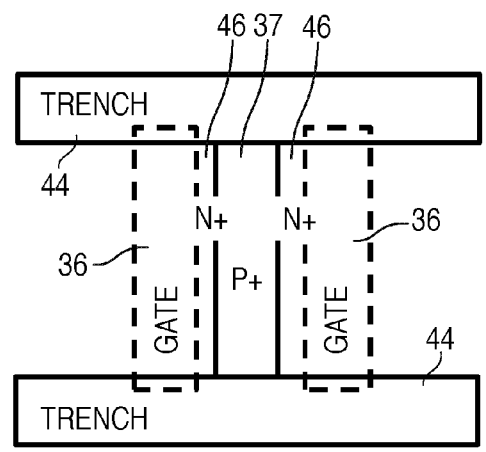
FIG. 8B is a top down view of a portion of a single cell formed as a strip, where the gates are perpendicular to the trenches, and where identical cells are adjacent the cell shown.
Figure 8C:
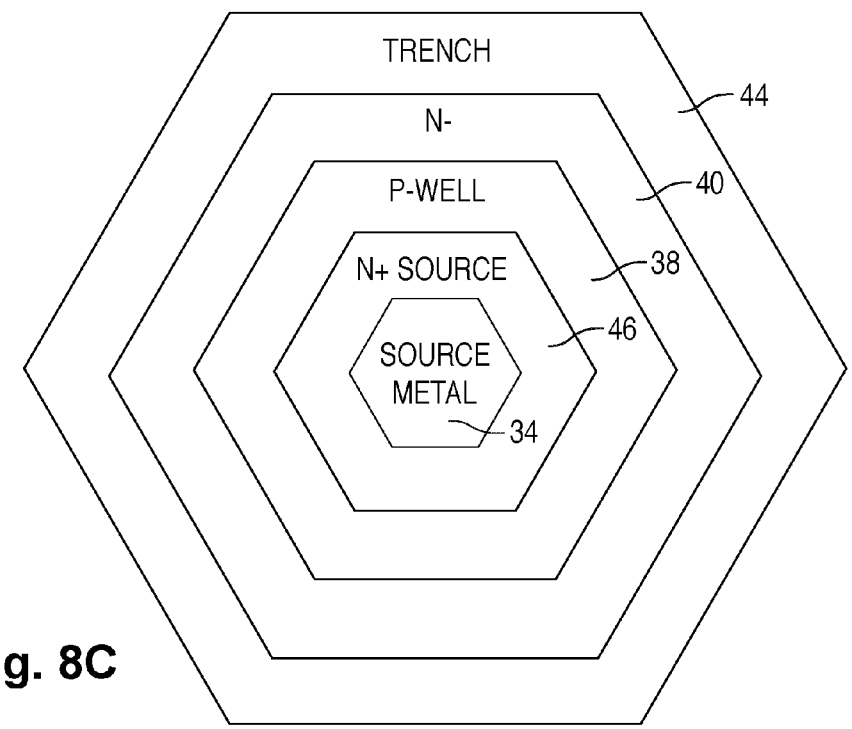
FIG. 8C is a top down view of a portion of a single cell formed as a closed hexagon where identical cells are adjacent the cell shown and share trenches. The trenches may also form squares, rectangles, etc. to form closed cells.

FIG. 2A is a cross-sectional view of a single vertical MOSFET cell 30 in an array of identical contiguous MOSFET cells connected in parallel in accordance with one embodiment of the invention. FIGS. 8A-8C, described later, illustrate various configurations of the cells, which include strips and closed cells. In the cross-sectional views, the various regions are not drawn to scale for ease of illustration. The simulation diagrams of FIGS. 7A and 7B show more accurate relative dimensions.

In FIG. 2A, the width of the cell 30 shown is about 5-15 microns. The cell 30 may have a breakdown voltage exceeding 600 volts, and the number of cells 30 in an array of identical cells determines the current handling ability, such as 20 Amps. The array of cells may be in strips, squares, hexagons, or other known shapes.

In one typical application, a load is connected between the bottom drain electrode 32 and a positive voltage supply, and the top source electrode 34 is connected to ground. When a positive voltage is applied to the conductive gate 36 that is greater than the threshold voltage, the top surface of the P-well 38 is inverted and electrons accumulate along the vertical sidewalls of the N-layer 40 adjacent to the vertical extension 42 of the gate 36 to spread the current and lower the on-resistance of the N-layer 40. A P+ contact region 37 ohmically connects the P-well 38 to the source electrode 34.

The vertical extension 42 of the gate 36 may extend below the P-well 38, but there is a tradeoff between reducing the gate-drain capacitance (by reducing its surface area) and reducing on-resistance by extending the vertical extension 42 deeper into the trench 44.

The N++ source region 46, the P-well 38, and the N-layer 40 top surface form a lateral DMOS transistor portion of the MOSFET 30. In the on-state, there is a conductive N-type channel between the source electrode 34 and the drain electrode 32 via the N++ source region 46, the inverted channel of the P-well 38, the N-layer 40, the N+- drift region 48, and the N++ substrate 50.

The combination of the lateral DMOS transistor portion, the higher doping of the N layer 40, the vertical extension 42 of the gate 36, and the reduced thickness of the N-- drift region 48 reduce the on-resistance compared to the prior art. This structure also increases the breakdown voltage compared to the prior art due to the effect of the vertical field plate 52 (connected to the source) and speeds up the switching time if the MOSFETs internal PN diode becomes forward biased then reversed biased.

A dielectric 53, such as oxide, insulates the source electrode 34.

The trench 44 sidewalls are covered with an oxide layer 54, and the trench is filled with a conducting material such as polysilicon that forms the vertical shield field plate 52. The gate oxide 56 thickness below the gate 36 and along the vertical extension 42 of the gate 36 is much thinner than the oxide layer 54. This is partially due to the fact that the voltage potential at the top of the N-layer 40 is much less than that near the bottom of the N-layer 40 so the oxide can be thinner near the top without reducing the breakdown voltage.

The vertical shield field plate 52, in combination with the vertical extension 42 of the gate 36, laterally depletes the N-layer 40 when the MOSFET is off to improve the breakdown voltage. The entire N-layer 40 is preferably totally depleted at the onset of breakdown. The N-- drift region 48 is preferably also totally depleted at the onset of breakdown.

The effect of the vertical extension 42 of the gate 36 (accumulates electrons along the sidewall) allows a reduction of the P-well 38 to trench 44 spacing S, enabling a reduction of the cell pitch and active area while still resulting in a lower on-resistance, which results in a lower Rsp. The spacing S can be, for example, less than 0.5 to 0.1 of the P-well junction depth $X_j$. The field plate 52 can be electrically connected to the gate 36 or source electrode 34 or can be floating. Connecting the field plate 52 to the source electrode 34 provides a lower gate-drain capacitance or lower gate-drain charge Qgd, while connecting the field plate to the gate 36 results in a lower on-resistance due to the creation of an electron accumulation layer along a longer length of the trench sidewalls when the gate 36 is biased to a positive voltage.

The trench 44 may be 2-20 microns deep. The width of the trench 44 (between adjacent cells) may be 1-2 microns. The P-well 38 depth may be about 2.5 microns. The thicknesses of the N-layer 40 and N-- drift region 48 are determined based on the desired breakdown voltage and may be determined using simulation.

If the cell 30 is a closed cell, such as a hexagon or square, the vertical extension 42 of the gate 36 and the vertical field plate 52 surround the N-layer 40. If the cell 30 is a strip, the vertical extension 42 of the gate 36 and the vertical field plate 52 run along the length of the N-layer 40.

FIG. 2B shows another embodiment similar to that of FIG. 2A but with a self-aligned P-shield region 60 below the trenches 44. In the off-state, the device is reversed biased and the P-shield region 60 lowers the electric field under the trench 44, since the P-shield 60 is fully depleted prior to breakdown, which results in a higher breakdown voltage. The P-shield region 60 also serves to laterally deplete the N-layer 40 to further increase the breakdown voltage. The P-shield region 60 can be floating, but to switch the device on from the off state, the parasitic capacitor resulting from the depletion layer between the P-shield region 60 and N-layers 40 and 48 has to be discharged. Therefore it is preferable to connect the P-shield region 60 to the source electrode 34 via the P-well 38 and a P-type connection region in certain locations of the die (not shown). The connection of the P-shield region 60 to the source electrode 34 provides a path for current to discharge the capacitor and improves the switching delay during switching the device from the off to the on state.

FIG. 2C shows another embodiment similar to that of FIG. 2B but with P and N charge balance columns 64 and 65 to lower the Rsp. The N columns 65 are more highly doped than the N-layer 40 so help reduce on-resistance. The N and P columns 64/65 deplete when the device is off and are preferably fully depleted at the onset of breakdown.

FIG. 2D shows another embodiment similar to that of FIG. 2C but with a self-aligned enhanced N-surface region 68(N-Surf) surrounding the edge of the P-well 38 and extending to the trench sidewall. The N-surface region 68 has a doping concentration that is higher than the N-layer 40. The vertical extension 42 of the gate 36 accumulates electrons in the N-surface region 68 to further lower its on-resistance. Therefore, the N-surface region 68 provides a lower on-resistance and better current spreading. It is preferred that the P-shield 60 and the P and N columns 64/65 are completely depleted at the onset of avalanche breakdown.

FIG. 2E shows another embodiment similar to that of FIG. 2B but with the self-aligned P-shield region 60 floating and separated from the trenches 44 by the N-type N-Top layer 61. It is preferable that the doping in the N-Top layer 61 is higher than the doping of N-layer 40 without significantly degrading the breakdown voltage. Having the N-Top layer 61 on top of the P-shield region 60 results in improved discharge of the depletion layers' capacitor and reduces the switching delay during turn-on.

FIG. 2F shows another embodiment similar to that of FIG. 2E but with P and N charge balance columns 64 and 65 to lower the Rsp. The N columns 65 are more highly doped than the N-layer 40 so help reduce on-resistance. The N and P columns 64/65 deplete when the device is off and are preferably fully depleted at the onset of breakdown. Having the P-columns 64 surrounded by N-type regions results in improved discharge of the depletion layers' capacitor and reduces the switching delay during turn-on.

FIGS. 3A-6C show other embodiments of devices similar to those of FIGS. 2A-2F but with the P-well region 38 adjoining the trench top corner to reduce the size of the cell and to improve ruggedness.

In FIG. 3A, the horizontal portion of the gate 36 inverts the top of the P-well 38, and the vertical extension 42 of the gate 36 inverts the side of the P-well 36 to create a vertical channel. The vertical extension 42 also accumulates electrons in the N-layer 40 adjacent to the vertical extension 42. Therefore, the current path is not constrained by reducing the size of the cell. The vertical extension 42 can extend deeper into the trench 44 to further reduce on-resistance; however, there will be an increase in the gate-drain capacitance, which reduces switching speed.

FIG. 3B shows the use of the N-surface region 68, described above, to further lower on-resistance.

FIG. 3C shows the use of the P-shield 60, described above, to increase breakdown voltage.

FIG. 3D shows the use of the P and N columns 64/65, described above, to reduce on-resistance and increase the breakdown voltage.

FIG. 3E shows another embodiment similar to that of FIG. 3D but with a deep P+ region 70 under the source contact that is deeper than the P-well 38. The P+ region 70 creates an ohmic contact with the source electrode 34 and electrically connects the P-well 38 to the source electrode 34. The P+ region 70 effectively prevents the parasitic NPN bipolar transistor turning on by being a highly doped and lowers the gain of the parasitic NPN transistor. By not allowing the NPN transistor to turn on, there is no thermal runaway caused by high currents through the NPN transistor, and no catastrophic secondary breakdown can occur.

FIG. 3F shows another embodiment similar to that of FIG. 3D but with multiple layers of P and N charge balance columns 64/65, 64A/65A. By forming the P and N columns as multiple "thin" layers, there is less lateral dopant spreading so the columns can be formed more precisely. Note how the lower P-columns 64A are wider than the upper P-columns 64 due to the additional thermal budget. More than two layers of P and N columns can be formed. It is preferred that the P-shield 60, N-columns 65, P-columns 64, N-layer 40, and N-drift region 48 are fully depleted at the onset of avalanche breakdown.

FIG. 3G shows another embodiment similar to that of FIG. 3C but with floating P-shield 60 and N-Top layer 61 for improved switching speed.

FIG. 3H shows another embodiment similar to that of FIG. 3D but using the P and N columns 64/65 without a P-shield region for improved switching speed.

FIG. 4A shows another embodiment similar to that of FIG. 3C but with an L shaped gate 36 for minimizing the overlap of the gate 36 and shield field plate 52 for a lower gate-drain capacitance to increase switching speeds.

FIG. 4B shows the embodiment of FIG. 4A but through a different cross-section, showing an area where the shield field plate 52 is electrically connected to the source electrode 34. In other embodiments, the shield field plate 52 may be connected to the gate 36 (which would increase capacitance) or floating.

FIG. 4C shows another embodiment similar to that of FIG. 2B but with a P-Connection region 67 that electrically connects the P-shield region 60 to the P-well 38 and source electrode 34 to increase switching speeds.

As in the other embodiments, the vertical extension 42 of the gate 36 can extend any distance into the trench 44, including below the P-well 38.

FIGS. 5A and 5B show embodiments where the shield field plate 52 is an extension of the gate 36. Since the voltage potential is much less near the top of the trench 44, the oxide 54 thickness near the top of the trench 44 (across from the P-well 38) can be less that that near the bottom of the trench so there is no breakdown of the oxide 54.

FIG. 5B shows the embodiment of FIG. 5A but with the P and N columns 64/65, described above.

FIGS. 6A-6C show other embodiments with the P-well region 38 adjoining the trench 44 sidewall so there is no surface of the N-layer 40 directly under the gate 36. This device has a longer composite lateral and vertical channel where a portion of the channel is planar and another portion is vertical. The horizontal and vertical portions of the gate 36 are used to invert the channel region. This reduces the gate-drain capacitance and reduces the cell pitch, while also reducing the specific on-resistance. The devices of FIGS. 6A-6C have a longer channel length without increasing the active surface area. These devices can have a shallower junction depth and are able to provide a lower channel leakage current and a lower saturation current as well as a wider safe operation area (SOA). The longer channel may also lower the gain of the parasitic NPN transistor to improve the ruggedness of the device by preventing secondary breakdown. The vertical shield plate 52 may be connected to the source electrode 34 or to the gate 36 or floating.

FIG. 6B shows the use of the N-surface region 68, previously described.

FIG. 6C shows the gate 36 not overlapping the vertical shield field plate 52 to reduce capacitance, as previously described.

FIG. 7A illustrates equi-potential contours in a depletion region between the substrate and the top surface of the device in FIG. 2C in an off state at the onset of the device breakdown. The full process flow and final device characteristics were simulated by two-dimensional process/device simulation. The transition of the N-type and P-type dopants is shown by the outline, corresponding to the P-shield 60 and the P-columns 64. The vertical shield field plate 52 is connected to the source electrode 34. The specific on-resistance of 4.5Ω per mm2 can be achieved for the breakdown voltage of 645V.

FIG. 7B illustrates equi-potential contours in a depletion region between the substrate and the top surface of the device in FIG. 6A, where the edges of the P-well 38 abut the trench sidewalls.

FIG. 7C illustrates equi-potential contours in a depletion region between the substrate and the top surface of the device in FIG. 2E with the N-Top layer 61 (FIG. 2E).

FIG. 8A is a top down view of a portion of a vertical transistor incorporating any of the embodiments disclosed herein, where the trenches 44, gates 36, and the various doped regions (source regions 46, P+ contact 37, etc.) are formed as an array of thin strips connected in parallel. Since the trenches 44 take up an area along the X direction, it puts a limitation on the cell pitch reduction of the device. In order to ease this limitation, the trenches 44 can be laid out perpendicular to the gate 36, as shown in FIG. 8B.

FIG. 8C illustrates a single hexagon closed cell incorporating any of the embodiments herein. Adjacent cells share one of the straight trench 44 walls (like a honeycomb), and all cells are connected in parallel. Other closed cell designs, such as squares, are also envisioned.

FIG. 9A shows an embodiment similar to those previously described but with a P+ substrate 80 to form an IGBT structure. An N-- buffer layer 81 is also shown. In such a case, the drain electrode 32 becomes an anode or collector electrode. Turning on the IGBT by applying a threshold voltage to the gate 36 turns on the PNP transistor. An IGBT has a lower on-resistance compared to the non-IGBT devices, but has a slower switching speed. Any of the previously-described devices can be made into an IGBT.

FIG. 9B shows the substrate 80 having P+ regions 82 and N+ regions 84 to form IGBT and DMOS transistor devices in parallel. Switching speed is increased compared to the IGBT of FIG. 9A.

FIG. 9C shows the structure of FIG. 9B but with the P-well 38 abutting the trench, as previously described.

FIG. 9D illustrates the use of enhanced N-type regions (N-Top layer 61) between the trench 44 bottom and P-shield region 60 for improving turn-off switching time of the IGBT.

FIG. 9E illustrates the use of relatively highly doped P and N columns 64/65 without the P-shield region for lowering on-resistance and turn-off switching time of the IGBT.

A possible fabrication process of the device of FIG. 3D is described below in FIGS. 10A-10W. A similar process can be used to fabricate any of the other embodiments.

In FIG. 10A, an epitaxial layer (the N++ drift region 48) is grown on top of an N++ substrate 50. The N++ drift region 48 may doped in-situ during growth or may be periodically implanted with N-type dopants at a dosage of about $1.5E12$ $cm^2$. The substrate 50 may have a dopant concentration of about $5E19$ $cm^3$. The final dopant density in the N-- drift region 48 is about $3.5E14$ $cm^3$ for a device with about a 600V breakdown voltage. The N-- drift region 48 may be 30 microns thick.

In FIGS. 10B and 10C, a pad oxide layer 86 is formed and an N-type dopant 88, such as phosphorus, is implanted into the N++ drift region 48, followed (FIG. 10C) by a masked P-type dopant 90 implant step (such as using boron) to form the N-column 65 and P-column 64. The photoresist mask 92 is shown. The N-type implant dosage may be about $1-2E12$ $cm^{-2}$. The P-type implant dosage may be about $1E13$ $cm^{-2}$.

In FIG. 10D, a second epitaxial layer forming the N-layer 40 is grown after the photoresist and oxide are stripped. The N-layer 40 has a dopant density of about $2.3E15$ $cm^3$, which is higher than the dopant density in the N-- drift region 48. The N-layer 40 is about 8 microns thick. In another embodiment, the dopant density in the N-layer 40 is about the same as that in the N-- drift region 48.

In FIG. 10E, an oxide hard mask 94 is formed on top of the N-layer 40.

In FIG. 10F, and additional thick oxide layer 96 is formed.

In FIG. 10G, a photoresist mask 98 is patterned over the oxide layer 96, and the oxide layers 96 and 94 are dry etched to define the trench area.

During the various steps, the dopants in the N and P-columns 65 and 64 are driven in and diffused to form a column layer about 4-5 microns thick, with an N-type dopant concentration in the N-columns 65 of about $2E15$ $cm^3$, and a P-type dopant concentration in the P-columns 64 of about $1E16$ $cm^{-3}$. The dopant density in the N-columns 65 may be greater than that of the N-layer 40 or less.

In FIG. 10H, an optional N-surface region 68 is implanted using a phosphorus or arsenic implant 100. FIG. 10I shows the resulting N-surface region 68.

In FIG. 10J, a silicon dry etch is carried out to form the trench 44, and a P-type dopant 102 (e.g. boron) is implanted into the trench 44 in a self-aligned manner at a dosage of about $4E12$ $cm^{-2}$ to create the P-shield 60. The trench etch leaves about 3-4 microns of the N-layer 40 below the trench 44. At this step, an optional N-type dopant (e.g. Arsenic) is implanted into the trench 44 in a self-aligned manner at a dosage about $2E12$ $cm^{-2}$ to form an N-Top layer over the P-shield region 60.

In a particularly inventive step, the N-surface region 68 has been diffused laterally into the N-layer 40, then etched to form the trench 44. Therefore, the N-surface region 68 is self-aligned with the trench 44.

In FIG. 10K, a sacrificial oxide layer 104 is formed having a thickness of about 1000 Angstroms.

In FIG. 10L, a Field Oxide (FOX) layer 106 is grown or deposited on the wafer surface including the silicon mesa surface, the trench sidewall, and the trench bottom. The thickness of the FOX layer 106 is about 6000 Angstroms.

In FIG. 10M, conductive polysilicon 108 is deposited on the wafer to fill up the trench 44, followed by the polysilicon being etched back as shown in FIG. 10N. The polysilicon in the trench 44 forms the vertical shield field plate 52.

In FIG. 10O, with either a wet etch or wet/dry combination process, the FOX layer 106 from FIG. 10N is completely removed from the silicon mesa surface and partially removed along the trench 44 sidewall. The remaining FOX layer separating the field plate 52 from the trench sidewall is now labeled the oxide layer 54.

In FIG. 10P, the gate oxide 56 is then grown to a thickness of about 900 Angstroms.

In FIG. 10Q, a conductive polysilicon layer 110 is then deposited.

In FIG. 10R, the polysilicon layer 110 is patterned using a photoresist mask 112 and etch to form the gate 36 having the vertical extension 42.

In FIG. 10S, the photoresist 112 is striped and a P-dopant 114 (boron) is implanted into the N-layer 40 to form the P-well 38, self-aligned with the gate 36. The dopants are then driven in.

In FIG. 10T, an N-type dopant 116 (arsenic or phosphorous) is implanted to form the N-source region 46, self-aligned with the gate 36.

In FIGS. 10U and 10V, a thick liner oxide and a BPSG layer 118 are formed to define the P+ contact region 37, and boron 120 is implanted.

In FIG. 10W, the source metal is deposited and patterned to form the source electrode 34, such as by sputtering AlCu or AlSiCu, and may be about 4 microns thick. FIG. 10W is the same as FIG. 3D.

The backside metal is then deposited to form the drain electrode 32, such as by sputtering layers of Ti, Ni, and Ag having respective thicknesses of 1000, 2000, and 10,000 Angstroms.

All the figures shown are not to scale for ease of illustration. Actual device structure dimensions and junction profiles will vary from those shown in the above figures depending on the required breakdown voltage, on-resistance, current requirements, etc. The simulation results of FIGS. 7A and 7B show more accurate representative dimensions.

Any of the disclosed features can be combined in any combination in a MOSFET or IGBT to achieve the particular benefits of that feature for a particular application.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A vertical transistor comprising
   a semiconductor substrate having a first electrode on its bottom surface;
   a first layer of a first conductivity type above the substrate, the first layer having a first dopant concentration;
   a second layer of the first conductivity type above the first layer, the second layer having a second dopant concentration higher than the first dopant concentration, the second layer having a top surface;
   a trench having a vertical sidewall adjoining the second layer;
   a well region of a second conductivity type in the top surface of the second layer, the well region having a top surface;
   a first region of the first conductivity type in the top surface of the well region, wherein an area between the first region and an edge of the well region comprises a channel for inversion by a gate;
   a conductive gate overlying the channel for creating a lateral conductive path in the channel when the gate is biased above a threshold voltage,
   the gate having a vertical extension facing the vertical sidewall and insulated from the sidewall;
   a vertical field plate facing the vertical sidewall of the second layer and insulated from the sidewall; and
   a second electrode electrically contacting the well region and the first region, wherein when a voltage is applied between the first electrode and the second electrode and the gate is biased above the threshold voltage, a lateral current flows across the channel and a current flows between the channel and the substrate.

2. The transistor of claim 1 further comprising:
   a third layer of the first conductivity type between the first layer and the second layer and located below the channel; and
   a fourth layer of the second conductivity type laterally abutting the third layer on opposite sides of the third layer, a dopant concentration in the third layer and fourth layer being higher than the first dopant concentration.

3. The transistor of claim 2 further comprising a fifth layer of the second conductivity type below the trench and laterally adjacent to the second layer.

4. The transistor of claim 3 wherein the fifth layer abuts the fourth layer.

5. The transistor of claim 3 wherein the first layer is vertically separated from the fourth layer.

6. The transistor of claim 1 wherein the vertical field plate is electrically connected to the second electrode.

7. The transistor of claim 1 wherein a first dielectric layer separating the vertical extension of the gate from the vertical sidewall is thinner than a second dielectric layer separating the vertical field plate from the vertical sidewall.

8. The transistor of claim 1 wherein the vertical field plate is electrically connected to the gate.

9. The transistor of claim 1 wherein the vertical field plate is deeper than the well region.

10. The transistor of claim 1 wherein the vertical extension of the gate extends below the well region.

11. The transistor of claim 1 wherein the well region extends to the vertical sidewall of the second layer.

12. The transistor of claim 11 wherein the vertical extension of the gate inverts a portion of the well region abutting the vertical sidewall.

13. The transistor of claim 1 further comprising an enhanced doping region of the first conductivity type between the well region and the vertical sidewall for reducing on-resistance.

14. The transistor of claim 1 further comprising a second region of the second conductivity type below the trench and laterally adjacent to the second layer.

15. The transistor of claim 1 wherein the substrate is of the first conductivity type, and wherein the transistor is a MOSFET.

16. The transistor of claim 1 wherein the substrate is of the second conductivity type, and wherein the transistor is an IGBT.

17. The transistor of claim 1 wherein the vertical field plate and the second dopant concentration of the second layer are configured to enhance lateral depletion of the second layer so that the second layer is fully depleted at a breakdown voltage of the transistor.

18. The transistor of claim 1 further comprising:
   a third layer of the first conductivity type between the first layer and the second layer and located below the channel; and
   a fourth layer of the second conductivity type laterally abutting the third layer on opposite sides of the third layer, a dopant concentration in the third layer and fourth layer being higher than the first dopant concentration,
   wherein the third layer and the fourth layer form N-type and P-type columns, where the N-type and P-type columns are fully depleted at a breakdown voltage of the transistor.

19. The transistor of claim 1 further comprising a third layer of the second conductivity type below the trench and laterally adjacent to the second layer.

20. The transistor of claim 1 further comprising:
   a second region of the second conductivity type below the trench and laterally adjacent to the second layer; and
   a third region of the second conductivity type along the vertical sidewall of the trench and running between the well region and the third region.

21. The transistor of claim 1 further comprising:
   a second region of the second conductivity type below the trench and laterally adjacent to the second layer; and
   a third region of the first conductivity type between the second region and the trench, and laterally adjacent to the second layer, wherein a dopant concentration in the third region is higher than the second dopant concentration of the second layer.

\* \* \* \* \*